United States Patent
Yoda et al.

(10) Patent No.: US 10,147,473 B2
(45) Date of Patent: Dec. 4, 2018

(54) MAGNETIC MEMORY

(71) Applicant: KABUSHIKI KAISHA TOSHIBA, Minato-ku (JP)

(72) Inventors: Hiroaki Yoda, Kawasaki (JP); Naoharu Shimomura, Meguro (JP); Yoshiaki Saito, Kawasaki (JP); Yuichi Ohsawa, Yokohama (JP); Keiko Abe, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/703,548

(22) Filed: Sep. 13, 2017

(65) Prior Publication Data

US 2018/0174635 A1 Jun. 21, 2018

(30) Foreign Application Priority Data

Dec. 16, 2016 (JP) ................. 2016-244769

(51) Int. Cl.
*G11C 11/16* (2006.01)
(52) U.S. Cl.
CPC ........ *G11C 11/1675* (2013.01); *G11C 11/161* (2013.01); *G11C 11/16* (2013.01)
(58) Field of Classification Search
CPC .... G11C 11/1675; G11C 11/161; G11C 11/16
(Continued)

(56) References Cited

U.S. PATENT DOCUMENTS 8,837,208 B2 * 9/2014 Li ..................... H01L 43/12
365/158
9,076,537 B2 7/2015 Khvalkovskiy et al.
(Continued)

FOREIGN PATENT DOCUMENTS

| JP | 2014-45196 | 3/2014 |
| JP | 2015-534272 | 11/2015 |
| WO | WO 2016/190879 A1 | 12/2016 |

OTHER PUBLICATIONS

H. Yoda, et al. "The Progresses of MRAM as a Memory to Save Energy Consumption and Its Potential for Further Reduction", Symposium on VLSI Technology Digest of Technical Papers, 2015, 2 pages.
H. Yoda, et al. "Progress of STT-MRAM Technology and the Effect on Normally-off Computing Systems", IEDM Tech. Dig., 2012, 4 pages.
(Continued)

*Primary Examiner* — Tan T. Nguyen
(74) *Attorney, Agent, or Firm* — Oblon, McClelland, Maier & Neustadt, L.L.P.

(57) ABSTRACT

A magnetic memory includes: first to third terminals; a conductive layer including first to fifth regions, the first region being electrically connected to the first terminal, the fifth region being electrically connected to the second terminal, and the third region being electrically connected to the third terminal; a first magnetoresistive element including a first magnetic layer, a second magnetic layer disposed between the second region and the first magnetic layer, and a first nonmagnetic layer disposed between the first and the second magnetic layer; a second magnetoresistive element including a third magnetic layer, a fourth magnetic layer disposed between the fourth region and the third magnetic layer, and a second nonmagnetic layer disposed between the third and the fourth magnetic layer; and a circuit flowing a write current between the first and the second terminal and between the second and the third terminal in a write operation.

22 Claims, 48 Drawing Sheets

(58) Field of Classification Search
USPC ............ 365/158, 63, 66, 148, 163, 171, 173
See application file for complete search history.

(56) References Cited

U.S. PATENT DOCUMENTS

| | | |
|---|---|---|
| 9,412,448 B2 | 8/2016 | Di Pendina et al. |
| 9,881,660 B2* | 1/2018 | Yoda .................... G11C 11/1675 |
| 2006/0215445 A1* | 9/2006 | Baek .................... H01L 27/2472 |
| | | 365/158 |
| 2015/0236071 A1 | 8/2015 | Lee et al. |
| 2016/0142012 A1 | 5/2016 | Wang et al. |
| 2016/0232958 A1 | 8/2016 | Bandiera |
| 2017/0169872 A1 | 6/2017 | Yoda et al. |
| 2018/0040807 A1* | 2/2018 | Saito .................... H01L 27/228 |

* cited by examiner

MAGNETIC MEMORY

CROSS REFERENCE TO RELATED APPLICATIONS

This application is based upon and claims the benefit of priority from the prior Japanese Patent Application No. 2016-244769, filed on Dec. 16, 2016, the entire contents of which are incorporated herein by reference.

FIELD

Embodiments described herein relate generally to magnetic memories.

BACKGROUND

Existing memories may be classified into volatile working memories (such as static random access memories (SRAMs) and dynamic random access memories (DRAMs)) and nonvolatile storage memories (such as NAND flash memories and hard disk drives (HDDs)). The volatile memories consume large energy due to leakage current in the SRAMs and refresh current in the DRAMs.

In order to solve this problem, various kinds of nonvolatile memories have been considered as working memories that replace the SRAMs and the DRAMs.

The working memories, however, are accessed more often in an active state than in a standby state. Since a large writing charge (Qw) is required in the active state, energy required for a write operation increases. As a result, the energy saved during the standby state due to the nonvolatile characteristic is completely consumed in the active state, and therefore the total energy consumption is difficult to be decreased. This is called "nonvolatile memories' historical dilemma." No existing product has solved this problem.

Recently performed experimental simulations using best data may be solving the problem to reduce energy consumption, in which a STT (spin transfer torque)-MRAM (Magnetic Random Access Memory) is used as a lowest level cache memory (LLC (Last Level Cache)).

If a STT-MRAM is used as a cache memory in a layer higher than the LLC, however, the frequency at which it is accessed considerably increases. Therefore, considerable energy is consumed. As a result, the aforementioned energy consumption problem may not be solved.

DETAILED DESCRIPTION

A magnetic memory according to an embodiment includes: a first terminal, a second terminal, and a third terminal; a first conductive layer including first to fifth regions, the second region being between the first region and the fifth region, the third region being between the second region and the fifth region, the fourth region being between the third region and the fifth region, the first region being electrically connected to the first terminal, the fifth region being electrically connected to the second terminal, and the third region being electrically connected to the third terminal; a first magnetoresistive element disposed corresponding to the second region, the first magnetoresistive element including a first magnetic layer, a second magnetic layer disposed between the second region and the first magnetic layer, a first nonmagnetic layer disposed between the first magnetic layer and the second magnetic layer, and a fourth terminal electrically connected to the first magnetic layer; a second magnetoresistive element disposed corresponding to the fourth region, the second magnetoresistive element including a third magnetic layer, a fourth magnetic layer disposed between the fourth region and the third magnetic layer, a second nonmagnetic layer disposed between the third magnetic layer and the fourth magnetic layer, and a fifth terminal electrically connected to the third magnetic layer; and a circuit configured to flow a write current between the first terminal and the third terminal and between the second terminal and the third terminal in a write operation.

Embodiments will now be described with reference to the accompanying drawings.

First Embodiment

Figure 1:
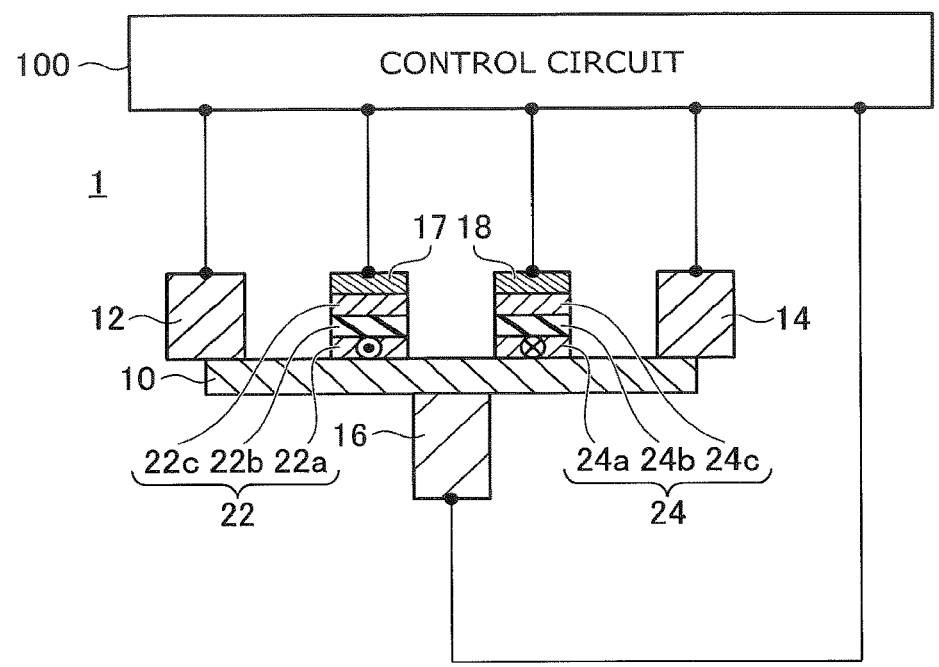
FIG. 1 is a diagram illustrating a memory cell of a magnetic memory according to a first embodiment.

A magnetic memory according to a first embodiment will be described with reference to FIGS. 1 to 7. The magnetic memory according to the first embodiment includes at least one memory cell. FIG. 1 shows the configuration of the memory cell. The memory cell 1 includes a conductive layer 10, three terminals (electrodes) 12, 14, and 16 separately disposed on the conductive layer 10, and two magnetoresistive elements 22 and 24.

The terminal 16 is disposed in a region of the conductive layer 10 between the terminal 12 and the terminal 14. The terminals 12 and 14 are disposed on one face of the conductive layer 10, and the terminal 16 is disposed on another face of the conductive layer 10. The magnetoresistive element 22 is disposed on the conductive layer 10 between the terminal 12 and the terminal 16, and the magnetoresistive element 24 is disposed on the conductive layer 10 between the terminal 16 and the terminal 14. The magnetoresistive elements 22 and 24 are disposed on the one face of the conductive layer 10. Thus, the terminals 12 and 14 and the magnetoresistive elements 22 and 24 are disposed on the same face of the conductive layer 10.

The magnetoresistive element 22 includes a magnetic layer (storage layer) 22a disposed on the conductive layer 10, the magnetization direction of the magnetic layer 22a being changeable, a nonmagnetic layer 22b disposed on the magnetic layer 22a, and a magnetic layer (reference layer) 22c disposed on the nonmagnetic layer 22b, the magnetization direction of the magnetic layer 22c being fixed. The magnetization direction that is "changeable" means that the magnetization direction may be changed after a write operation is performed on the magnetoresistive element, and the magnetization direction that is "fixed" means that the magnetization direction is not changed after a write operation is performed on the magnetoresistive element. The magnetoresistive element 24 includes a magnetic layer 24a disposed on the conductive layer 10, the magnetization direction of the magnetic layer 24 being changeable, a nonmagnetic layer 24b disposed on the magnetic layer 24a, and a magnetic layer 24c disposed on the nonmagnetic layer 24b, the magnetization direction of the magnetic layer 24c being fixed. A terminal 17 is disposed on the magnetic layer 22c of the magnetoresistive element 22, and a terminal 18 is disposed on the magnetic layer 24c of the magnetoresistive element 24.

The terminals 12, 14, 16, 17, and 18 are electrically connected to a control circuit 100. A current is caused to flow or a voltage is applied to the terminals 12, 14, 16, 17, and 18 by the control circuit 100, as will be described later.

(First Modification)

Figure 2:
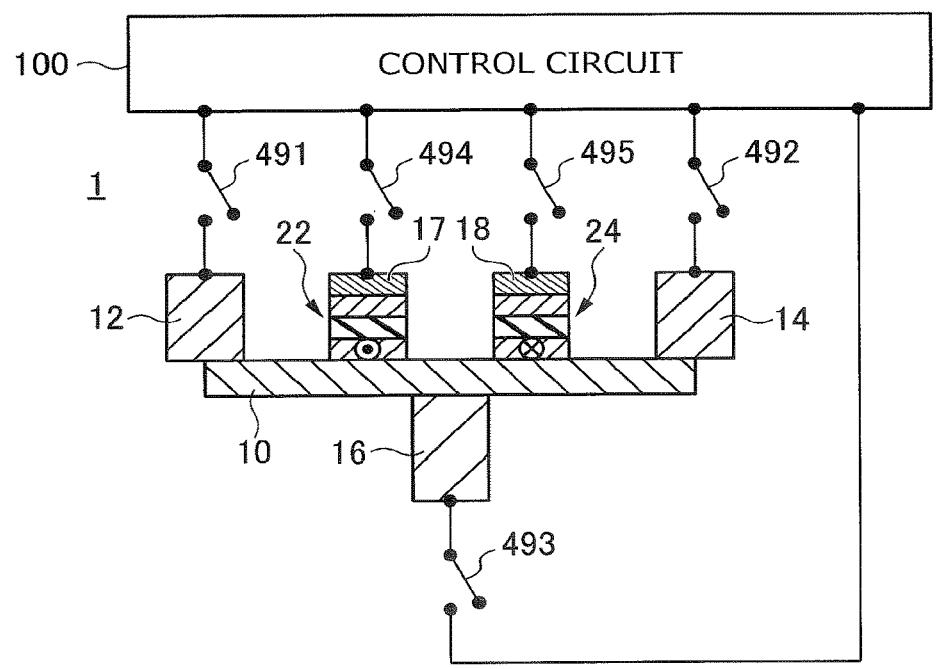
FIG. 2 is a diagram illustrating a memory cell of a magnetic memory according to a first modification of the first embodiment.

A magnetic memory according to a first modification of the first embodiment will be described with reference to FIG. 2. FIG. 2 is a diagram illustrating the memory cell 1 of the magnetic memory according to the first modification. The memory cell 1 according to the first modification has a configuration obtained by disposing switches 491, 492, and 493 between the control circuit 100 and the terminals 12, 14, and 16, and switches 494 and 495 between the control circuit 100 and the terminals 17 and 18 in the memory cell 1 according to the first embodiment shown in FIG. 1.

(Second Modification)

Figure 3:
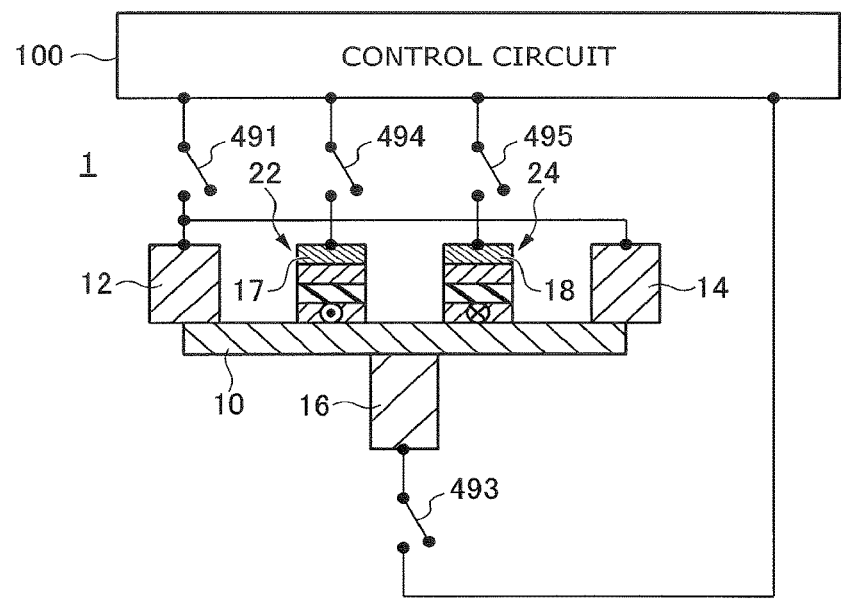
FIG. 3 is a diagram illustrating a memory cell of a magnetic memory according to a second modification of the first embodiment.

A magnetic memory according to a second modification of the first embodiment will be described with reference to FIG. 3. FIG. 3 is a diagram illustrating the memory cell 1 of the magnetic memory according to the second modification. The memory cell 1 according to the second modification has a configuration obtained by removing the switch 492 and electrically connecting the terminal 12 and the terminal 14 in the memory cell according to the first modification shown in FIG. 2.

The respective elements of the memory cells will be described with reference to FIG. 4.

(Conductive Layer)

The conductive layer 10 contains a nonmagnetic material having a spin orbit interaction (spin Hall effect) or a Rashba effect, such as Ta, W, or Pt. If a write current Iw is caused to flow through the conductive layer 10 from right to left in FIG. 4, for example, electrons 11a with up spin flow in the upper side of the conductive layer 10, and electrons 11b with down spin flow in the lower side of the conductive layer 10 in a diffusion manner. If the write current Iw is caused to flow through the conductive layer 10 from left to right, as is opposite to the case shown in FIG. 4, for example, electrons 11b with down spin flow in the upper side of the conductive layer 10, and electrons 11a with up spin flow in the lower side of the conductive layer 10. The direction of the write current Iw flowing through the conductive layer 10 is controlled by the control circuit 100 shown in FIG. 1.

(Magnetoresistive Element)

Figure 4:
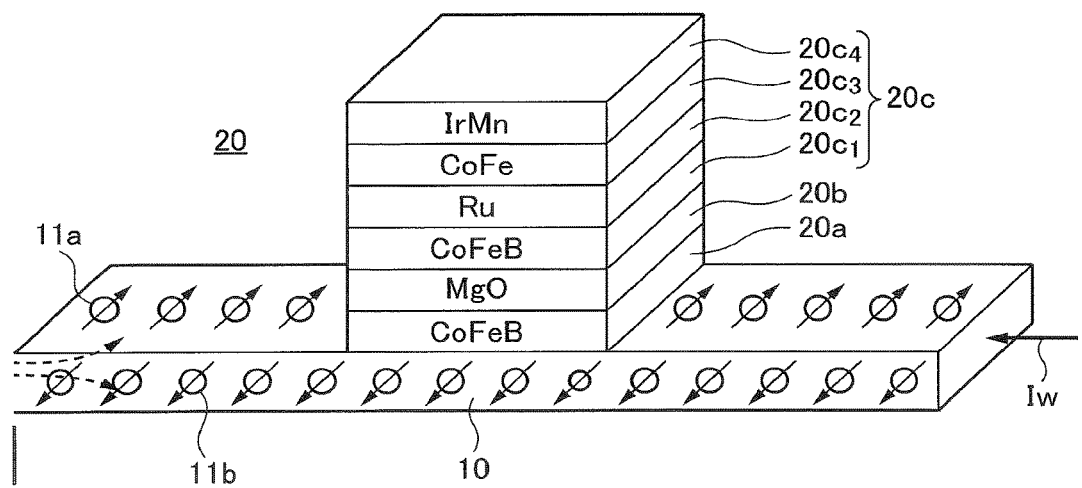
FIG. 4 is a perspective view of a specific example of a magnetoresistive element included in the magnetic memory according to the first embodiment.

FIG. 4 shows a specific example of the magnetoresistive elements 22 and 24. A magnetoresistive element 20 of the specific example has a multilayer structure including a magnetic layer (storage layer) 20a disposed on the conductive layer 10, the magnetization direction of the magnetic layer 20a being changeable, a nonmagnetic layer 20b disposed on the magnetic layer 20a, a magnetic layer (reference layer) 20c disposed on the nonmagnetic layer 20b, the magnetization direction of the magnetic layer 20c being fixed. The magnetoresistive element may be a magnetic tunnel junction (MTJ) element, in which the nonmagnetic layer 20b is an insulating layer, or a giant magneto-resistive (GMR) element in which the nonmagnetic layer 20b is a nonmagnetic metal layer. In FIGS. 1 to 4, each magnetoresistive element is an MTJ element, in which the magnetization direction of the storage layer and the magnetization direction of the reference layer are parallel to the film plane. Thus, each magnetoresistive element is an in-plane magnetization MTJ element, in which the magnetization direction is perpendicular to the stacking direction of the multilayer structure. The storage layer 20a is, for example, a CoFeB layer, and the nonmagnetic layer 20b is, for example, an MgO layer. The reference layer 20c may include, for example, a CoFeB layer 20c1, a Ru layer 20c2 disposed on the CoFeB layer 20c1, a CoFe layer 20c3 disposed on the Ru layer 20c2, and an antiferromagnetic layer 20c4 of IrMn, for example, which is disposed on the CoFe layer 20c3 to fix the magnetization direction of the reference layer 20c.

The reference layer 20c has a synthetic antiferromagnetic multilayer structure in which antiferromagnetic coupling of the CoFeB layer 20c1 and the CoFe layer 20c3 via the Ru layer 20c2 is caused. Thus, the magnetization direction of the CoFeB layer 20c1 and the magnetization direction of the CoFe layer 20c3 are antiparallel to each other.

Unlike the ones shown in FIGS. 1 to 4, if the magnetoresistive element is of perpendicular magnetization type, in which the magnetization direction of the storage layer 20a and the magnetization direction of the reference layer 20c are parallel to the stacking direction of the multilayer structure, the antiferromagnetic layer 20c4 may be removed. Although the magnetoresistive elements are disposed on the conductive layer 10 in FIGS. 1 to 4, they may be disposed under the conductive layer 10.

If a write current Iw is caused to flow through the conductive layer 10 of the magnetoresistive element 20 from right to left in FIG. 4, a spin current is generated in the conductive layer 10 by the electrons 11a with up spin and the electrons 11b with down spin. The spin current may exert a spin torque on the storage layer 20a to switch the magnetization direction of the storage layer 20a. The magnetization of the storage layer 20a is switched in opposite directions by whether the write current Iw is caused to flow from right to left or from left to right in the conductive layer 10.

The magnetoresistive element 20 is patterned to have a rectangular top shape, and has a shape magnetic anisotropy. Therefore, the longitudinal direction is a stable magnetization direction in the storage layer and the reference layer. A stable magnetization direction in FIG. 1 is, for example, from the depth side to the front side, or from the front side to the depth side. This stability is called (longitudinal) uniaxial magnetic anisotropy. The uniaxial magnetic anisotropy is dependent on the aspect ratio of the rectangular shape, the thickness of the storage layer, and the magnetization of the magnetic layers. The write current threshold value $I_{c0}$, which will be described later, is proportional to the uniaxial magnetic anisotropy.

(Write Operation)

A method of writing data to a memory cell according to the first embodiment and its first modification and second modification will be described with reference to FIGS. 5 and 6.

The magnetoresistive elements 22 and 24 of the memory cell 1 store information (data) as the magnetization directions of the storage layers 22a and 24a. In this embodiment and its modifications, the storage layers 22a and 24a of the magnetoresistive elements 22 and 24 store information having opposite magnetization directions. For example, FIG. 5 shows that information (data) "1" is stored, and FIG. 6 shows that information (data) "0" is stored. In FIGS. 5 and 6, the magnetization directions of the reference layer 22c of the magnetoresistive element 22 and the reference layer 24c of the magnetoresistive element 24 are from the depth side to the front side. In FIG. 5, the magnetization direction of the storage layer 22a of the magnetoresistive element 22 is from the depth side to the front side, and the magnetization direction of the storage layer 24a of the magnetoresistive element 24 is from the front side to the depth side. In FIG. 6, the magnetization direction of the storage layer 22a of the magnetoresistive element 22 is from the front side to the depth side, and the magnetization direction of the storage layer 24a of the magnetoresistive element 24 is from the depth side to the front side.

Figure 5:
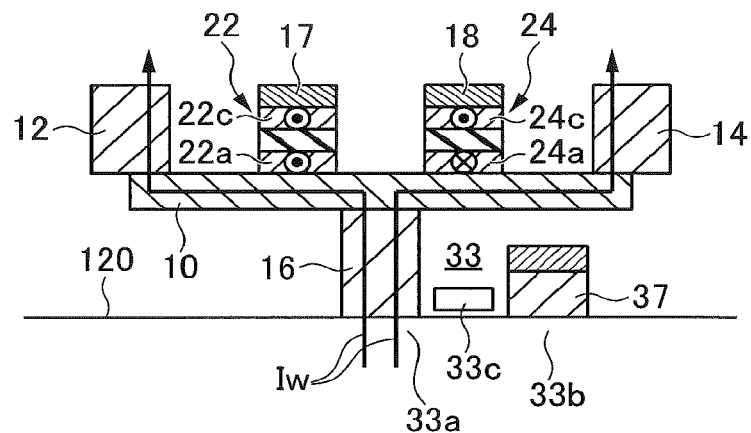
FIG. 5 is an explanatory diagram of an operation for writing data "1" to the magnetic memory according to the first embodiment.
Figure 6:
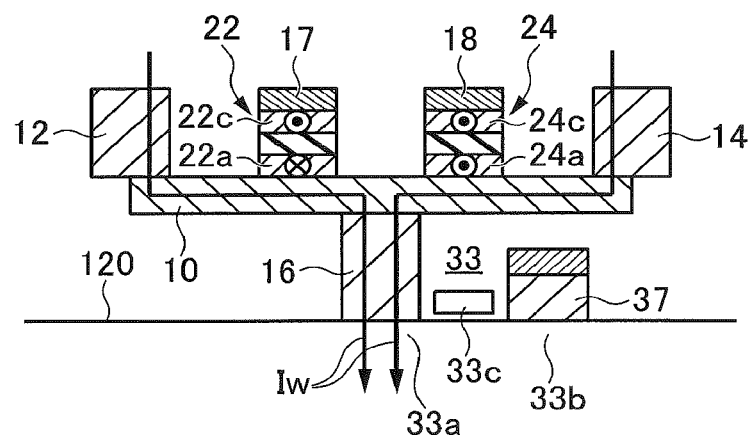
FIG. 6 is an explanatory diagram of an operation for writing data "0" to the magnetic memory according to the first embodiment.

FIGS. 5 and 6 show that a transistor 33 is disposed on a semiconductor layer 120. A terminal 33a, which is one of the source and the drain, of the transistor 33 is connected to the terminal 16, and a terminal 33b, which is the other of the source and the drain, is connected to an electrode 37 disposed on the terminal 33b. A gate electrode 33c is disposed above the semiconductor layer 120 between the terminal 33a and the terminal 33b.

As shown in FIG. 5, when the data "1" is written, the transistor 33 is turned on and a write current Iw is caused to flow from the electrode 37 to the terminal 16. The write current Iw further flows from the terminal 16 to the terminal 12 and the terminal 14 via the conductive layer 10. This means that the current flowing through the conductive layer 10 below the storage layer 22a of the magnetoresistive element 22 and the current flowing through the conductive layer 10 below the storage layer 24a of the magnetoresistive element 24 are in opposite directions. As a result, the magnetization direction of the storage layer 22a and the magnetization direction of the storage layer 24a become antiparallel to each other. Thus, the storage layer 22a of the magnetoresistive element 22 and the storage layer 24a of the magnetoresistive element 24 store magnetizations with opposite polarities. As a result, the magnetization directions of the storage layer 22a and the reference layer 22c of the magnetoresistive element 22 after the write operation become parallel to each other, and the magnetization directions of the storage layer 24a and the reference layer 24c of the magnetoresistive element 24 become antiparallel to each other. This means that data "1" is written. In this case, the magnetization directions of the storage layers 22a and 24a and the spin direction of polarized electrons that interacts with the magnetization directions of the storage layers 22a and 24a are in parallel or antiparallel relationship. Therefore, the magnetizations of the storage layers 22a and 24a are switched with precession.

As shown in FIG. 6, when the data "0" is written, the transistor 33 is turned on and the write current Iw is caused to flow from the terminals 12 and 14 to the terminal 16 and the electrode 37 via the conductive layer 10. This means that the current flowing through the conductive layer 10 below the storage layer 22a of the magnetoresistive element 22 and the current flowing through the conductive layer 10 below the storage layer 24a of the magnetoresistive element 24 are in opposite directions. As a result, the magnetization direction of the storage layer 22a and the magnetization direction of the storage layer 24a become antiparallel to each other. Thus, the storage layer 22a of the magnetoresistive element 22 and the storage layer 24a of the magnetoresistive element 24 store magnetizations with opposite polarities. As a result, the magnetization directions of the storage layer 22a and the reference layer 22c of the magnetoresistive element 22 after the write operation become antiparallel to each other, and the magnetization directions of the storage layer 24a and the reference layer 24c of the magnetoresistive element 24 become parallel to each other. This means that data "0" is written. In this case, the magnetization directions of the storage layers 22a and 24a and the spin direction of polarized electrons that interacts with the magnetization directions of the storage layers 22a and 24a are in parallel or antiparallel relationship. Therefore, the magnetizations of the storage layers 22a and 24a are switched with precession.

(Read Operation)

Figure 7:
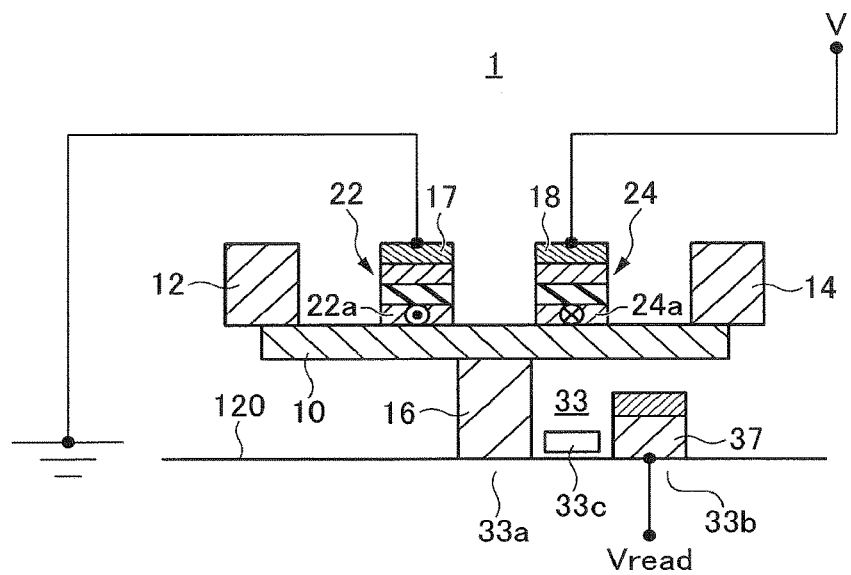
FIG. 7 is an explanatory diagram of a read operation in the magnetic memory according to the first embodiment.

A method of reading data from the memory cell 1 will be described below with reference to FIG. 7. In a read operation, the transistor 33 is first turned on. Subsequently, a voltage V is applied between the terminal 17 and the terminal 18 as shown in FIG. 7, and then a potential Vread at the terminal 16 is read. The terminal 17 is connected to a ground power supply. The voltage V is applied to the terminal 18.

The magnetoresistive element has a low resistance $R_{low}$ when the magnetizations of the reference layer and the storage layer are parallel to each other, and a high resistance $R_{high}$ when the magnetizations of the reference layer and the storage layer are antiparallel to each other. If the memory cell 1 stores the data "1" as shown in FIG. 5, the potential Vr1 at the terminal 16 is as follows:

$$Vr1=\{R_{low}/R_{low}+R_{high})\}\times V.$$

If the memory cell 1 stores the data "0" as shown in FIG. 6, the potential Vr2 at the terminal 16 is as follows:

$$Vr2=\{R_{high}/R_{low}+R_{high})\}\times V.$$

Thus, the potential change $\Delta Vr$ may be obtained by the following formula:

$$\Delta Vr=Vr2-Vr1=\{(R_{high}-R_{low})/(R_{low}+R_{high})\}\times V.$$

The potential change $\Delta Vr$ may be read by measuring the potential at the terminal 16. Thus, a read operation may be performed at a higher speed with a lower energy consumption as compared to a case where a constant current is caused to flow through a magnetoresistive element and a voltage between a storage layer and a reference layer of the magnetoresistive element is measured.

If the memory cell includes only one magnetoresistive element and a voltage is applied to the single magnetoresistive element, a large current flows when the magnetoresistive element has a low resistance, and a small current flows when the magnetoresistive element has a high resistance. Therefore, the potential change cannot be sensed.

The write current may be reduced in this embodiment by applying a voltage to the magnetoresistive elements 22 and 24 via the terminals 17 and 18, respectively, and controlling the perpendicular magnetic anisotropy between the storage layers 22a and 24a and the nonmagnetic layers 22b and 24b. The write current may be reduced to about a half of the write current a case where no voltage is applied to the terminals 17 and 18 (for example, see JP 2016-153933 A). The writing charge (Qw) may be reduced to a minimum extent in this manner. The polarity of the voltage to be applied and whether the perpendicular magnetic anisotropy increases or decreases are determined by the materials of the nonmagnetic layers 22b and 24b and the storage layers 22a and 24a.

In a simulation described below, the anisotropy of the storage layer is assumed to increase when a positive voltage is applied to the reference layer, and to decrease when a negative voltage is applied.

Figure 8:
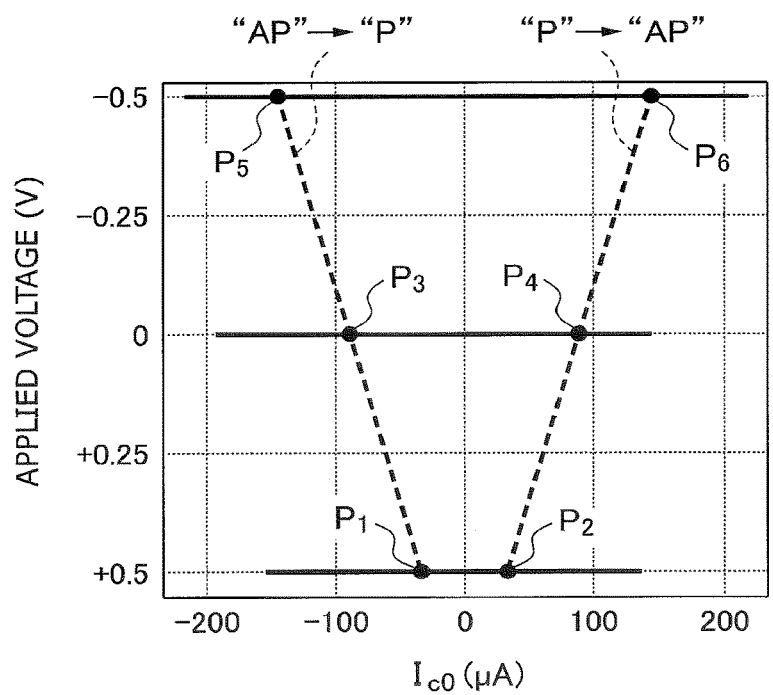
FIG. 8 is a diagram showing a relationship between a voltage applied to a reference layer of a magnetoresistive element and a threshold current of the magnetoresistive element, obtained by a simulation.
Figure 9A:
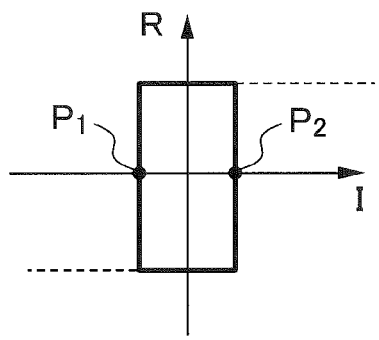
FIG. 9A is a diagram showing hysteresis characteristics of resistance value relative to current value when a positive voltage is applied to a reference layer of a magnetoresistive element.
Figure 9B:
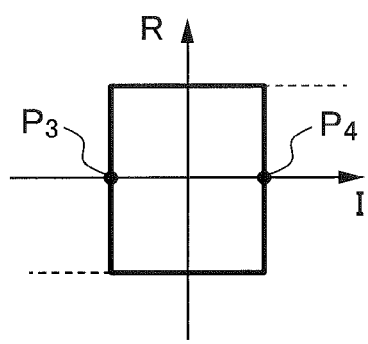
FIG. 9B is a diagram showing hysteresis characteristics of resistance value relative to current value when no voltage is applied to the reference layer of the magnetoresistive element.
Figure 9C:
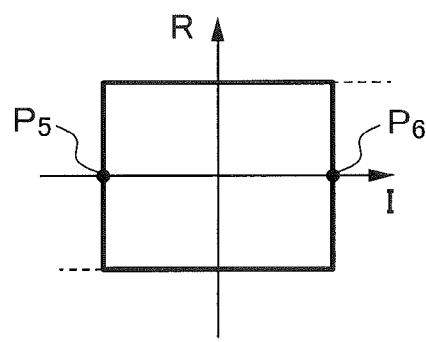
FIG. 9C is a diagram showing hysteresis characteristics of resistance value relative to current value when a negative voltage is applied to the reference layer of the magnetoresistive element.

FIGS. 8 to 9C show simulation results proving the foregoing. FIG. 8 shows the simulation results of the threshold current $I_{c0}$ at which the magnetization direction is switched in the storage layer of the magnetoresistive element when voltages +0.5 V, 0 V, and −0.5 V are applied to the reference layer of the magnetoresistive element and a current is caused to flow through the conductive layer. In FIG. 8, the vertical axis represents the voltage applied to the reference layer of the magnetoresistive element, and the horizontal axis represents the threshold current $I_{c0}$.

The point $P_1$ in FIG. 8 indicates that when a voltage +0.5 V is applied to the reference layer of the magnetoresistive element, the magnetization direction of the storage layer changes from an antiparallel (AP) state to a parallel (P) state relative to the magnetization direction of the reference layer, and the point $P_2$ indicates that when a voltage +0.5 V is applied to the reference layer of the magnetoresistive element, the magnetization direction of the storage layer changes from the parallel (P) state to the antiparallel (AP) state relative to the magnetization direction of the reference layer.

The point $P_3$ indicates that when a voltage 0 V is applied to the reference layer of the magnetoresistive element, the magnetization direction of the storage layer changes from the antiparallel (AP) state to the parallel (P) state relative to the magnetization direction of the reference layer, and the point $P_4$ indicates that when a voltage 0 V is applied to the reference layer of the magnetoresistive element, the magnetization direction of the storage layer changes from the parallel (P) state to the antiparallel (AP) state relative to the magnetization direction of the reference layer.

The point $P_5$ indicates that when a voltage −0.5 V is applied to the reference layer of the magnetoresistive element, the magnetization direction of the storage layer changes from the antiparallel (AP) state to the parallel (P) state relative to the magnetization direction of the reference layer, and the point $P_6$ indicates that when a voltage −0.5 V is applied to the reference layer of the magnetoresistive element, the magnetization direction of the storage layer changes from the parallel (P) state to the antiparallel (AP) state relative to the magnetization direction of the reference layer. The broken line connecting the points $P_1$, $P_3$, and $P_5$ indicates the changes in threshold current $I_{c0}$ by which the magnetoresistive element changes from the AP state to the P state when the voltage applied to the reference layer of the magnetoresistive element is changed between +0.5 V and −0.5 V. The broken line connecting the points $P_2$, $P_4$, and $P_6$ indicates the changes in threshold current $I_{c0}$ by which the magnetoresistive element changes from the P state to the AP state when the voltage applied to the reference layer of the magnetoresistive element is changed between +0.5 V and −0.5 V.

FIGS. 9A to 9C each show hysteresis curves when a voltage selected from +0.5 V, 0 V, and −0.5 V is applied to the reference layer of the magnetoresistive element. The vertical axis of each hysteresis curve diagram indicates the resistance R of the magnetoresistive element, and the horizontal axis represents the current I flowing through the conductive layer. The points $P_1$ to $P_6$ in FIGS. 9A to 9C correspond to the points $P_1$ to $P_6$ shown in FIG. 8, respectively. As can be understood from FIGS. 8 to 9C, applying a higher positive voltage to the reference layer of the magnetoresistive element leads to a lower threshold current $I_{c0}$ than the threshold current when no voltage is applied. On the contrary, applying a lower negative voltage to the reference layer of the magnetoresistive element leads to a higher threshold current $I_{c0}$ than the threshold current when no voltage is applied.

Figure 10:
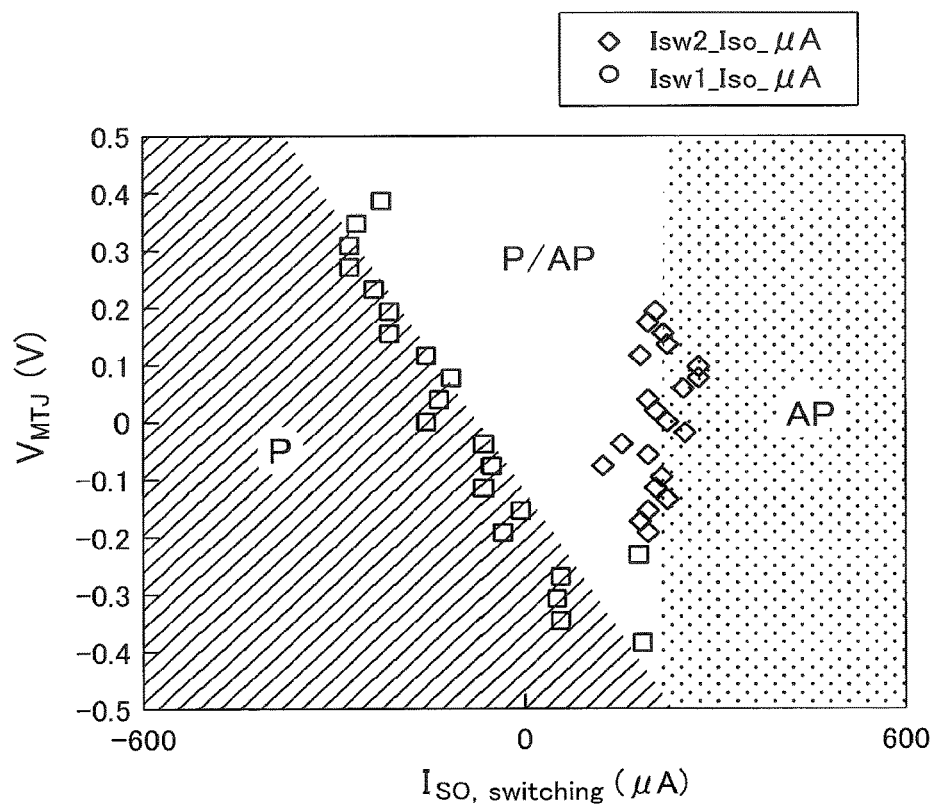
FIG. 10 shows a result of an experiment for obtaining a relationship between a voltage applied to a magnetoresistive element and a current flowing through a conductive layer, with which the magnetization is switched.

FIG. 10 shows a result of an experiment for obtaining a relationship between a voltage applied to the magnetoresistive element and a value $I_{SO,switching}$ of a current flowing through the conductive layer, at which the magnetization switching occurs, in the memory cell according to the first embodiment. In this experiment, a combination of MgO and CoFeB is used to form the combination of the nonmagnetic material layer and the storage layer. With this combination of materials, the anisotropy of the storage layer is decreased when a positive voltage is applied to the reference layer, and increased when a negative voltage is applied.

The vertical axis in FIG. 10 represents voltage $V_{MTJ}$ applied to the magnetoresistive element, and the horizontal axis represents current $I_{SO,switching}$ flowing through the conductive layer, with which magnetization switching occurs. The region denoted by "P" in FIG. 10 indicates that the magnetization direction of the storage layer is parallel to the magnetization direction of the reference layer of the magnetoresistive element, and the region denoted by "AP" indicates that the magnetization direction of the storage layer is antiparallel to the magnetization direction of the reference layer in the magnetoresistive element. The current I flowing through the conductive layer is measured by the pulse width number ms, and the absolute value of the current I may be lower than the value of the threshold current $I_{c0}$ on the ns order in FIG. 10. However, the changes in the threshold current $I_{c0}$ when a voltage is applied are the same as the result of the simulation for the most part.

As described above, energy consumption may be reduced and write and read operations may be performed at a high speed in the magnetic memories according to the first embodiment and its modifications.

Second Embodiment

Figure 11:
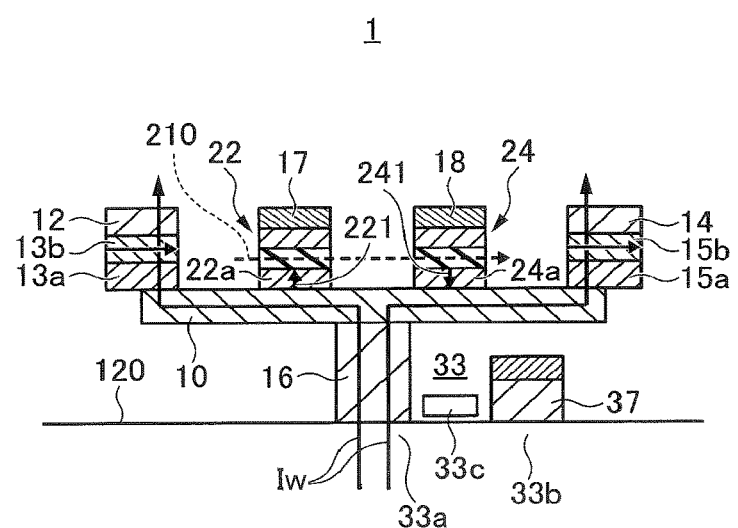
FIG. 11 is a cross-sectional view showing a memory cell of a magnetic memory according to a second embodiment.

A magnetic memory according to a second embodiment will be described with reference to FIG. 11. The magnetic memory according to the second embodiment includes at least one memory cell. FIG. 11 shows a cross-sectional view of the memory cell. The memory cell 1 according to the second embodiment is obtained by replacing the magnetoresistive elements 22 and 24 of the memory cell 1 according to the first embodiment shown in FIG. 5 with perpendicular magnetization magnetoresistive elements. Therefore, the magnetization direction 221 of the storage layer 22a of the magnetoresistive element 22 and the magnetization direction 241 of the storage layer 24a of the magnetoresistive element 24 are parallel to the stacking direction of the magnetoresistive element 1. In this embodiment, a multilayer structure including a nonmagnetic layer 13a and a magnetic layer 13b is disposed between the conductive layer 10 and the terminal 12, and a multilayer structure including a nonmagnetic layer 15a and a magnetic layer 15b is disposed between the conductive layer 10 and the terminal 14.

The magnetic layer 13b and the magnetic layer 15b have an in-plane magnetization (in-plane magnetic anisotropy) as shown in FIG. 11, and apply a biased magnetic field 210 to the storage layer 22a and the storage layer 24a. Having an in-plane magnetic anisotropy means that a component of the magnetization of a magnetic layer in a direction perpendicular to the stacking direction is greater than a component in the stacking direction.

If a current magnetic field is used as the biased magnetic field, energy consumption is increased. For example, several tens µA of current would generate only several Oe of magnetic field. Due to this, the error rate in a write operation cannot be reduced satisfactorily. Therefore, thin-film permanent magnets are used as the magnetic layer 13b and the magnetic layer 15b in this embodiment to obtain a magnetic field of more than several tens Oe.

In the second embodiment, when the write currents Iw flow through the conductive layer 10, the magnetization directions of the storage layers 22a and 24a are perpendicular to the spin direction of spin polarized electron. Therefore, the magnetizations of the storage layers 22a and 24a directly rotate without precession. Thus, the write operation is performed in a direct mode.

In the direct mode of the write operation, the magnetizations of the storage layers 22a and 24a may be rotated to an extent, but may not be switched to opposite directions. The biased magnetic field applied to the storage layers 22a and 24a using the magnetic layers 13b and 15b including the thin-film permanent magnets may cause the magnetization switching in the storage layers 22a and 24a so that the magnetizations in these layers are directed to the opposite directions at a low error rate, about $1 \times 10^{-9}$. As a result, a write operation may be performed according to the principle of determinism.

In a write operation in the direct mode, the write current with short pulses (having a pulse width of 3 ns or less) is smaller than a write current in a write operation using precession (for example, see K-S. Lee, et al., Appl. Phys. Lett. 104, 072413 (2014)). As a result, the writing charge ($Q_w = I_w \times t_p$, where $t_p$ is the pulse width of the write current Iw) may be reduced.

The write current may further be reduced by applying a voltage to the magnetoresistive elements 22 and 24 to control the interface magnetic anisotropy between the storage layers 22a and 24a and the nonmagnetic layers 22b and 24b.

Figure 12:
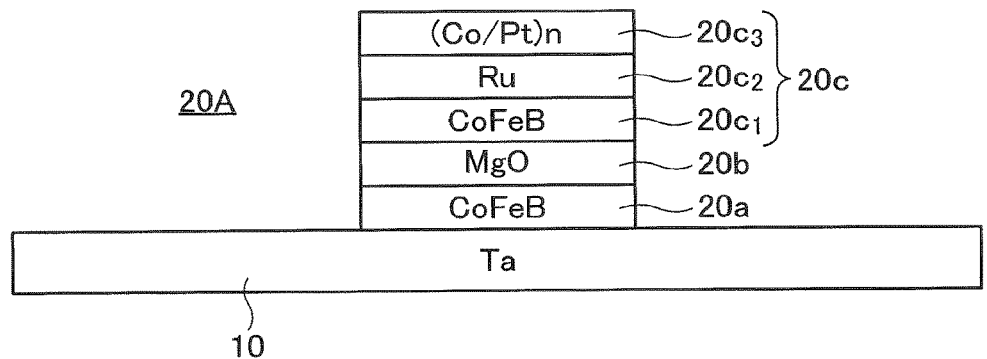
FIG. 12 is a cross-sectional view showing a specific example of a structure of a perpendicular magnetization magnetoresistive element.

FIG. 12 shows a specific example of a perpendicular magnetization magnetoresistive element that may be used as the magnetoresistive elements 22 and 24 according to the second embodiment. The magnetoresistive element 20A of the specific example has a multilayer structure including a storage layer 20a of CoFeB, for example, disposed on the conductive layer 10, a nonmagnetic layer 20b of MgO, for example, disposed on the storage layer 20a, and a reference layer 20c disposed on the nonmagnetic layer 20b. The reference layer 20c includes, for example, a CoFeB layer 20c1, a Ru layer 20c2 disposed on the CoFeB layer 20c1, and a (Co/Pt) multilayer structure 20c3 having a perpendicular magnetic anisotropy disposed on the Ru layer 20c2. The perpendicular magnetic anisotropy here means that a component in the stacking direction of the magnetization of a magnetic layer is greater than a component in a direction perpendicular to the stacking direction when no external magnetic field is applied. The reference layer 20c has a synthetic antiferromagnetic multilayer structure in which the CoFeB layer 20c1 and the (Co/Pt) multilayer structure 20c3 are in an antiferromagnetic coupling relationship via the Ru layer 20c2. In the perpendicular magnetization magnetoresistive element 20A, the magnetization of the storage layer is directed to be perpendicular by the perpendicular magnetic anisotropy generated at the MgO interface.

A write operation and a read operation of the magnetic memory according to the second embodiment are performed in the same manner as those of the magnetic memory according to the first embodiment.

As described above, energy consumption may be reduced and write and read operations may be performed at a high speed in the magnetic memory according to the second embodiment.

Third Embodiment

Figure 13A:
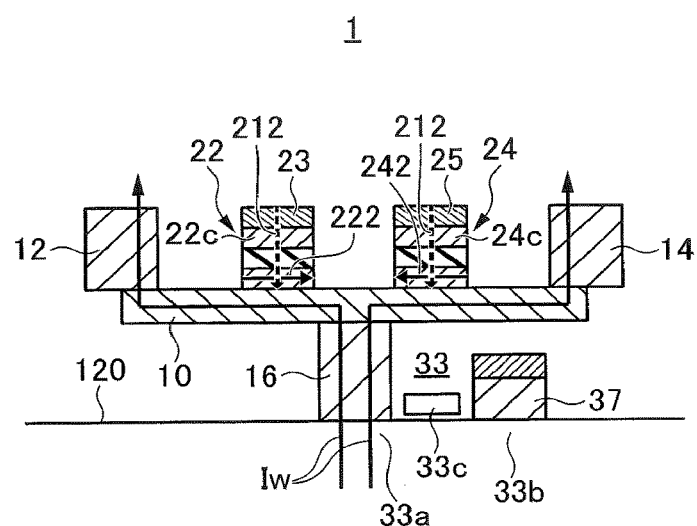
FIG. 13A is a cross-sectional view of a memory cell of a magnetic memory according to a third embodiment.
Figure 13B:
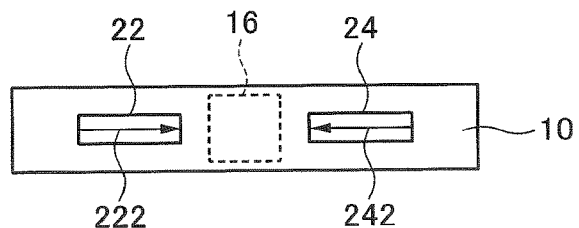
FIG. 13B is a plan view showing magnetization directions in storage layers of the memory cell according to the third embodiment.

A magnetic memory according to a third embodiment will be described with reference to FIGS. 13A and 13B. The magnetic memory according to the third embodiment includes at least one memory cell. FIG. 13A is a cross-sectional view of the memory cell.

The memory cell 1 according to the third embodiment is obtained by replacing the magnetoresistive elements 22 and 24 of the memory cell 1 according to the first embodiment shown in FIG. 5 with magnetoresistive elements with an in-plane magnetic anisotropy. Thus, the magnetization direction 222 of the storage layer 22a included in the magnetoresistive element 22 and the magnetization direction 242 of the storage layer 24a included in the magnetoresistive element 24 are substantially perpendicular to the stacking direction of the magnetoresistive element 1, as shown in FIGS. 13A and 13B.

In this embodiment, magnetic layers 23 and 25 are disposed on the reference layers 22c and 24c of the magnetoresistive elements 22 and 24, respectively. FIG. 13B is a plan view showing the magnetization directions 222 and 242 of the storage layers 22a and 24a.

As shown in FIG. 13A, the magnetic layer 23 and the magnetic layer 25 have a perpendicular magnetization (perpendicular magnetic anisotropy), and apply a biased magnetic field 212 that is perpendicular to the stacking direction to the storage layer 22a and the storage layer 24a. Thin-film permanent magnets may be used as the magnetic layer 23 and the magnetic layer 25.

In the third embodiment, when a write current Iw flows through the conductive layer 10, the magnetization directions of the storage layers 22a and 24a are perpendicular to the spin direction of interacting spin-polarized electrons. Therefore, the magnetizations of the storage layers 22a and 24a directly rotate without precession. Thus, a deterministic write operation is performed by the biased magnetic field 212 caused by the magnetic layer 23 and the magnetic layer 25 of thin-film permanent magnets. The writing charge Qw (=Iw×tp) may be reduced, similarly to the second embodiment.

The write operation and the read operation of the magnetic memory according to the third embodiment are performed in the same manner as those of the magnetic memory according to the first embodiment.

As described above, energy consumption may be reduced and write and read operations may be performed at a high speed in the magnetic memory according to the third embodiment.

The write current may further be reduced by applying a voltage to the magnetoresistive elements 22 and 24 to control the interface magnetic anisotropy between the storage layers 22a and 24a and the nonmagnetic layers 22b and 24b in the write operation of the magnetic memory according to the third embodiment.

Fourth Embodiment

Figure 14A:
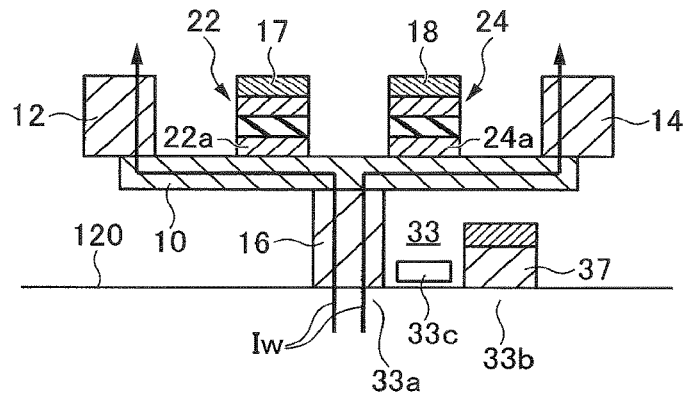
FIG. 14A is a cross-sectional view showing a memory cell of a magnetic memory according to a fourth embodiment.

A magnetic memory according to a fourth embodiment will be described with reference to FIGS. 14A and 14B. The magnetic memory according to the fourth embodiment includes at least one memory cell. FIG. 14A is a cross-sectional view of the memory cell.

The memory cell 1 according to the fourth embodiment has the same structure as the memory cell 1 according to the first embodiment shown in FIG. 5 except for the magnetization directions of the storage layers 22a and 24a included in the magnetoresistive elements 22 and 24. Thus, unlike the second and third embodiments, no biased magnetic field is applied to the storage layers 22a and 24a in the fourth embodiment. In the first to fourth embodiments, the terminal 12 and the terminal 14 are disposed to be separated from each other in a direction along which the conductive layer 10 extends. Thus, a current flows through the conductive layer 10 between the terminal 12 and the terminal 14 in a direction along which the conductive layer 10 extends.

Figure 14B:
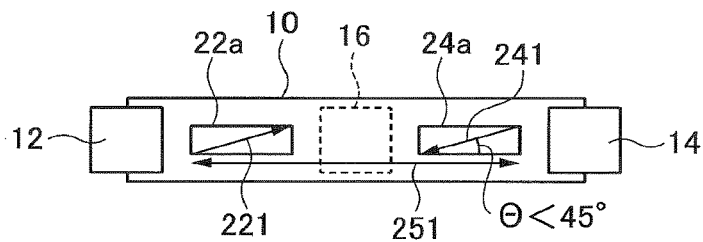
FIG. 14B is a plan view showing magnetization directions of storage layers of the memory cell according to the fourth embodiment.

FIG. 14B shows the magnetization directions of the storage layers 22a and 24a included in the memory cell according to the fourth embodiment. The magnetizations 221 and 241 of the storage layers 22a and 24a are inclined to make an angle Θ (>0°) with the direction 251 of a current flowing between the terminal 12 and the terminal 14, as shown in FIG. 14B. According to experiments, the angle Θ is preferably about 15°, and less than 45°. This arrangement causes the torque exerted on the magnetizations of the storage layers 22a and 24a to have a component in a direction of the easy magnetization axis of the magnetoresistive elements 22 and 24, and enables a deterministic write operation in which magnetizations with opposite polarities are written. Similarly to the second embodiment, the writing charge may be reduced in the fourth embodiment.

The write operation and the read operation of the magnetic memory according to the fourth embodiment are performed in the same manner as those of the magnetic memory according to the first embodiment.

Figure 14C:
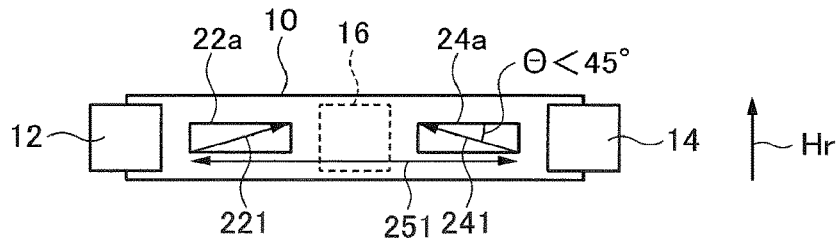
FIG. 14C is a plan view showing the magnetization directions of the storage layers of the memory cell according to the fourth embodiment, when it is subjected to the influence of a stray magnetic field from a reference layer.

In the fourth embodiment, the magnetization of the storage layer 22a is directed toward upper right and the magnetization of the storage layer 24a is directed toward lower left in FIG. 14B. If the magnetizations of the storage layers 22a and 24a are affected by a stray magnetic field from the reference layers 22c and 24c in the fourth embodiment, the magnetizations have components in the hard magnetization axis direction due to the influence of the stray magnetic field Hr as shown in FIG. 14C. As a result, the magnetization of the storage layer 22a is directed toward upper right, and the magnetization of the storage layer 24a is directed toward upper left.

As described above, energy consumption may be reduced and write and read operations may be performed at a high speed in the magnetic memory according to the fourth embodiment.

(Modification)

Figure 14D:
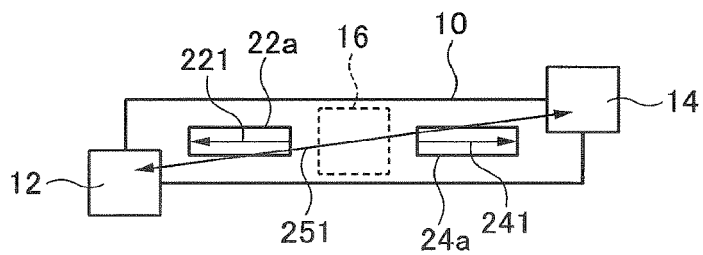
FIG. 14D is a plan view showing magnetization directions of storage layers of a memory cell according to a modification of the fourth embodiment.

In the fourth embodiment, the magnetization direction of the storage layers 22a and 24a is set to make an angle Θ with the direction of the current flowing through the conductive layer 10. The same effect can be obtained by tilting the magnetization directions of the storage layers 22a and 24a relative to the direction of the current flowing through the conductive layer 10. FIG. 14D shows this state, in which the terminal 12 and the terminal 14 are separately disposed on a diagonal line of the conductive layer 10, and the magnetizations of the storage layer 22a and the storage layer 24a are set to be in a direction parallel to the direction along which the conductive layer 10 extends.

This causes a current flowing through the conductive layer 10 between the terminal 12 and the terminal 14 to be directed to be in a direction 251, which is parallel to the diagonal line of the conductive layer 10. As a result, the magnetizations of the storage layer 22a and the storage layer 24a are inclined to make an angle Θ relative to the direction 251 of the current.

Similarly to the fourth embodiment, the writing charge may be reduced, energy consumption may be reduced and write and read operations may be performed at a high speed in the magnetic memory according to the modification of the fourth embodiment.

The write current may further be reduced in the fourth embodiment and its modification by applying a voltage to the magnetoresistive elements 22 and 24 to control the interface magnetic anisotropy between the storage layers 22a and 24a and the nonmagnetic layers 22b and 24b in the write operation.

Fifth Embodiment

Figure 15A:
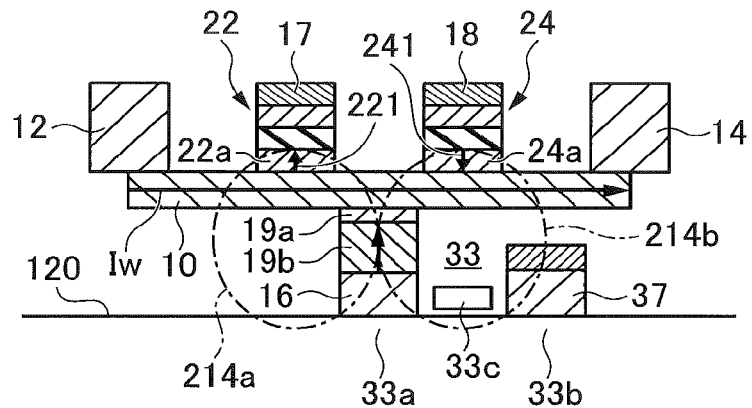
FIG. 15A is an explanatory diagram of an operation for writing data "1" to a memory cell of a magnetic memory according to a fifth embodiment.
Figure 15B:
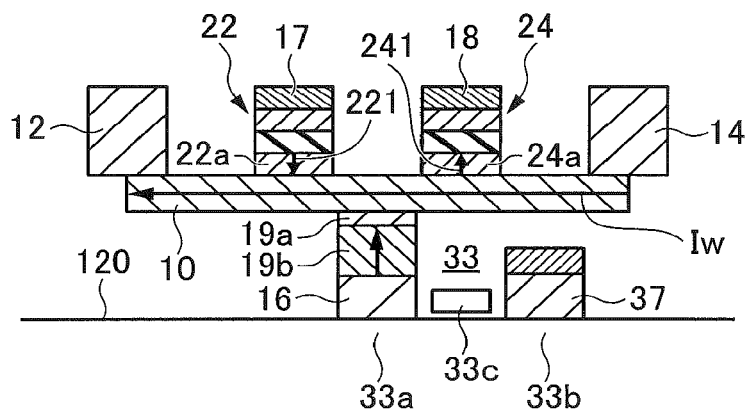
FIG. 15B is an explanatory diagram of an operation for writing data "0" to the memory cell of the magnetic memory according to the fifth embodiment.

A magnetic memory according to a fifth embodiment will be described with reference to FIGS. 15A to 15C. The magnetic memory according to the fifth embodiment includes at least one memory cell. FIGS. 15A and 15B show the memory cell. FIG. 15A is an explanatory diagram illustrating a case where data "1" is written to the memory cell 1, and FIG. 15B is an explanatory diagram illustrating a case where data "0" is written to the memory cell 1.

The memory cell 1 according to the fifth embodiment has a configuration in which a multilayer structure including a nonmagnetic layer 19a and a magnetic layer 19b of a thin-film permanent magnet is disposed between the conductive layer 10 and the terminal 16 in the memory cell 1 according to the first embodiment shown in FIG. 5. In the fifth embodiment, the magnetoresistive elements 22 and 24 are of perpendicular magnetization type, and the magnetic layer 19b has a magnetization in a direction from the terminal 16 to the conductive layer 10. When the data "1" is written, the magnetization of the storage layer 22a included in the magnetoresistive element 22 is directed upward in the drawings, and the magnetization of the storage layer 24a included in the magnetoresistive element 24 is directed downward (FIG. 15A). When data "0" is written, the magnetization of the storage layer 22a included in the magnetoresistive element 22 is directed downward in the drawings, and the magnetization of the storage layer 24a included in the magnetoresistive element 24 is directed upward (FIG. 15B).

In the case of FIG. 15A illustrating the fifth embodiment, the write current Iw flows from the terminal 12 to the terminal 14, and in the case of FIG. 15B, the write current Iw flows from the terminal 14 to the terminal 12. In both cases, a torque in the same direction is exerted by the write current to the magnetoresistive elements 22 and 24.

However, the directions of biased magnetic fields 214a and 214b from the magnetic layer 19b of a thin-film permanent magnet having a perpendicular magnetization are opposite in the magnetoresistive element 22 and the magnetoresistive element 24. For example, in FIG. 15A, the direction is to the left in the magnetoresistive element 22, and to the right in the magnetoresistive element 24. Thus, writing magnetizations with opposite polarities in a deterministic manner is made possible.

Figure 15C:
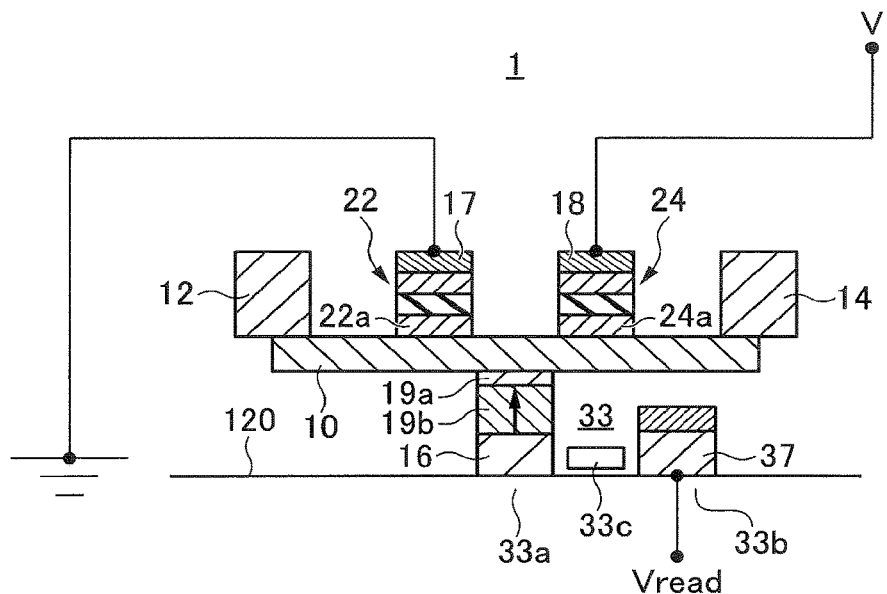
FIG. 15C is an explanatory diagram of a read operation in the magnetic memory according to the fifth embodiment.

A read operation is performed by applying a voltage V between the terminal 18 and the terminal 17, and reading the potential of the terminal 16 via the electrode 37, as shown in FIG. 15C. That is to say, similarly to the first embodiment, the voltage V is applied between the magnetoresistive element 24 and the magnetoresistive element 22, and the potential of the terminal 16 is read via the electrode 37.

Similarly to the first embodiment, energy consumption may be reduced and write and read operation may be performed at a high speed in the magnetic memory according to the fifth embodiment.

The write current may further be reduced in the fifth embodiment by applying a potential to the reference layers of the magnetoresistive element 22 and the magnetoresistive element 24 via the terminal 17 and the terminal 18 to control the interface magnetic anisotropy between the storage layers 22a and 24a and the nonmagnetic layers 22b and 24b.

Sixth Embodiment

Figure 16A:
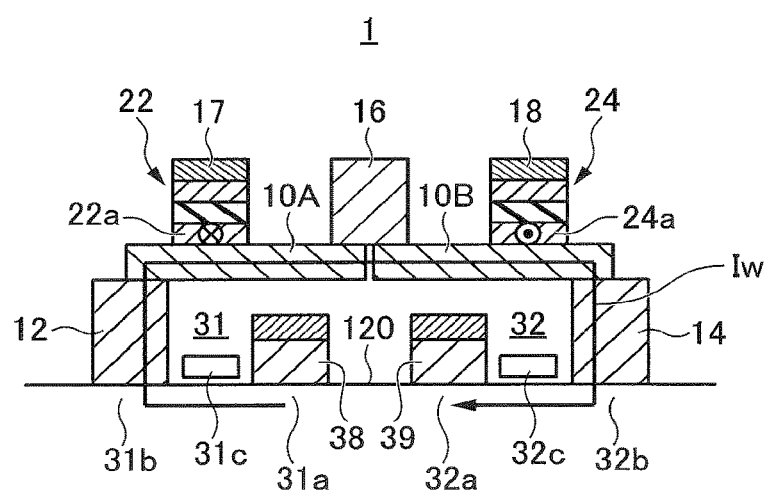
FIG. 16A is an explanatory diagram of an operation for writing data "1" to a memory cell of a magnetic memory according to a sixth embodiment.
Figure 16B:
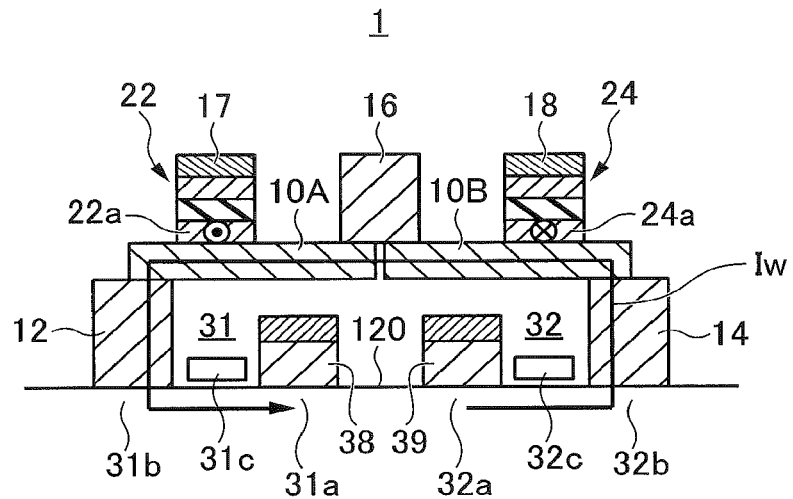
FIG. 16B is an explanatory diagram of an operation for writing data "0" to the memory cell of the magnetic memory according to the sixth embodiment.

A magnetic memory according to a sixth embodiment will be described with reference to FIGS. 16A and 16B. The magnetic memory according to the sixth embodiment includes at least one memory cell. FIGS. 16A and 16B show the memory cell. FIG. 16A is an explanatory diagram in a case where data "1" is written to the memory cell 1, and FIG. 16B is an explanatory diagram in a case where data "0" is written to the memory cell 1.

A transistor 31 and a transistor 32 are separately disposed on a semiconductor layer 120 in the memory cell 1 according to the sixth embodiment. The transistor 31 has a source and a drain, one of which is connected to the terminal 12 and the other is connected to the electrode 38. The terminal 12 is disposed to be at a more distance from the transistor 32 than the electrode 38. The transistor 32 has a source and a drain, one of which is connected to the terminal 14 and the other is connected to the electrode 39. The terminal 14 is disposed to be at a more distance from the transistor 31 than the electrode 39.

A conductive layer 10A that extends toward the transistor 32 side is disposed above the transistor 31, one end of the conductive layer 10A being connected to the terminal 12. A conductive layer 10B that extends toward the transistor 31 side is disposed above the transistor 32, one end of the conductive layer 10B being connected to the terminal 14. The other end of the conductive layer 10A and the other end of the conductive layer 10B are electrically connected to each other by the terminal 16. The terminal 16 is disposed on the side opposite to the terminal 12 relative to the conductive layer 10A, and on the opposite side to the terminal 14 relative to the conductive layer 10B. The materials of the conductive layer 10A and the conductive layer 10B are selected so that the directions of spins accumulated in upper portions of these layers are opposite to each other. In other words, in the sixth embodiment, a sign of a spin Hall angle of the conductive layer 10A is different from a sign of a spin Hall angle of the conductive layer 10B.

The magnetoresistive element 22 is disposed on the conductive layer 10A between the terminal 12 and the terminal 16. The magnetoresistive element 22 is on the same side of the conductive layer 10A as the terminal 16. The magnetoresistive element 24 is disposed on the conductive layer 10B between the terminal 14 and the terminal 16. The magnetoresistive element 24 is on the same side of the conductive layer 10B as the terminal 16. The terminals 17 and 18 are disposed on the reference layers of the magnetoresistive elements 22 and 24, respectively.

When data "1" is written to the memory cell 1, a write current Iw is caused to flow from the terminal 12 to the terminal 14 via the conductive layer 10A, the terminal 16, and the conductive layer 10B, as shown in FIG. 16A. When data "0" is written to the memory cell 1, the write current Iw is caused to flow from the terminal 14 to the terminal 12 via the conductive layer 10B, the terminal 16, and the conductive layer 10A, as shown in FIG. 16B. In both cases, the directions of the spins accumulated in the conductive layer 10A and the conductive layer 10B immediately below the magnetoresistive elements 22 and 24 are opposite to each other. Therefore, data with opposite polarities are written to the storage layers 22a and 24a of the magnetoresistive elements 22 and 24.

A read operation is performed by applying a voltage between the terminal 17 and the terminal 18, and reading the potential of the terminal 16, as in the case of the first embodiment.

Similarly to the first embodiment, energy consumption may be reduced and write and read operations may be performed at a high speed in the magnetic memory according to the sixth embodiment.

The write current may further be reduced in the sixth embodiment by applying a potential to the reference layers of the magnetoresistive element 22 and the magnetoresistive element 24 via the terminal 17 and the terminal 18 to control the interface magnetic anisotropy between the storage layers 22a and 24a and the nonmagnetic layers 22b and 24b.

Seventh Embodiment

Figure 17:
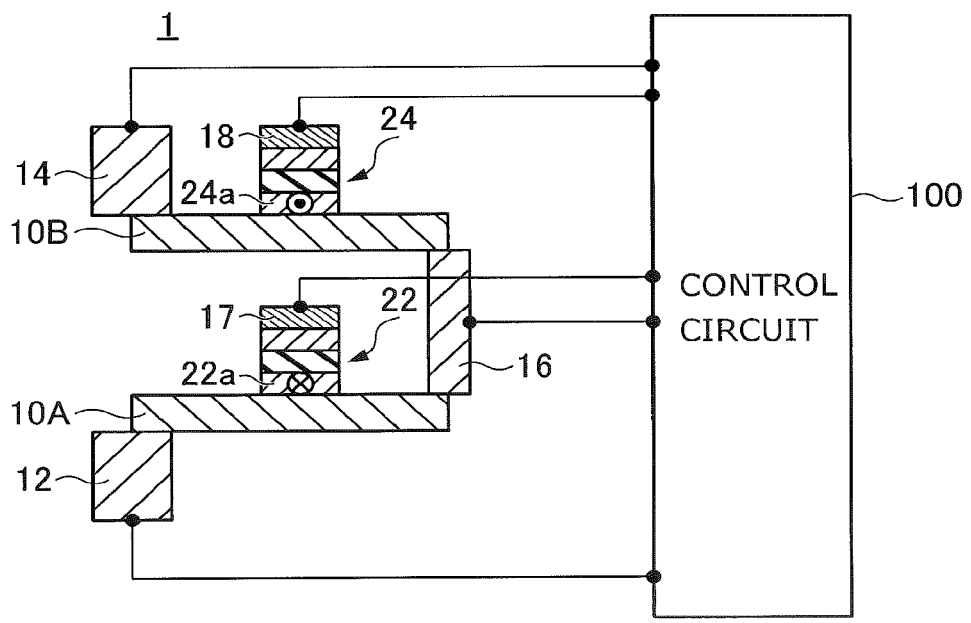
FIG. 17 is a cross-sectional view showing a memory cell of a magnetic memory according to a seventh embodiment.

A magnetic memory according to a seventh embodiment will be described with reference to FIG. 17. The magnetic memory according to the seventh embodiment includes at least one memory cell. FIG. 17 is a cross-sectional view of the memory cell.

The memory cell 1 according to the seventh embodiment has a configuration in which the magnetoresistive element 22 and the magnetoresistive element 24 of the memory cell 1 according to the sixth embodiment shown in FIG. 16A are stacked in order to reduce the cell size.

In the memory cell 1, the terminal 12 is disposed on the lower surface of the conductive layer 10A at one end of the conductive layer 10A. The magnetoresistive element 22 and the terminal 16 (also referred conductive layer 16) are disposed on the top surface of the conductive layer 10A. One end of the conductive layer 16 is connected to the top surface at the other end of the conductive layer 10A. The magnetoresistive element 22 is disposed on the top surface of the conductive layer 10A between the one end and the other end of the conductive layer 10A. The terminal 17 is disposed on the magnetoresistive element 22. The The other end of the conductive layer 16 is connected to the lower surface of the conductive layer 10B at one end of the conductive layer 10B. The magnetoresistive element 24 and the terminal 14 are disposed on the top surface of the conductive layer 10B. The terminal 14 is connected to the top surface of the conductive layer 10B at the other end of the conductive layer 10B. The magnetoresistive element 24 is disposed on the top surface of the conductive layer 10B between the one end and the other end of the conductive layer 10B. The terminal 18 is disposed on the magnetoresistive element 24. The conductive layer 10A, the conductive layer 10B, and the conductive layer 16 may be different from each other, or may be integrated as a single conductive layer.

The terminals 12, 14, 16, 17, and 18 are connected to the control circuit 100, and supplied with a current or a potential by the control circuit 100.

The write operation is performed in the same manner as those according to the sixth embodiment. In other words, a write current flows between the terminal 12 and the terminal 14. And like the six embodiment, the directions of the spins accumulated in the conductive layer 10A and the conductive layer 10B immediately below the magnetoresistive elements 22 and 24 are opposite to each other. Therefore, data with opposite polarities are written to the storage layers 22a and 24a of the magnetoresistive elements 22 and 24. Incidentally, in the seventh embodiment, a sign of a spin Hall angle of the conductive layer 10A is the same as a sign of a spin Hall angle of the conductive layer 10B.

The read operation is performed in the same manner as those according to the sixth embodiment.

Similarly to the first embodiment, energy consumption may be reduced and write and read operations may be performed at a high speed in the magnetic memory according to the seventh embodiment.

The write current may further be reduced in the seventh embodiment by applying a potential to the reference layers of the magnetoresistive element 22 and the magnetoresistive element 24 via the terminal 17 and the terminal 18 to control the interface magnetic anisotropy between the storage layers 22a and 24a and the nonmagnetic layers 22b and 24b.

The memory cells according to the first to fifth embodiments may also be reduced in cell size by stacking the magnetoresistive element 22 and the magnetoresistive element 24 as in the seventh embodiment.

Eighth Embodiment

Figure 18:
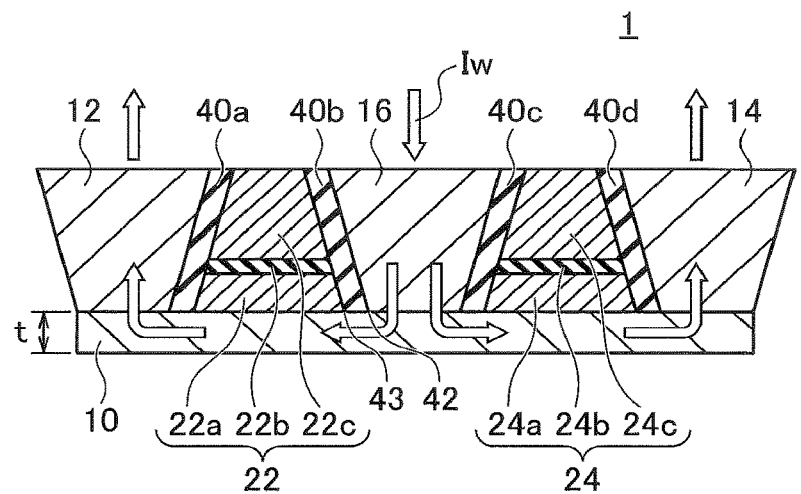
FIG. 18 is a cross-sectional view showing a memory cell of a magnetic memory according to an eighth embodiment.

A magnetic memory according to an eighth embodiment will be described with reference to FIG. 18. The magnetic memory according to the eighth embodiment includes at least one memory cell. FIG. 18 shows the memory cell.

The memory cell 1 according to the eighth embodiment has a configuration obtained by arranging the terminal 16 on the same side of the conductive layer 10 as the terminals (electrodes) 12 and 14 and the magnetoresistive elements 22 and 24 in the memory cell 1 according to the first embodiment shown in FIG. 5. Thus, the terminal 12 and the terminal 14 are separately disposed on the conductive layer 10, the terminal (electrode) 16 is disposed on the conductive layer 10 between the terminal 12 and the terminal 14, the magnetoresistive element 22 is disposed on the conductive layer 10 between the terminal 12 and the terminal 16, and the magnetoresistive element 24 is disposed on the conductive layer 10 between the terminal 16 and the terminal 14.

The magnetoresistive element 22 has a multilayer structure including a storage layer 22a disposed on the conductive layer 10, a nonmagnetic layer 22b disposed on the storage layer 22a, and a reference layer 22c disposed on the nonmagnetic layer 22b. The magnetoresistive element 24 has a multilayer structure including a storage layer 24a disposed on the conductive layer 10, a nonmagnetic layer 24b disposed on the storage layer 24a, and a reference layer 24c disposed on the nonmagnetic layer 24b.

A sidewall insulating layer 40a is disposed between the terminal 12 and the magnetoresistive element 22, a sidewall insulating layer 40b is disposed between the magnetoresistive element 22 and the terminal 16, a sidewall insulating layer 40c is disposed between the terminal 16 and the magnetoresistive element 24, and a sidewall insulating layer 40d is disposed between the magnetoresistive element 24 and the terminal 14. Thus, the terminal 12 and the magnetoresistive element 22 are electrically insulated from each other by the sidewall insulating layer 40a, the magnetoresistive element 22 and the terminal 16 are electrically insulated from each other by the sidewall insulating layer 40b, the terminal 16 and the magnetoresistive element 24 are electrically insulated from each other by the sidewall insulating layer 40c, and the magnetoresistive element 24 and the terminal 14 are electrically insulated from each other by the sidewall insulating layer 40d.

The magnetoresistive elements 22 and 24 and the terminals 12, 14, and 16 of the memory cell 1 having the aforementioned configuration are formed in a self-aligning manner.

As indicated by arrows in FIG. 18, a write current Iw supplied from the terminal 16 to the conductive layer 10 passes through a lower portion of the conductive layer 10 under the magnetoresistive element 22, acts on the storage layer 22a of the magnetoresistive element 22, and goes through the terminal 12. On the other hand, the write current Iw supplied from the terminal 16 to a portion under the magnetoresistive element 24 acts on the storage layer 24a of the magnetoresistive element 24 with an opposite acting to that for the storage layer 22a, and goes through the terminal 14.

In this embodiment, the sidewall insulating layers 40a to 40d have a thickness (width) of several nm to about 10 nm. The sidewall insulating layer 40b, for example, electrically isolates an edge portion 42 of the lower surface of the terminal 16 on the magnetoresistive element 22 side from an edge portion 43 of the storage layer 22a of the magnetoresistive element 22 on the terminal 16 side with a very narrow width, and suppresses heat (power loss) caused by the current flowing between the edge portion 42 and the edge portion 43.

Part of the write current Iw also flows through the storage layers 22a and 24a. Therefore, the ratio of the width wSW of each of the sidewall insulating layers 40a to 40d at the portion that is in contact with the conductive layer 10 to the thickness t of the conductive layer 10 has an influence on the amount of write current Iw flowing through the storage layers 22a and 24a.

Figure 19:
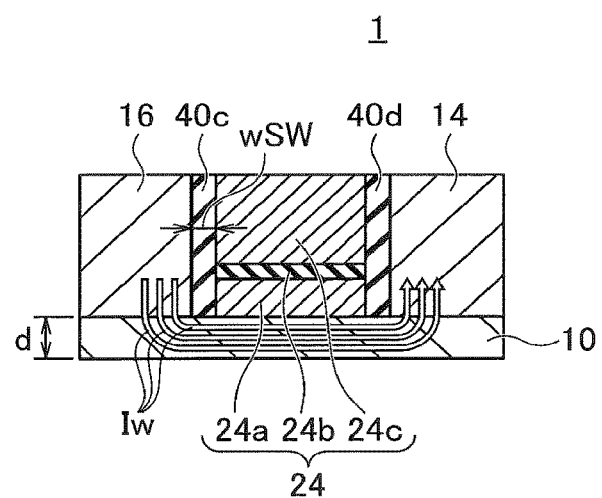
FIG. 19 is a cross-sectional view for explaining the effect of the memory cell according to the eighth embodiment.

As shown in FIG. 19, part of the write current Iw flowing from the terminal 16 into the conductive layer 10 and passing through a portion under the sidewall insulating layer 40c flows into the storage layer 24a, and then flows into the conductive layer 10 again and passes through a portion under the sidewall insulating layer 40d and flows into the terminal 14. The resistances of the terminal 16 and the terminal 14 are considerably lower than the resistance of the conductive layer 10. Therefore, the write current Iw concentrates to the edge portion of the terminal 16 as shown in FIG. 19. The degree of concentration of the write current Iw increases if the distance wSW between the storage layer 24a and the terminal 16 and the terminal 14 is as thin as the thickness t of the conductive layer 10. Such a concentration of the write current leads to a concentration of the current on the storage layer 24a side to increase the current density on the storage layer side. This is equivalent to an increase in density of the write current, and thus enables the write current to be decreased. For example, if the thickness of the conductive layer 10 is about 5 nm, the current density may be increased by setting the thickness of each of the sidewall insulating layers 40a to 40d to be about 5 nm.

Figure 20:
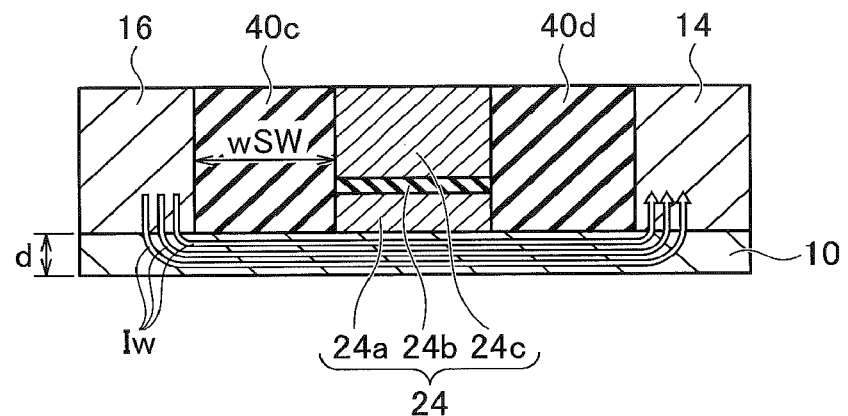
FIG. 20 is a cross-sectional view for explaining the effect of the memory cell according to the eighth embodiment.

If the width wSW of each of the sidewall insulating layers 40a to 40d is considerably thicker than the thickness d of the conductive layer 10 as shown in FIG. 20, the increase in the current density of the write current becomes small, and does not have an influence on the reduction of the write current.

(Manufacturing Method)

An example of a method of manufacturing a memory cell according to the eighth embodiment will be described with reference to FIGS. 21 to 29.

Figure 21:
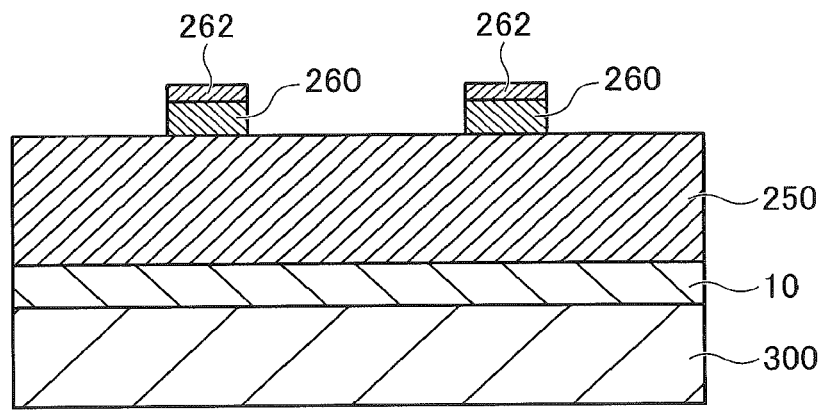
FIGS. 21 to 28 are cross-sectional views for explaining a method of manufacturing the memory cell according to the eighth embodiment.

First, a conductive layer 10 is formed on a substrate 300, on which a CMOS device is disposed. A multilayer film 250 including a magnetic layer, a nonmagnetic layer, and a magnetic layer, which are to be included in magnetoresistive elements, is formed on the conductive layer 10. Subsequently, a hard mask layer 260 and a hard mask layer 262 are deposited on the multilayer film 250 in this order, and patterned using a lithographic technique. As a result of the patterning, hard masks 262 and 260 are left on the multilayer film 250 above magnetoresistive elements that will be described later (FIG. 21). The hard mask 260 is formed of a conducting material. The hard mask 262 is formed of a material having a higher etching rate than the material of the hard mask 260.

Figure 22:
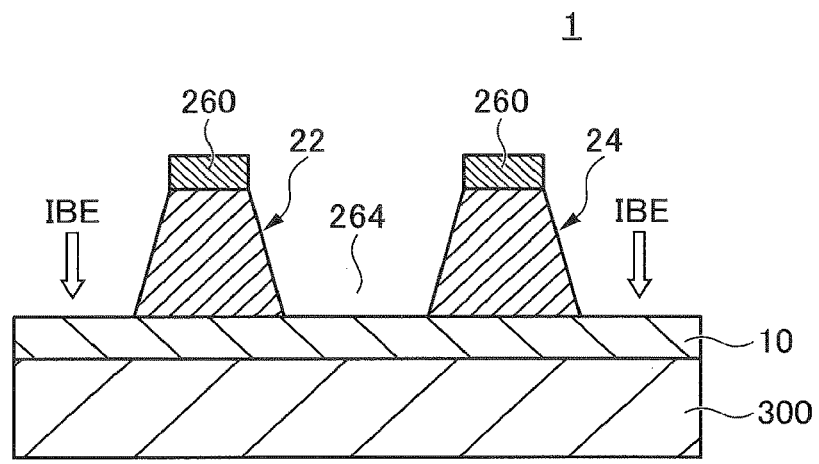

Thereafter, the hard masks 262 are removed, and the multilayer film 250 is patterned by ion beam etching (IBE), using the hard masks 260, to form magnetoresistive elements 22 and 24 under the hard masks 260 (FIG. 22). A trench 264 is formed by the IBE through the multilayer film 250. The surface of the conductive layer 10 is exposed on the bottom of the trench 264.

Figure 23:
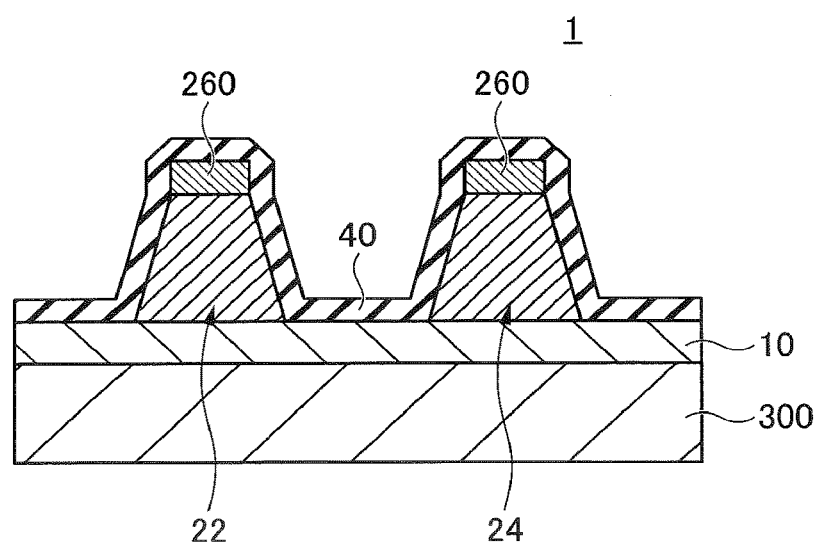

An insulating layer 40 having a uniform thickness is then formed on side portions of the magnetoresistive elements 22 and 24, using such a method as atomic layer deposition (ALD) (FIG. 23).

Figure 24:
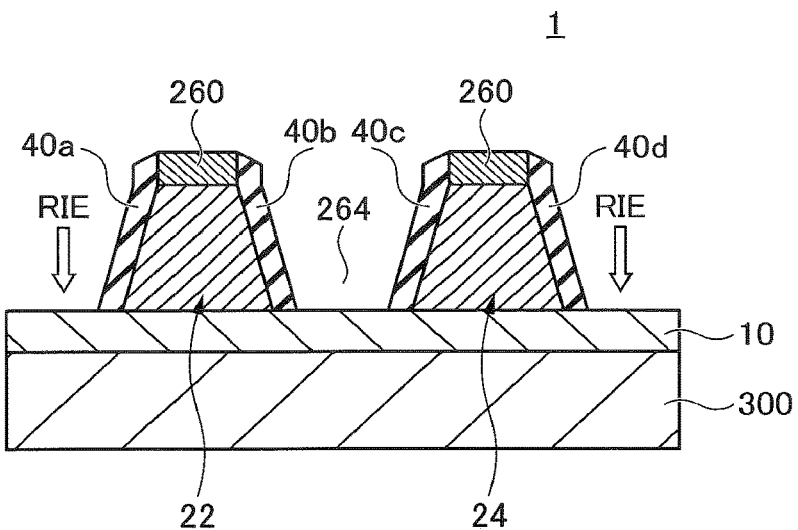

The insulating layer 40 is etched by reactive ion etching (RIE) under a condition that etching particles with an anisotropy that is greater in a direction perpendicular to the substrate enter the insulating layer 40. As a result, the insulating layer 40 is left on the side portions of the magnetoresistive elements 22 and 24 at which the etching particles do not hit strongly. Thus, the sidewall insulating layers 40a to 40d are formed. On the bottom of the trench 264, the surface of the conductive layer 10 is exposed (FIG. 24).

Figure 25:
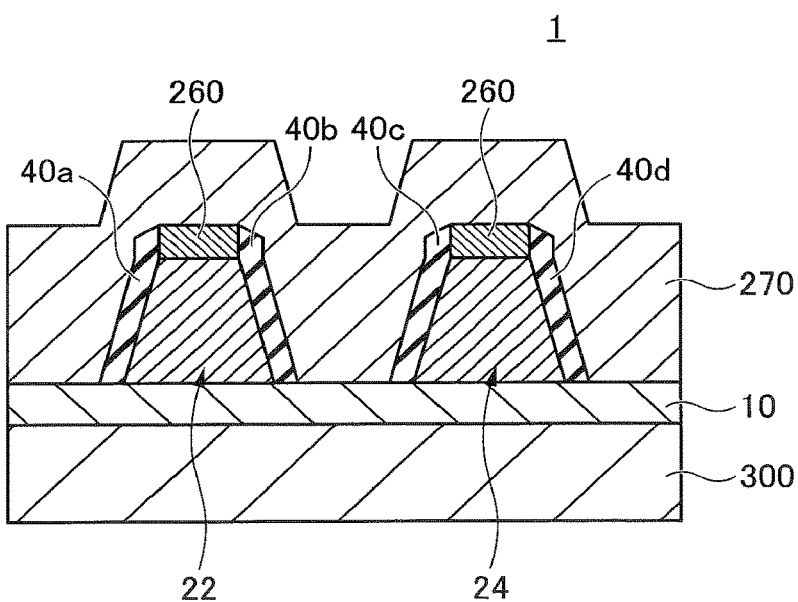

A film 270 of a good conducting material such as Cu or Ta is deposited to fill the trench 264 formed by the RIE, thereby forming an electrode film 270 (FIG. 25).

Figure 26:
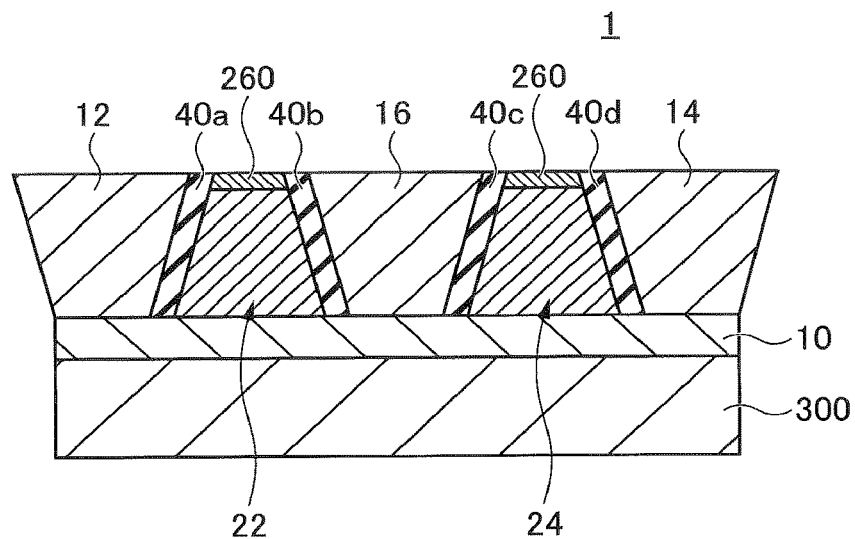
Figure 27:
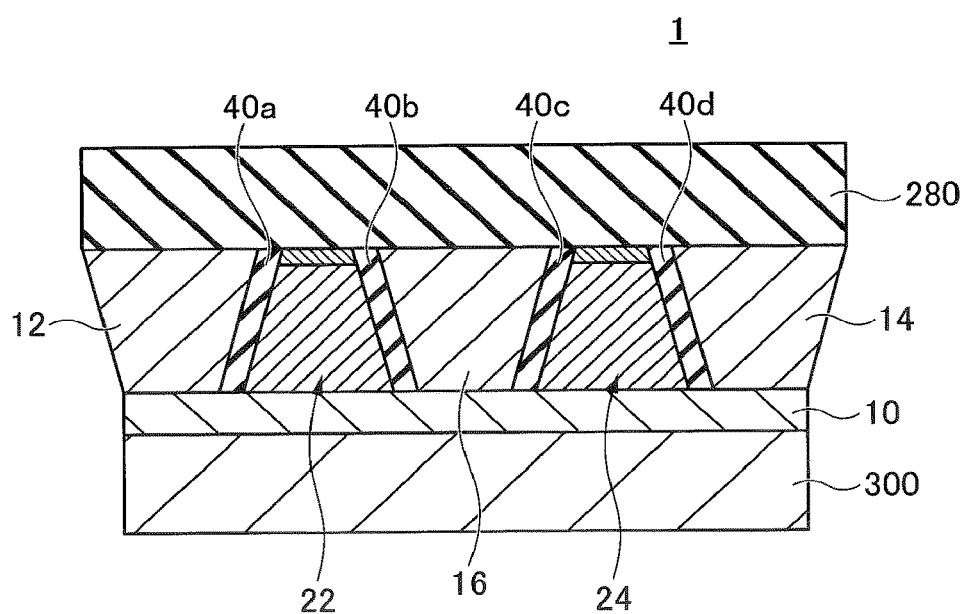

The electrode film 270 is then smoothed by, for example, chemical mechanical polishing (CMP) to leave a metal film in the trench 264 (FIG. 26).

Figure 28:
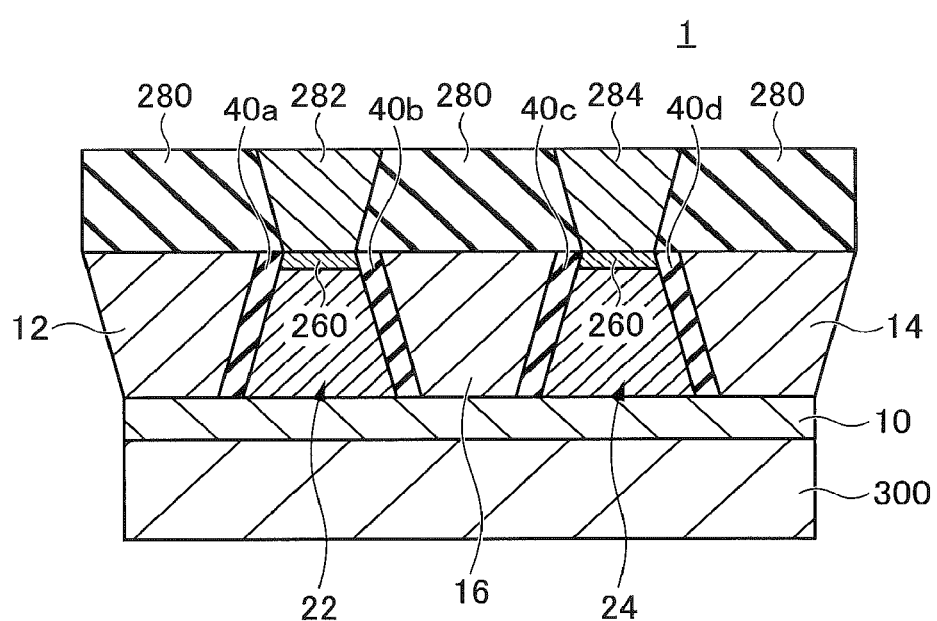
Figure 29:
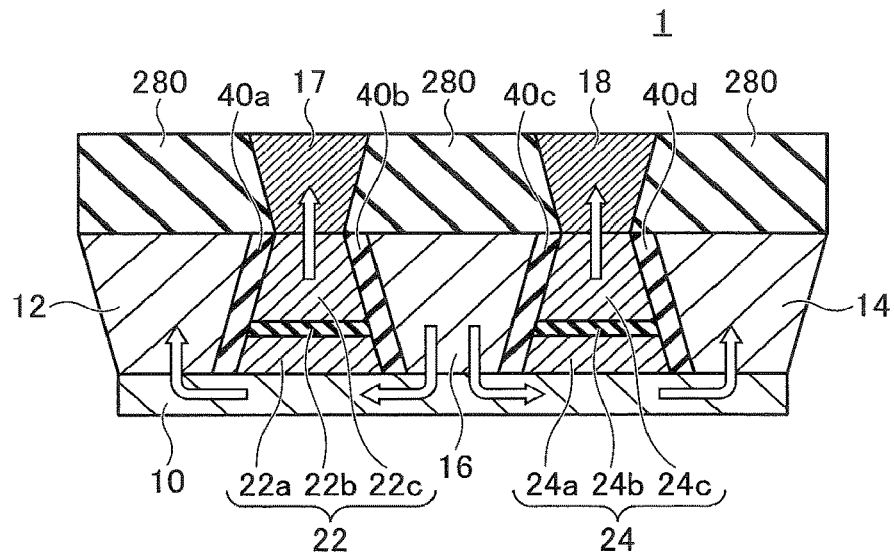
FIG. 29 is a cross-sectional view of a memory cell manufactured by the method according to the eighth embodiment.

An insulating layer 280 is formed to cover the top surface of the workpiece (FIG. 27), and then vias 282 and 284 communicating with the magnetoresistive elements 22 and 24 are formed through the insulating layer 280 (FIG. 28). Finally, the vias 282 and 284 are filled with a conducting material, and the conducting material is smoothed to form terminals 17 and 18 connecting to the magnetoresistive elements 22 and 24 (see FIG. 5). FIG. 29 is a cross-sectional view of the memory cell 1 thus formed.

According to this manufacturing method, the magnetoresistive elements 22 and 24 and the terminals 12, 14, and 16 are electrically insulated from each other by the sidewall insulating layers 40a to 40d having a predefined thickness. This structure has an advantage in that a constant write current may be supplied from the conductive layer 10 to the magnetoresistive elements 22 and 24 since the distance between the central position of the terminal 16 and the central position of the terminal 12 and the central position of the terminal 16 and the central position of the terminal 14 are the same (one pitch). Therefore, the range (window) of write current may be increased. This leads to an improvement in yield. Furthermore, the density of the write current may be increased at the edge portions of the magnetoresistive element by forming the sidewall insulating layers having a width (thickness) that is close to the thickness of the conductive layer 10, which is controlled in the atom layer level. Thus, the write current may be reduced.

Figure 30:
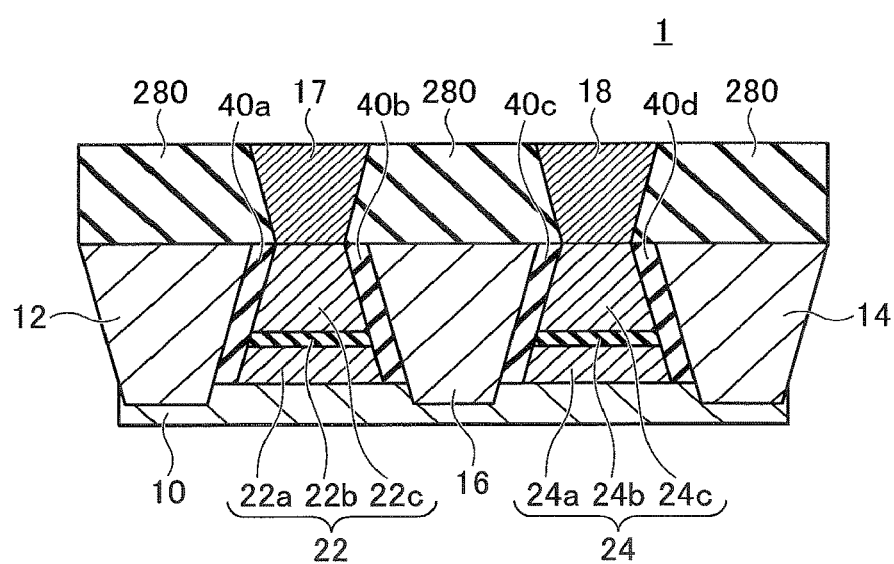
FIG. 30 is a cross-sectional view of a memory cell manufactured by another method according to the eighth embodiment.

The conductive layer 10 may be over-etched during the RIE in the process shown in FIG. 24. In this case, the terminals 12, 14, and 16 of the completed memory cell dig into the conductive layer 10, as shown in FIG. 30. The contact areas between the terminals 12, 14, and 16 and the conductive layer 10 can be increased by the structure in which the terminals 12, 14, and 16 dig into the conductive layer 10 as described above. Therefore, power loss caused by the contact resistance may be reduced. All of the terminals 12, 14, and 16 do not necessarily dig into the conductive layer 10 as shown in FIG. 30. The power loss caused by the contact resistance can be reduced if one of the terminals digs into the conductive layer 10.

As described above, similarly to the first embodiment, energy consumption may be reduced and write and read operations may be performed at a high speed in the magnetic memory according to the eighth embodiment.

Ninth Embodiment

A method of manufacturing a magnetic memory according to a ninth embodiment will be described with reference to FIGS. 31A to 31F. The magnetic memory according to the ninth embodiment includes at least three memory cells, each of which has the configuration shown in FIG. 29.

Figure 31A:
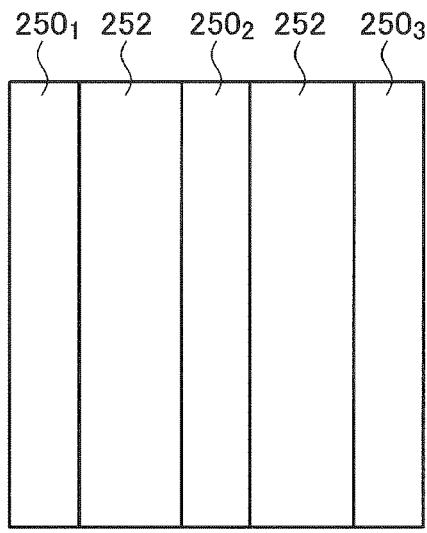
FIGS. 31A to 31F are plan views for explaining a method of manufacturing a magnetic memory according to a ninth embodiment.

First, as shown in FIG. 31A, multilayer films $250_1$, $250_2$, and $250_3$ each including a first magnetic layer, a nonmagnetic layer, and a second magnetic layer to be included in magnetoresistive elements are formed in a stripe shape on a conductive layer (not shown). Spaces between the stripes are filled with insulating layers 252, and the entire surface is smoothed. The direction along which the stripes extend is parallel to the cross section shown in FIG. 29.

Figure 31B:
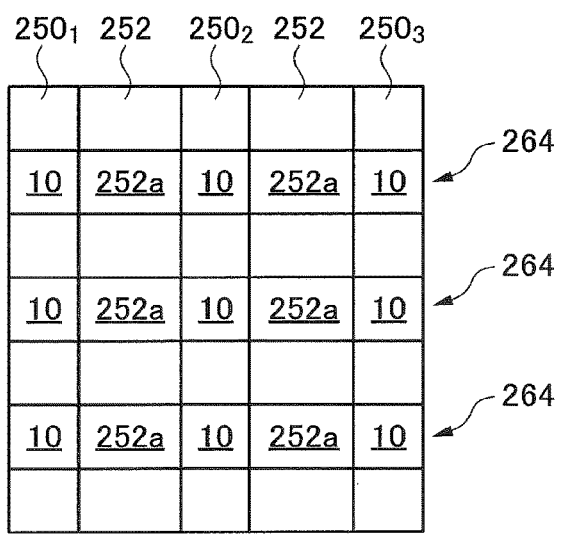

Subsequently, three grooves 264 are formed along a direction perpendicular to the direction along which the stripes extend, as shown in FIG. 31B. The surface of the conductive layer 10 is exposed in regions at intersections of the multilayer films $250_1$ to $250_3$ and the grooves 264. However, thin insulating layers 252a are left in regions at intersections of the insulating layers 252 and the grooves 264 (FIG. 31B).

Figure 31C:
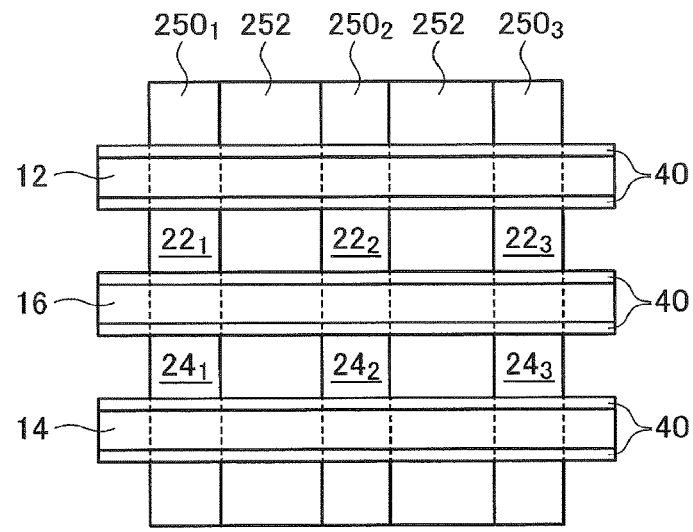

Thereafter, sidewall insulating layers 40 are formed on both sides of each groove 264 and an electrode material is filled in the grooves 264 to form the terminals 12, 16, and 14 as shown in FIG. 31C. As a result, the multilayer films $250_1$, $250_2$, and $250_3$ in portions between the terminal 12 and the terminal 16 become magnetoresistive elements $22_1$, $22_2$, and $22_3$. Furthermore, the multilayer films $250_1$, $250_2$, and $250_3$ in portions between the terminal 16 and the terminal 14 become magnetoresistive elements $24_1$, $24_2$, and $24_3$. Thus, memory cells are arranged in a direction along which the multilayer films $250_1$ to $250_3$ extend (FIG. 31C).

Figure 31D:
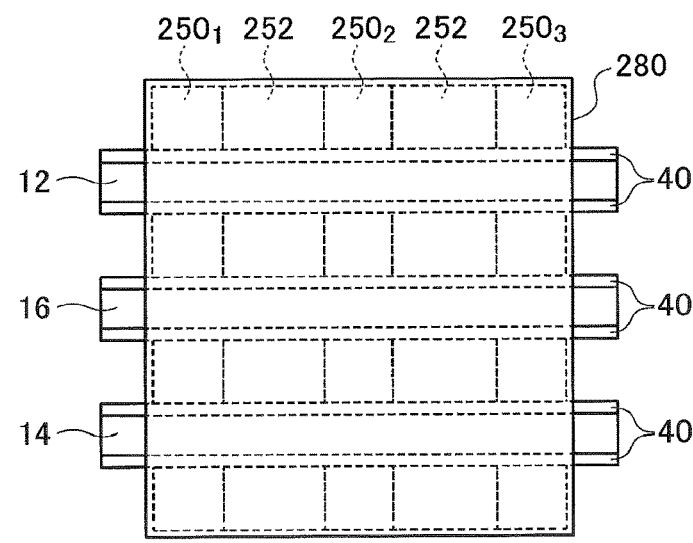
Figure 31E:
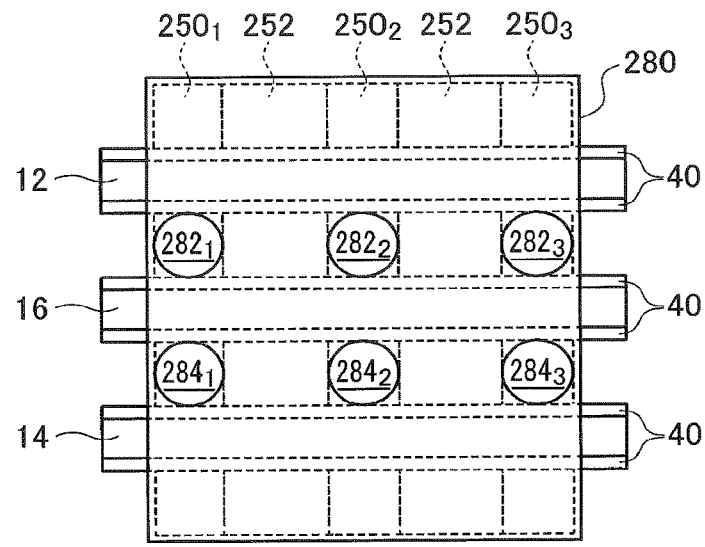

An insulating layer 280 is then formed on the top surfaces of the memory cells as shown in FIG. 31D. Subsequently, vias $282_1$, $282_2$ and $282_3$ reaching the magnetoresistive elements $22_k$, $22_2$ and $22_3$, and vias $284_1$, $284_2$ and $284_3$ reaching the magnetoresistive elements $24_1$, $24_2$ and $24_3$ are formed through the insulating layer 280 (FIG. 31E).

Figure 31F:
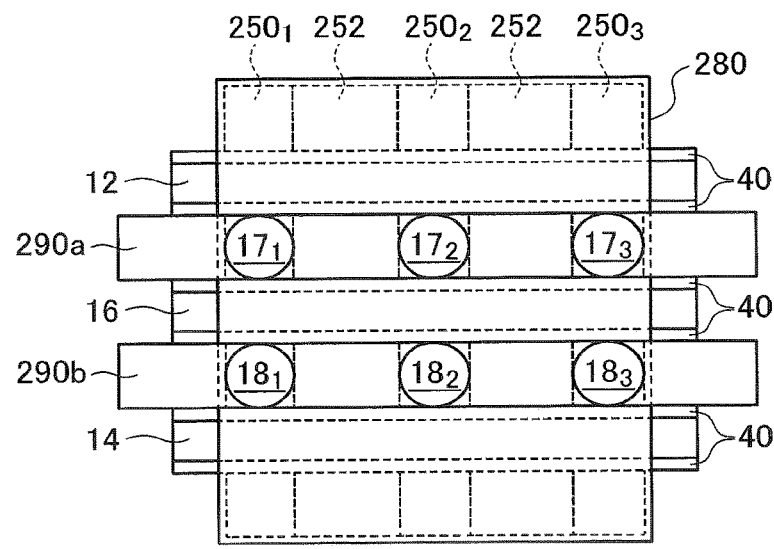

Thereafter, an electrode material 290 is deposited to fill the vias $282_1$, $282_2$ and $282_3$ and the vias $284_1$, $284_2$ and $284_3$ and patterned to have a stripe shape to form electrodes 290a and 290b for reading data from and writing data to the magnetoresistive elements $22_1$, $22_2$ and $22_3$ and the magnetoresistive elements $24_1$, $24_2$ and $24_3$. As a result, memory cells are formed (FIG. 31F). At this time, terminals $17_1$, $17_2$ and $17_3$ are formed in the vias $282_1$, $282_2$ and $282_3$ under the electrode 290a, and terminals $18_1$, $18_2$ and $18_3$ are formed in the vias $284_1$, $284_2$ and $284_3$ under the electrode 290b.

Figure 32:
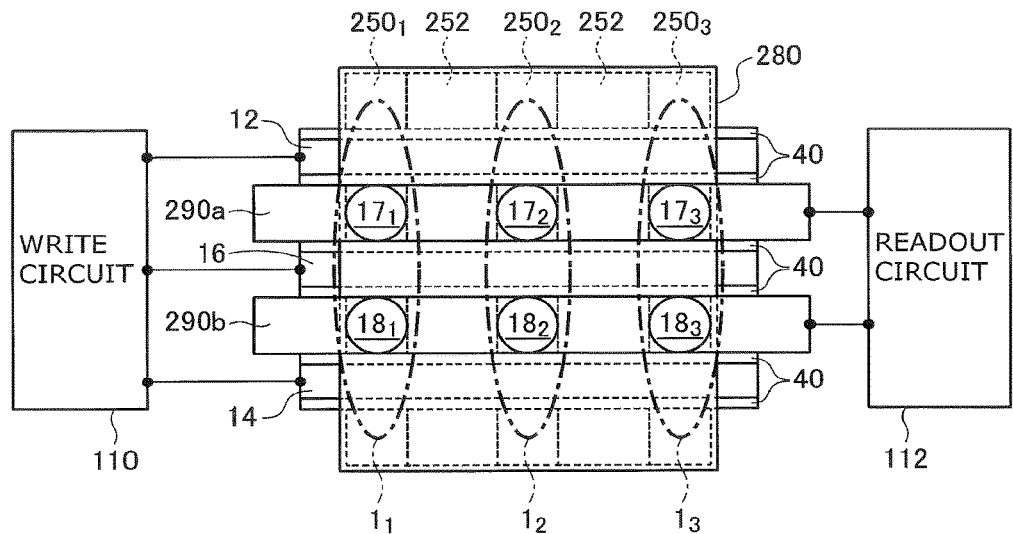
FIG. 32 is a plan view of a magnetic memory manufactured by the method according to the ninth embodiment.

As shown in FIG. 32, a write circuit 110 is connected to the electrodes 12, 14, and 16, and a readout circuit 120 is connected to the electrodes 290a and 290b of the magnetic memory manufactured in the aforementioned method. The write circuit 110 and the readout circuit 120 are included in the control circuit 100 shown in FIG. 1. The readout circuit 120 is also used to apply a bias voltage to the magnetoresistive elements $22_1$ to $22_3$ and the magnetoresistive elements $24_1$ to $24_3$ in a write operation.

Similarly to the eighth embodiment, energy consumption may be reduced and write and read operations may be performed at a high speed in the magnetic memory according to the ninth embodiment.

Tenth Embodiment

Figure 33:
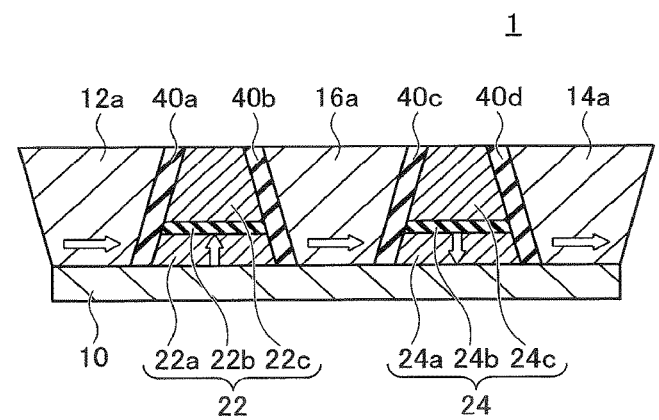
FIG. 33 is a cross-sectional view of a memory cell according to a tenth embodiment.

A magnetic memory according to a tenth embodiment will be described with reference to FIGS. 33 to 37. The magnetic memory according to the tenth embodiment includes at least one memory cell. FIG. 33 shows the memory cell. The memory cell has a configuration obtained by replacing the storage layers 22a and 24a and the reference layers 22c and 24c of the magnetoresistive elements 22 and 24 included in the memory cell 1 according to the eighth embodiment shown in FIG. 18 with layers with perpendicular magnetization that is parallel to the stacking direction of the magnetoresistive elements 22 and 24, and replacing the electrodes 12, 14, and 16 with electrodes 12a, 14a, and 16a including metal magnetic layers. The electrodes 12a, 14a, and 16a have a magnetization that is parallel to a direction along which the conductive layer 10 extends, for example a direction from left to right in the drawings.

With this configuration, a biased magnetic field is generated at the electrodes 12a, 14a, and 16a, which assists the switching of the magnetizations of the storage layers 22a and 24a, the magnetizations being in a direction perpendicular to the stacking direction of the magnetoresistive elements 22 and 24.

(First Modification)

Figure 34:
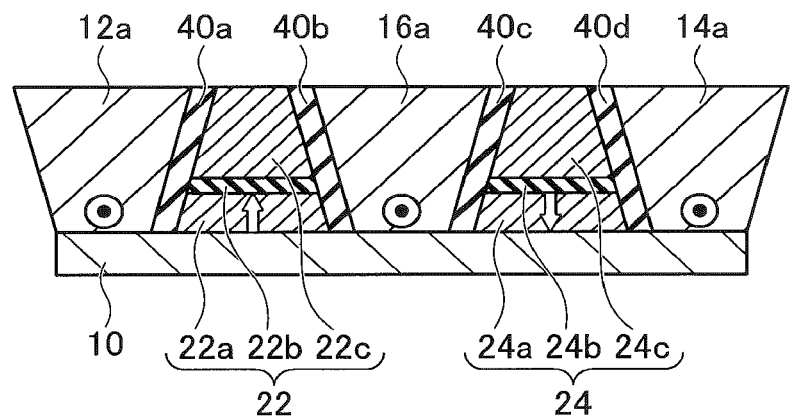
FIG. 34 is a cross-sectional view of a magnetic memory according to a first modification of the tenth embodiment.

The assisting magnetic field may be applied to the storage layers 22a and 24a not only in the direction along which the conductive layer 10 extends but also in a direction crossing the direction along which the conductive layer 10 extends, as in a first modification shown in FIG. 34.

(Second Modification)

Figure 35:
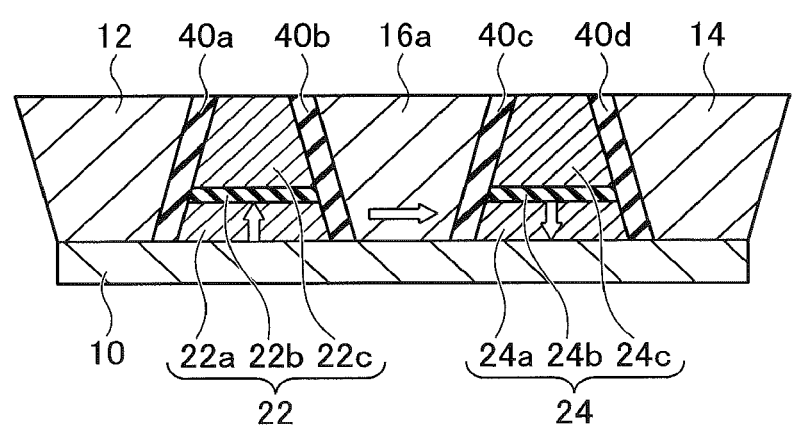
FIG. 35 is a cross-sectional view of a magnetic memory according to a second modification of the tenth embodiment.

The electrode 16a disposed in the center may be formed of a magnetic metal, and the electrodes 12 and 14 disposed on the right and left sides of the electrode 16a may be formed of a nonmagnetic metal, as in a second modification shown in FIG. 35.

(Third Modification)

Figure 36:
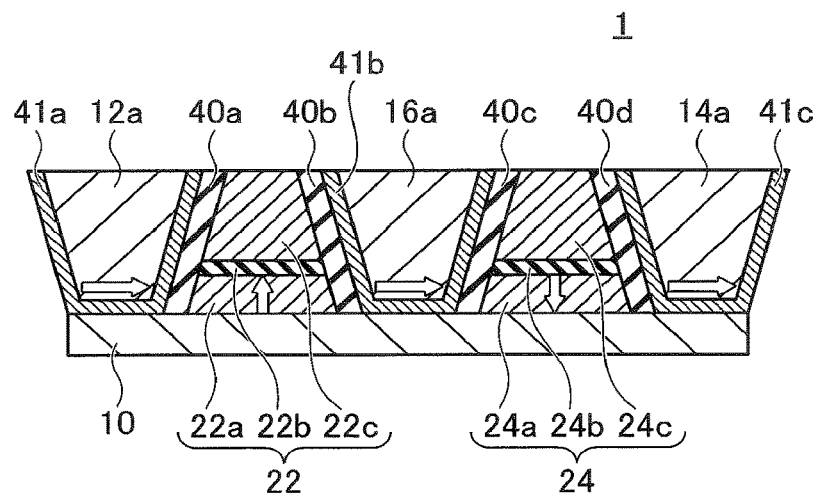
FIG. 36 is a cross-sectional view of a magnetic memory according to a third modification of the tenth embodiment.
Figure 37:
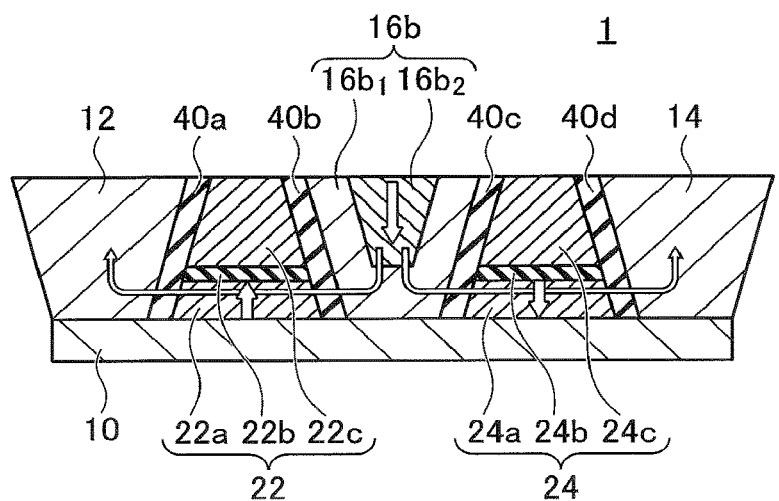
FIG. 37 is a cross-sectional view of a magnetic memory according to a fourth modification of the tenth embodiment.

The electrodes may be formed as in a third modification shown in FIG. 36. The third modification has a configuration obtained by disposing nonmagnetic metal layers 41a, 41b, and 41c on the outer surfaces of the electrodes 12, 14, and 16 in the first modification shown in FIG. 33. With this configuration, the electrodes 12a, 14a, and 16a may have a good hard magnetic property.

(Fourth Modification)

In the tenth embodiment and the first to third modifications of the tenth embodiment, the biased magnetic field, i.e., the magnetizations of the electrodes 12a, 14a, and 16a, is in an in-plane direction. However, the biased magnetic field may be in a perpendicular direction as in a fourth modification shown in FIG. 37. A memory cell 1 according to the fourth modification has a configuration obtained by replacing the electrode 16a of the memory cell 1 according to the second modification shown in FIG. 35 with an electrode 16b. The electrode 16b includes a nonmagnetic metal layer 16b1 and a metal magnetic layer 16b2. The nonmagnetic metal layer 16b1 has a bottom that is in contact with the conductive layer 10, and side surfaces that are in contact with the sidewall insulating layers 41b and 41c. The metal magnetic layer 16b2 is disposed in the nonmagnetic metal layer 16b1, and has a perpendicular magnetization. The metal magnetic layer 16b2 is located in the nonmagnetic metal layer 16b1 so as to be higher than the storage layers 22a and 24a of the magnetoresistive elements 22 and 24.

If the biased magnetic field acts as a perpendicular magnetization, the biased magnetic field may effectively switch the magnetization of the storage layer if it is disposed in the electrode 16b.

If the biased magnetic field acts as an in-plane magnetization, the biased magnetic field may effectively switch the magnetization of the storage layer if the magnetic metal layers are disposed on both sides of the magnetoresistive element 22 and the magnetoresistive element 24.

As described above, similarly to the eighth embodiment, energy consumption may be reduced and write and read operations may be performed at a high speed in the magnetic memory according to the tenth embodiment and the modifications of the tenth embodiment.

Eleventh Embodiment

Figure 38:
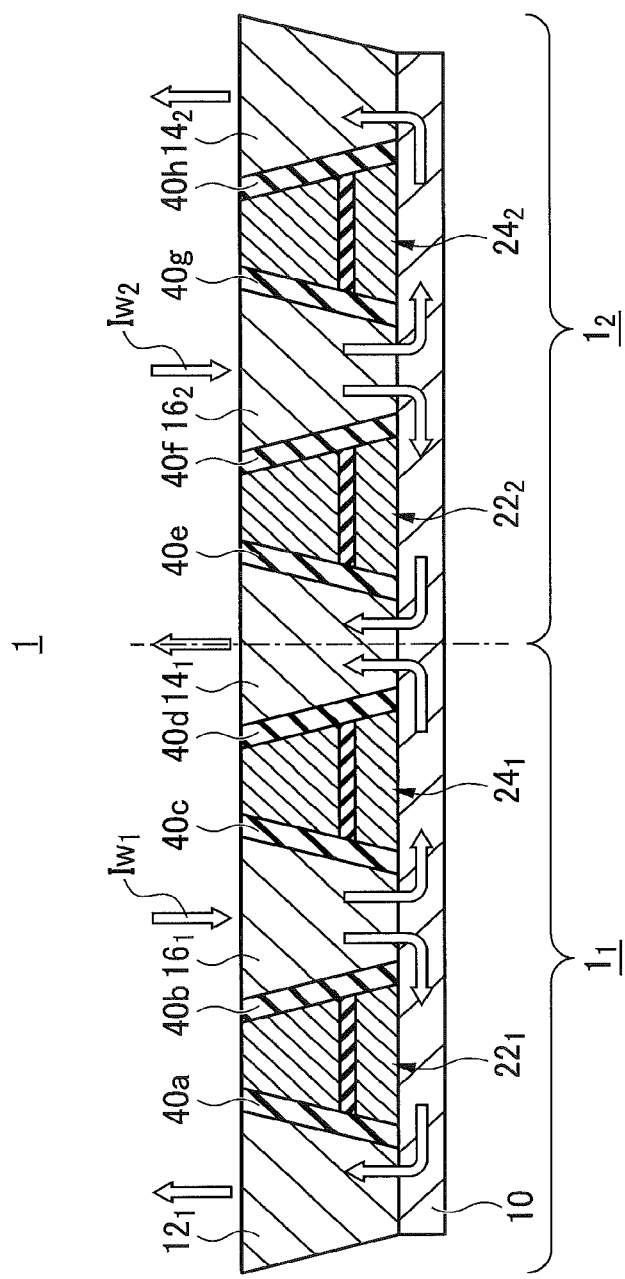
FIG. 38 is a cross-sectional view of a magnetic memory according to an eleventh embodiment.

A magnetic memory according to an eleventh embodiment will be described with reference to FIG. 38. The magnetic memory according to the eleventh embodiment includes at least two memory cells $1_1$ and $1_2$. FIG. 38 is a cross-sectional view of the memory cells $1_1$ and $1_2$. The memory cells $1_1$ and $1_2$ each have the same configuration as the memory cell 1 according to the eighth embodiment shown in FIG. 18, and disposed on the same conductive layer 10. The right side electrode of the memory cell $1_1$ is shared by the electrode of the memory cell $1_2$ and serves as the left side electrode of the memory cell $1_2$.

Thus, the memory cell $1_1$ includes electrodes $12_1$, $14_1$, and $16_1$ disposed on the conductive layer 10, and magnetoresistive elements $22_1$ and $24_1$ disposed on the conductive layer 10. The electrode $16_1$ is disposed in a region of the conductive layer 10 between the electrode $12_1$ and the electrode $14_1$. The magnetoresistive element $22_1$ is disposed in a region of the conductive layer 10 between the electrode $12_1$ and the electrode $16_1$, and the magnetoresistive element $24_1$ is disposed in a region of the conductive layer 10 between the electrode $16_1$ and the electrode $14_1$. A sidewall insulating layer 40a is disposed between the electrode $12_1$ and the magnetoresistive element $22_1$, and a sidewall insulating layer 40b is disposed between the magnetoresistive element $22_1$ and the electrode $16_1$. A sidewall insulating layer 40c is disposed between the electrode $16_1$ and the magnetoresistive element $24_1$, and a sidewall insulating layer 40d is disposed between the magnetoresistive element $24_1$ and the electrode $14_1$.

The memory cell $1_2$ includes electrodes $14_2$ and $16_2$ disposed on the conductive layer 10, and magnetoresistive elements $22_2$ and $24_2$ disposed on the conductive layer 10. The electrode $16_2$ is disposed in a region of the conductive layer 10 between the electrode $14_1$ and the electrode $14_2$. The magnetoresistive element $22_2$ is disposed in a region of the conductive layer 10 between the electrode $14_1$ and the electrode $16_2$, and the magnetoresistive element $24_2$ is disposed in a region of the conductive layer 10 between the electrode $16_2$ and the electrode $14_2$. A sidewall insulating layer 40e is disposed between the electrode $14_1$ and the magnetoresistive element $22_2$, and a sidewall insulating layer 40f is disposed between the magnetoresistive element $22_2$ and the electrode $16_2$. A sidewall insulating layer 40g is disposed between the electrode $16_2$ and the magnetoresistive element $24_2$, and a sidewall insulating layer 40h is disposed between the magnetoresistive element $24_2$ and the electrode $14_2$.

Thus, the memory cell $1_1$ and the memory cell $1_2$ are disposed on the same conductive layer 10, and share the electrode $14_1$.

In the magnetic memory according to the eleventh embodiment, information is recorded in the magnetoresistive element $22_1$ and the magnetoresistive element $24_1$ by causing a write current Iw1 to flow from the electrode $16_1$ to electrode $12_1$ and from the electrode $16_1$ to the electrode $14_1$ via the conductive layer 10. On the other hand, information is recorded in the magnetoresistive element $22_2$ and the magnetoresistive element $24_2$ by causing a write current Iw2 to flow from the electrode $16_2$ to the electrode $14_1$ and from the electrode $16_2$ to the electrode $14_2$ via the conductive layer 10. The above configuration enables the four magnetoresistive elements $22_1$, $24_1$, $22_2$, and $24_2$ to be disposed among the five electrodes $12_1$, $16_1$, $14_1$, $16_2$, and $14_2$. This leads to a reduction in length by one electrode as compared to the magnetic memory including four independent magnetoresistive elements that are simply arranged.

Similarly to the eighth embodiment, energy consumption may be reduced and write and read operations may be performed at a high speed in the magnetic memory according to the eleventh embodiment.

Twelfth Embodiment

A method of manufacturing a magnetic memory according to a twelfth embodiment will be described with reference to FIGS. 39 to 45. FIGS. 39 to 45 are cross-sectional views illustrating the method of manufacturing the magnetic memory according to the twelfth embodiment. The method according to this embodiment is for manufacturing the magnetic memory shown in FIG. 1, in which the terminal 16 is disposed on the lower surface of the conductive layer 10, and the terminals 12 and 14 and the magnetoresistive elements 22 and 24 are disposed on the top surface of the conductive layer 10.

Figure 39:
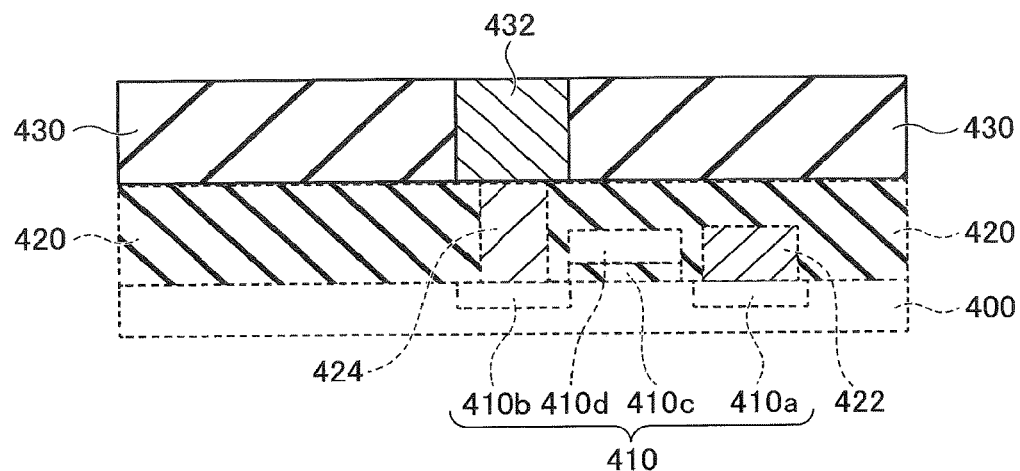
FIGS. 39 to 44 are cross-sectional views showing a method of manufacturing a magnetic memory according to a twelfth embodiment.

First, a transistor 410 is formed on a semiconductor layer 400 as shown in FIG. 39. The transistor 410 has a source 410a, and a drain 410b that are separately disposed on the semiconductor layer 400, and a gate 410d disposed above a region (channel) 410c of the semiconductor layer 400 between the source 410a and the drain 410b. An insulating film 420 is disposed on the transistor 410. A terminal 424 connecting to the drain 410b is formed through the insulating film 420. A terminal 422 connecting to the source 410a is formed on the source 410a in the insulating film 420.

An insulating film 430 is disposed on the insulating film 420, through which a terminal 432 connecting to the terminal 424 is formed. The terminal 432 may be formed of the same material as the terminal 424. If, however, a magnetic layer 19b is formed in the terminal 432 for generating a biased magnetic field as shown in FIGS. 15A to 15C, a different material, which is a hard magnetic material, is used.

Figure 40:
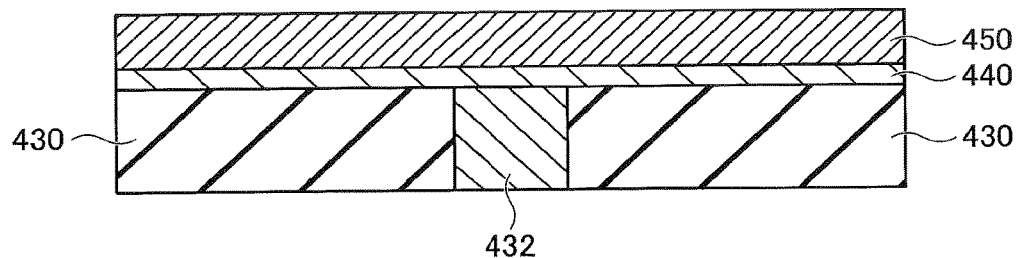

Subsequently, as shown in FIG. 40, a conductive layer 440 is formed to cover the insulating film 430 and the terminal 432, and a magnetoresistive film 450 is disposed on the conductive layer 440. The magnetoresistive film 450 is a multilayer film including a magnetic layer to become a storage layer disposed on the conductive layer 440, a nonmagnetic layer to become a tunnel barrier disposed on the magnetic layer, and a magnetic layer to become a reference layer disposed on the nonmagnetic layer. For simplification of explanation, the insulating film 420 and the terminal 424 and the layers that are disposed in and under the insulating film 420 and the terminal 424 are omitted in FIG. 40 and FIGS. 41 to 45, which will be described later.

Figure 41:
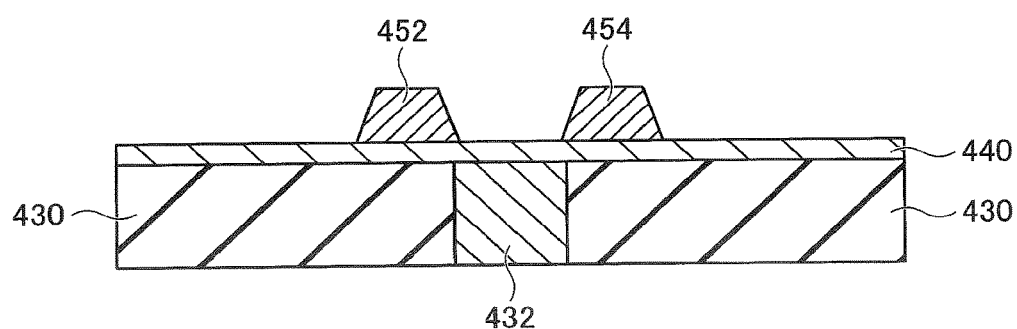

Thereafter, as shown in FIG. 41, the magnetoresistive film 450 is patterned to form magnetoresistive elements 452 and 454.

Figure 42:
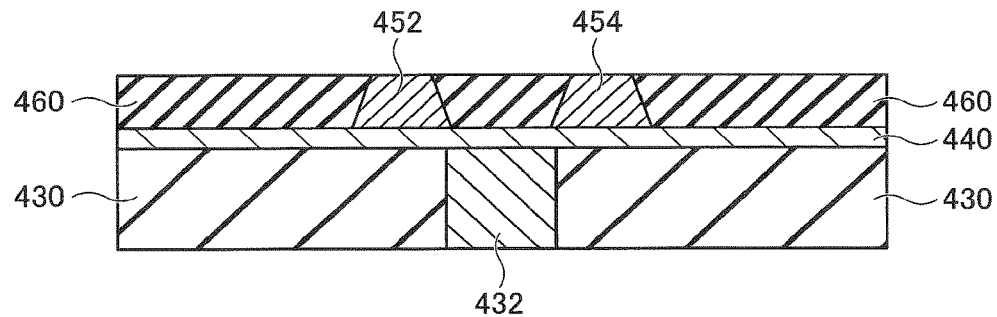
Figure 43:
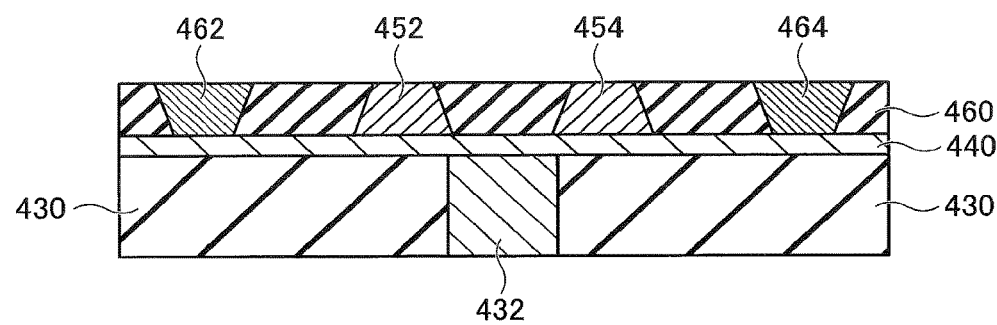

An insulating film 460 is then deposited to cover the magnetoresistive elements 452 and 454 as shown in FIG. 42. Lead electrodes 462 and 464 are formed through the insulating film 460 by forming two openings reaching the conductive layer 440 in the insulating film 460 by a lithographic technique, and filling the openings with a metal material. The magnetoresistive elements 452 and 454 are disposed between the lead electrode 462 and the lead electrode 464 (FIG. 43).

Figure 44:
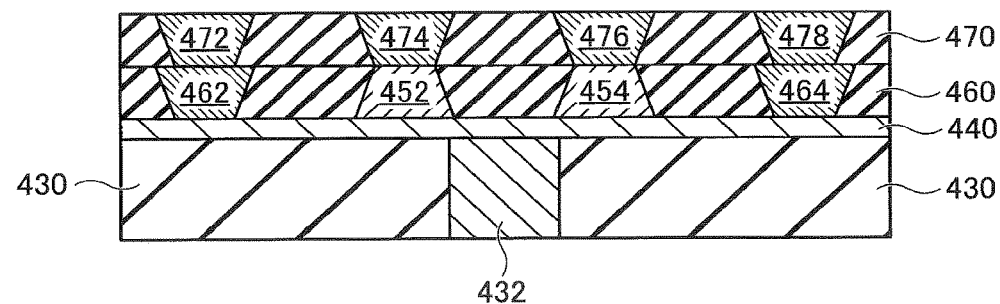
Figure 45:
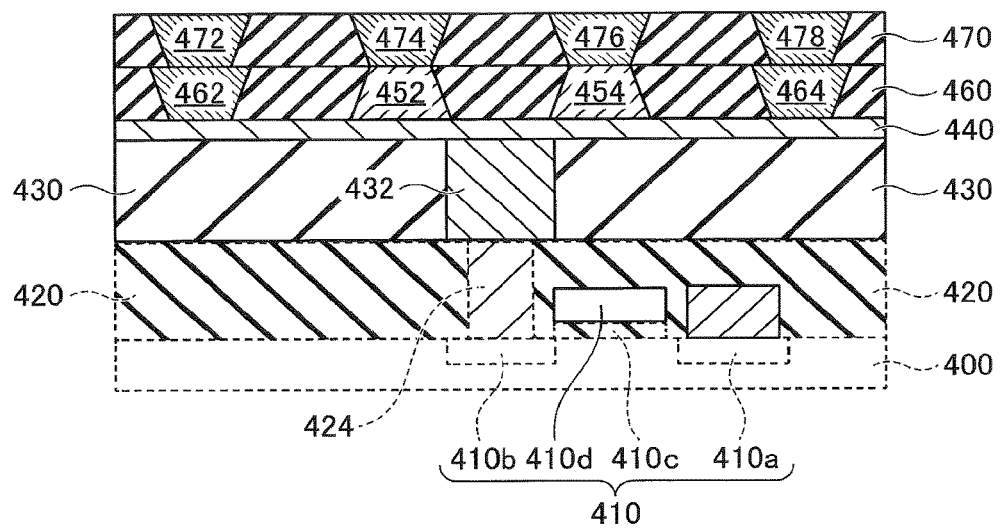
FIG. 45 is a cross-sectional view showing a magnetic memory manufactured by the method according to the twelfth embodiment.

Thereafter an insulating film 470 is formed to cover the lead electrodes 462 and 464 and the magnetoresistive elements 452 and 454 as shown in FIG. 44. Four openings are formed through the insulating film 470 by a lithographic technique, the openings reaching the lead electrode 462, the magnetoresistive element 452, the magnetoresistive element 454, and the lead electrode 464. The openings are filled with a metal material to form terminals 472, 474, 476, and 478 connecting to the lead electrode 462, the magnetoresistive element 452, the magnetoresistive element 454, and the lead electrode 464. As a result, the magnetic memory according to the first embodiment shown in FIG. 1 is completed, as shown in FIG. 45.

Similarly to the first embodiment, energy consumption may be reduced and write and read operations may be performed at a high speed by the magnetic memory manufactured according to the twelfth embodiment.

Thirteenth Embodiment

Figure 46:
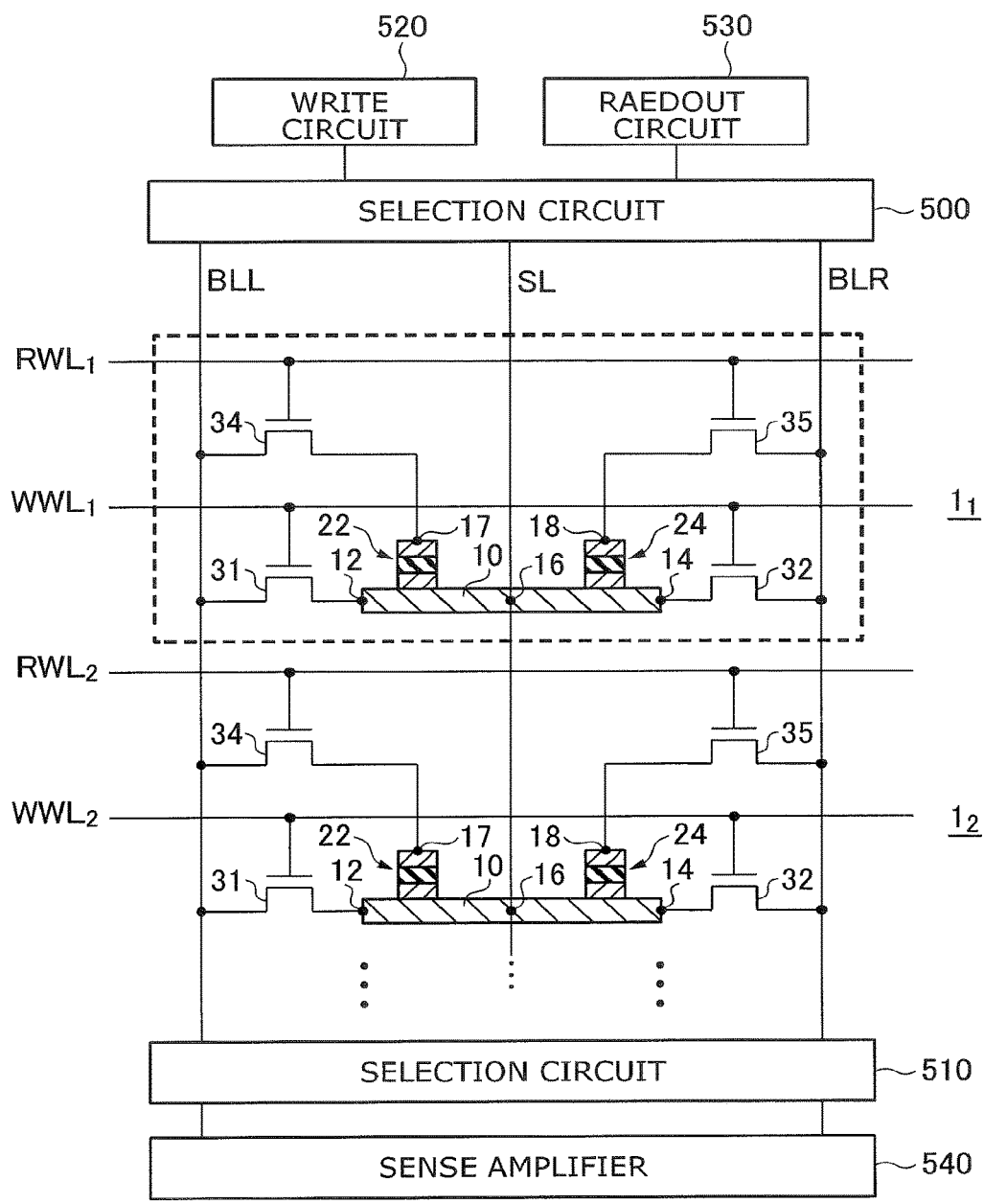
FIG. 46 is a circuit diagram of a magnetic memory according to a thirteenth embodiment.

FIG. 46 is a circuit diagram illustrating a magnetic memory according to a thirteenth embodiment. The magnetic memory according to the thirteenth embodiment includes a plurality of memory cells $1_1$, $1_2$, ..., selection circuits 500 and 510, a write circuit 520, a readout circuit 530, and a sense amplifier 540. The memory cells $1_1$, $1_2$, ... are arranged in one direction (vertical direction) in FIG. 46, but may be arranged in a horizontal direction or in a matrix form as will be described as a modification later.

Each of the memory cells $1_1$ and $1_2$ includes a conductive layer 10, terminals 12 and 14 separately disposed on the conductive layer 10, a terminal 16 disposed in a region of the conductive layer 10 between the terminal 12 and the terminal 14, a magnetoresistive element 22 disposed in a region of the conductive layer 10 between the terminal 12 and the terminal 16, and a magnetoresistive element 24 disposed in a region of the conductive layer 10 between the terminal 16 and the terminal 14.

Each of the magnetoresistive elements 22 and 24 includes a storage layer (not shown) disposed on the conductive layer 10, a nonmagnetic layer (not shown) disused on the storage layer, and a reference layer (not shown) disposed on the nonmagnetic layer. The reference layer of the magnetoresistive element 22 is electrically connected to a terminal 17, and the reference layer of the magnetoresistive element 24 is electrically connected to a terminal 18.

One (terminal) of a source and a drain of a transistor 31 is connected to the terminal 12, and the other (terminal) is connected to a first bit line BLL. One (terminal) of a source and a drain of a transistor 32 is connected the terminal 14, and the other (terminal) is connected to a second bit line BLR. One (terminal) of a source and a drain of a transistor 34 is connected to the terminal 17, and the other (terminal) is connected to the first bit line BLL. One (terminal) of a source and a drain of a transistor 35 is connected to the terminal 18, and the other (terminal) is connected to the second bit line BLR.

A gate (control terminal) of each of the transistors 31 and 32 is connected to a write word line $WWL_i$, a gate (control terminal) of each of the transistors 34 and 35 is connected to a read word line $RWL_i$, and the terminal 16 is connected to a source line SL in each memory cell $1_i$ (i=1, 2, ...).

The write word lines $WWL_i$ (i=1, 2, ...) and the read word lines $RWL_i$ (i=1, 2, ...) are connected to a word line selection circuit that is not shown.

The first bit line BLL, the second bit line BLR, and the source line SL are connected to the selection circuits 500 and 510. They are connected to the write circuit 520 via the selection circuit 500 in a write operation, and are connected to the readout circuit 540 via the selection circuit 500 and to the sense amplifier 540 via the selection circuit 510 in a read operation. Although the selection circuits 500 and 510, the write circuit 520, the readout circuit 530, and the sense amplifier 540 are disposed on an upper portion or a lower portion in FIG. 46, they may be disposed together on one side or disposed separately on both sides in a physical layout on a chip.

Figure 47:
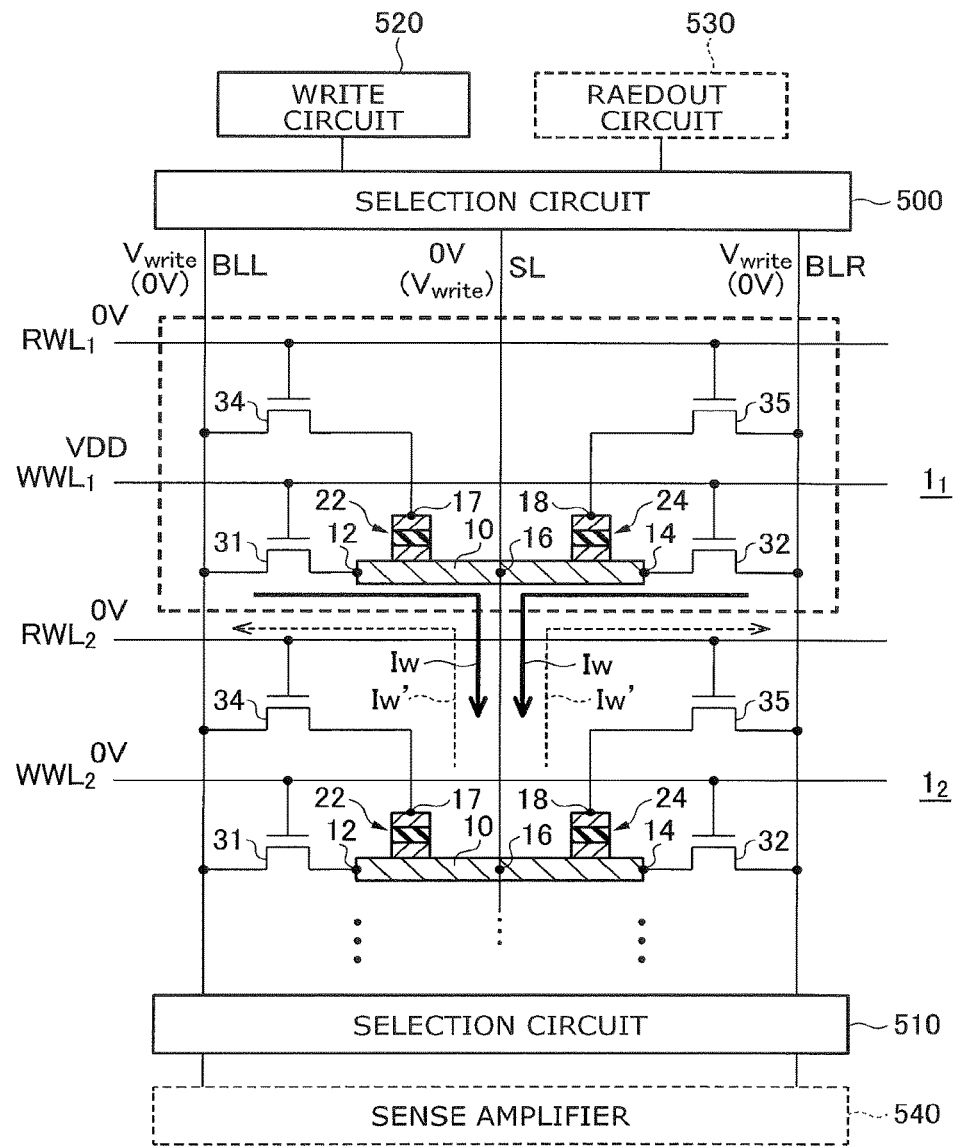
FIG. 47 is a circuit diagram showing a write operation in the magnetic memory according to the thirteenth embodiment.
Figure 48:
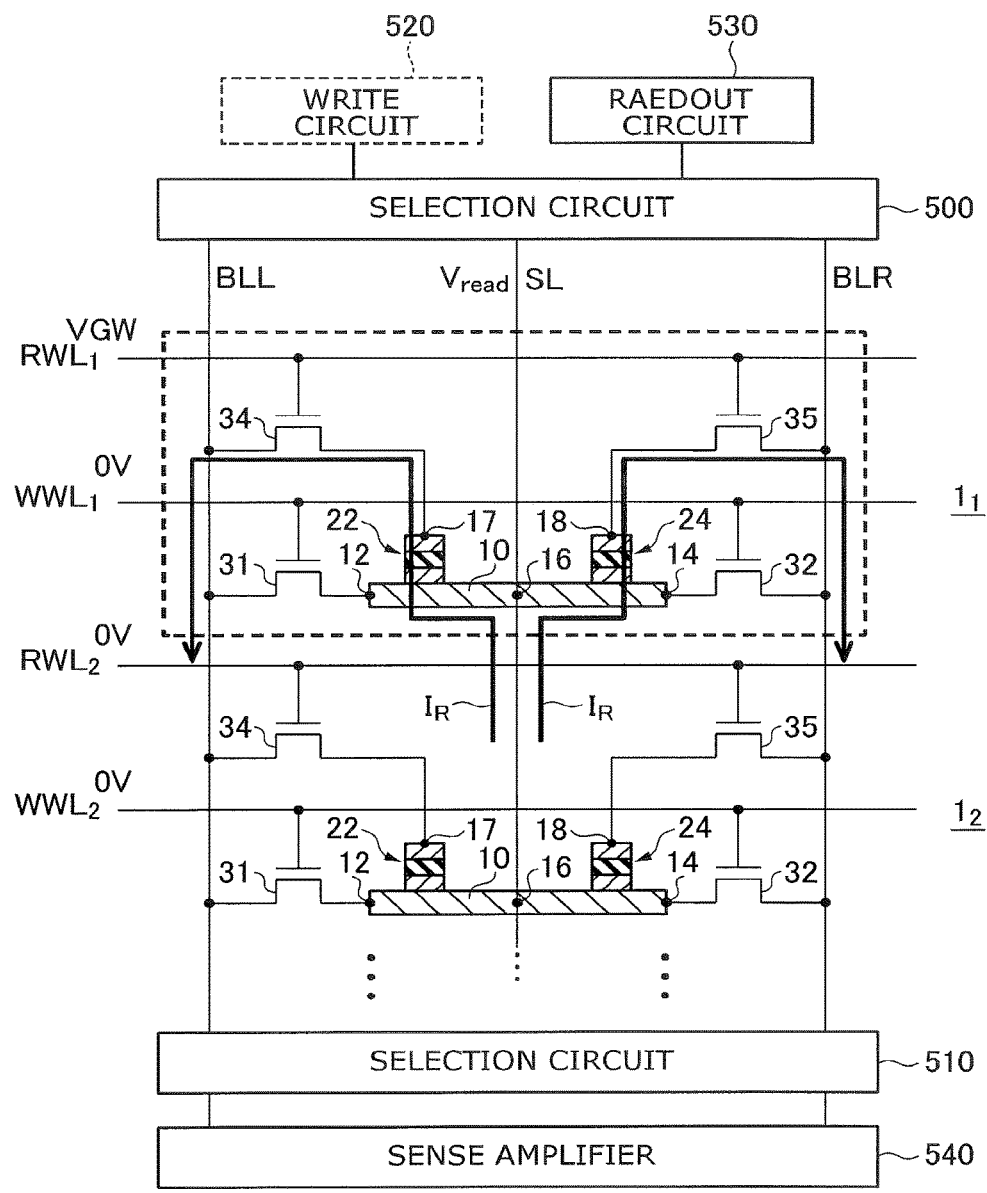
FIG. 48 is a circuit diagram showing a read operation in the magnetic memory according to the thirteenth embodiment.

Operations of the magnetic memory according to the thirteenth embodiment will then be described with reference to FIGS. 47 and 48.
(Write Operation)
FIG. 47 shows a write operation of the magnetic memory according to the thirteenth embodiment. In the magnetic memory according to the thirteenth embodiment, no assist voltage is applied to the terminals 17 and 18 of the magnetoresistive elements 22 and 24 in a write operation. FIG. 47 shows voltages that are applied when a write operation is performed on a memory cell $1_1$. In this case, data "0" is written to one of the magnetoresistive element 22 and the magnetoresistive element 24, and data "1" is written to the other in the memory cell $1_1$.

The selection circuit 500 connects the first bit line BLL, the second bit line BLR, and the source line SL to the write circuit 520 to write data. Subsequently, the selection circuit 500 applies a write selection potential VDD (VGW) to the write word line $WWL_1$, and a potential 0 V to the write word line $WWL_2$ and the read word lines $RWL_1$ and $RWL_2$. As a result, the transistors 31 and 32 are turned on and the transistors 34 and 35 are turned off in the memory cell $1_1$. In the other memory cell $1_2$, the transistors 31, 32, 34, and 35 are turned off.

In this state, electric currents are caused to flow symmetrically in the opposite directions through the conductive layer 10 of the selected memory cell $1_1$ in order to write data "0" to the magnetoresistive element 22 and data "1" to the magnetoresistive element 24 of the selected memory cell $1_1$. For example, a write voltage $V_{write}$ is applied to the first bit line BLL and the second bit line BLR, and a voltage 0 V is applied to the source line SL. As a result, the write current Iw for writing data to the magnetoresistive element 22 flows from the first bit line BLL to the source line SL via the transistor 31, the terminal 12, the conductive layer 10, and the terminal 16. On the other hand, the write current Iw for writing data to the magnetoresistive element 24 flows from the second bit line BLR to the source SL via the transistor 32, the terminal 14, the conductive layer 10, and the terminal 16. Thus, the write currents Iw flow along solid line arrows in FIG. 47.

If data are written in an opposite manner, for example, if data "1" is written to the magnetoresistive element 22 and data "0" is written to the magnetoresistive element 24 in the selected memory cell $1_1$, 0 V is applied to the first bit line BLL and the second bit line BLR and the write voltage $V_{write}$ is applied to the source line SL to have write currents with opposite polarities. As a result, a write current Iw' to write data to the magnetoresistive element 22 flows from the source line SL to the first bit line BLL via the terminal 16, the conductive layer 10, the terminal 12, and the transistor 31. On the other hand, a write current Iw' to write data to the magnetoresistive element 24 flows from the source line SL to the second bit line BLR via the terminal 16, the conductive layer 10, the terminal 14, and the transistor 32. Thus, the write currents Iw' flow along broken line arrows in FIG. 47.
(Read Operation)
FIG. 48 illustrates a read operation of the magnetic memory according to the thirteenth embodiment. FIG. 48 shows voltages that are applied when a read operation is performed on the memory cell $1_1$. In the thirteenth embodiment, the sense amplifier 540 reads a differential signal.

In order to read data, the selection circuits 500 and 510 connect the first bit line BLL, the second bit line BLR, and the source line SL to the readout circuit 530 and the sense amplifier 540. Thus, the sense amplifier 540 is connected to the first bit line BLL and the second bit line BLR via the selection circuit 510.

The first bit line BLL and the second bit line BLR are discharged and equalized in advance.

Subsequently, a read selection potential VGR is applied to the read word line $RWL_1$, and a potential 0 V is applied to the read word line $RWL_2$ and the write word lines $WWL_1$ and $WWL_2$. The read selection potential VGR may be equal to the write selection potential VGW. As a result, the transistors 34 and 35 are turned on and the transistors 31 and 32 are turned off in the memory cell 1₁. In the memory cell 1₂, the transistors 31, 32, 34, and 35 are turned off. This means that the selected memory cell 1₁ is turned on, and when the read voltage Vread is applied to the source line SL in this state, the charging rate differs between the first bit line BLL and the second bit line BLR due to the difference in resistance value between the magnetoresistive elements 22 and 24. As a result, a potential difference is caused between the first bit line BLL and the second bit line BLR. Then, the sense amplifier 540 determines whether the data stored in the selected memory cell 1₁ is "0" or "1." Although the read operation is performed based on a potential difference in this embodiment, a current difference may also be used.

(Modification)

Figure 49:
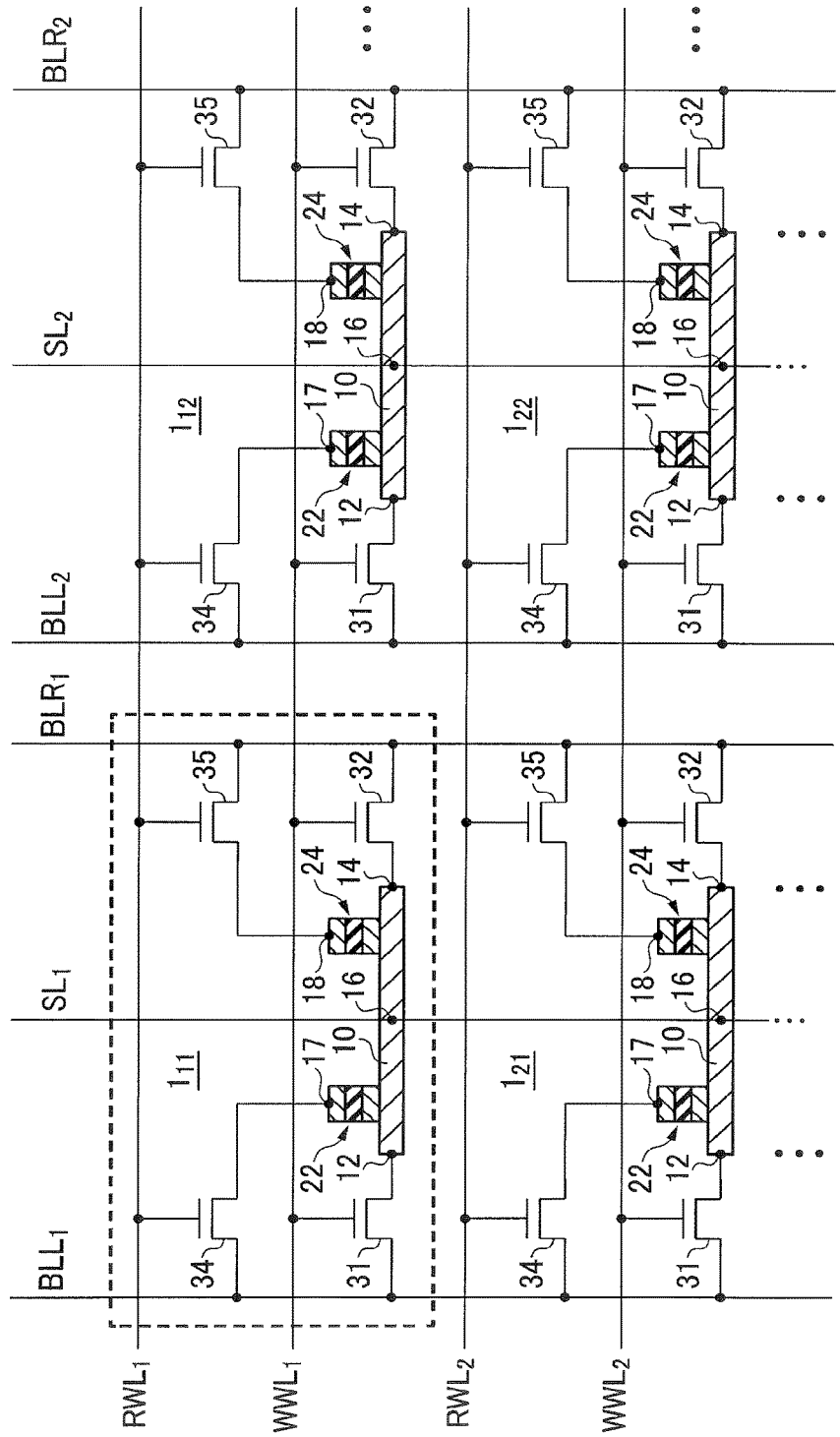
FIG. 49 is a circuit diagram of a magnetic memory according to a modification of the thirteenth embodiment.

FIG. 49 illustrates a magnetic memory according to a modification of the thirteenth embodiment. The magnetic memory according to the modification includes a plurality of memory cells that are arranged in a matrix form. Each memory cell $1_{ij}$ (i, j=1, 2, . . . ) has the same configuration as the memory cell shown in FIG. 46.

In each memory cell $1_{ij}$ (i, j=1, 2, . . . ), one of the source and the drain of the transistor 31 is electrically connected to the terminal 12, the other is electrically connected to the first bit line $BLL_j$, and the gate is connected to the write word line $WWL_i$. One of the source and the drain of the transistor 32 is electrically connected to the terminal 14, the other is electrically connected to the second bit line $BLR_j$, and the gate is connected to the write word line $WWL_i$. One of the source and the drain of the transistor 34 is electrically connected to the terminal 17, the other is electrically connected to the first bit line $BLL_j$, and the gate is connected to the read word line $RWL_i$. One of the source and the drain of the transistor 35 is electrically connected to the terminal 18, the other is connected to the second bit line $BLR_j$, and the gate is connected to the read word line $RWL_i$.

Data can be written and read in the same manner as in the thirteenth embodiment in the modification having the above configuration.

Data of one bit is stored in each memory cell of the thirteenth embodiment and the modification of the thirteenth embodiment.

Energy consumption may be reduced and write and read operations may be performed at a high speed in the magnetic memory according to the thirteenth embodiment and the modification of the thirteenth embodiment.

Fourteenth Embodiment

Figure 50:
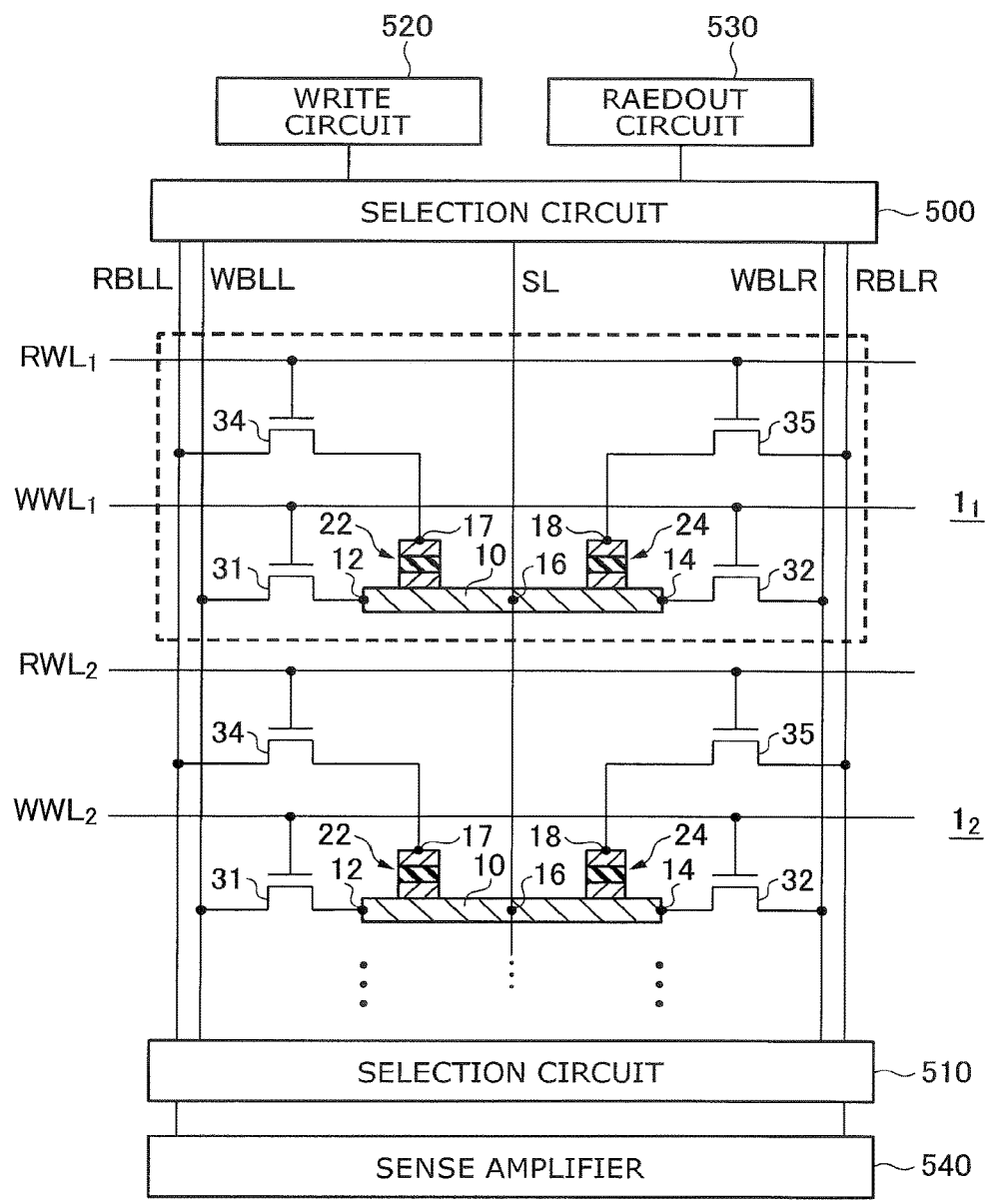
FIG. 50 is a circuit diagram of a magnetic memory according to a fourteenth embodiment.

FIG. 50 illustrates a magnetic memory according to a fourteenth embodiment. The magnetic memory according to the fourteenth embodiment differs from the magnetic memory according to the thirteenth embodiment shown in FIG. 46 in that the first bit line BLL and the second bit line BLR are replaced with a first write bit line WBLL, a second write bit line WBLR, a first read bit line RBLL, and a second read bit line RBLR, and thus the connections of the transistors 31, 32, 34, and 35 are changed.

In each of the memory cells 1₁ and 1₂, one of the source and the drain of the transistor 31 is electrically connected to the terminal 12, and the other is electrically connected to the first write bit line WBLL. One of the source and the drain of the transistor 32 is connected to the terminal 14, and the other is electrically connected to the second write bit line WBLR. One of the source and the drain of the transistor 34 is electrically connected to the terminal 17, and the other is electrically connected to the first read bit line RBLL. One of the source and the drain of the transistor 35 is electrically connected to the terminal 18, and the other is electrically connected to the second read bit line RBLR.

The gates of the transistors 31 and 32 in each memory cell $1_i$ (i=1, 2, . . . ) are electrically connected to the write word line $WWL_i$, and the gates of the transistors 34 and 35 are electrically connected to the read word line $RWL_i$ as in the thirteenth embodiment.

In the magnetic memory according to the fourteenth embodiment, an assist voltage is applied to the terminals 17 and 18 of the magnetoresistive elements 22 and 24 in a write operation. In the write operation, not only the transistors 31 and 32 but also the transistors 34 and 35 of the selected memory cell are turned on, and the assist voltage is applied through the first read bit line RBLL and the second read bit line RBLR. Other processes in the write operation are the same as those in the thirteenth embodiment.

In a read operation, the transistors 31 and 32 are turned off, the transistors 34 and 35 in the selected memory cell are turned on, and the same processes as those in the thirteenth embodiment are performed.

In the fourteenth embodiment, the assist voltages are applied, in the write operation, to the terminals 17 and 18 that are electrically connected to the reference layers of the magnetoresistive elements. This enables the magnetization switching of the storage layers of the magnetoresistive elements to be performed more easily.

Similarly to the thirteenth embodiment, energy consumption may be reduced and write and read operations may be performed at a high speed in the magnetic memory according to the fourteenth embodiment.

Fifteenth Embodiment

Figure 51:
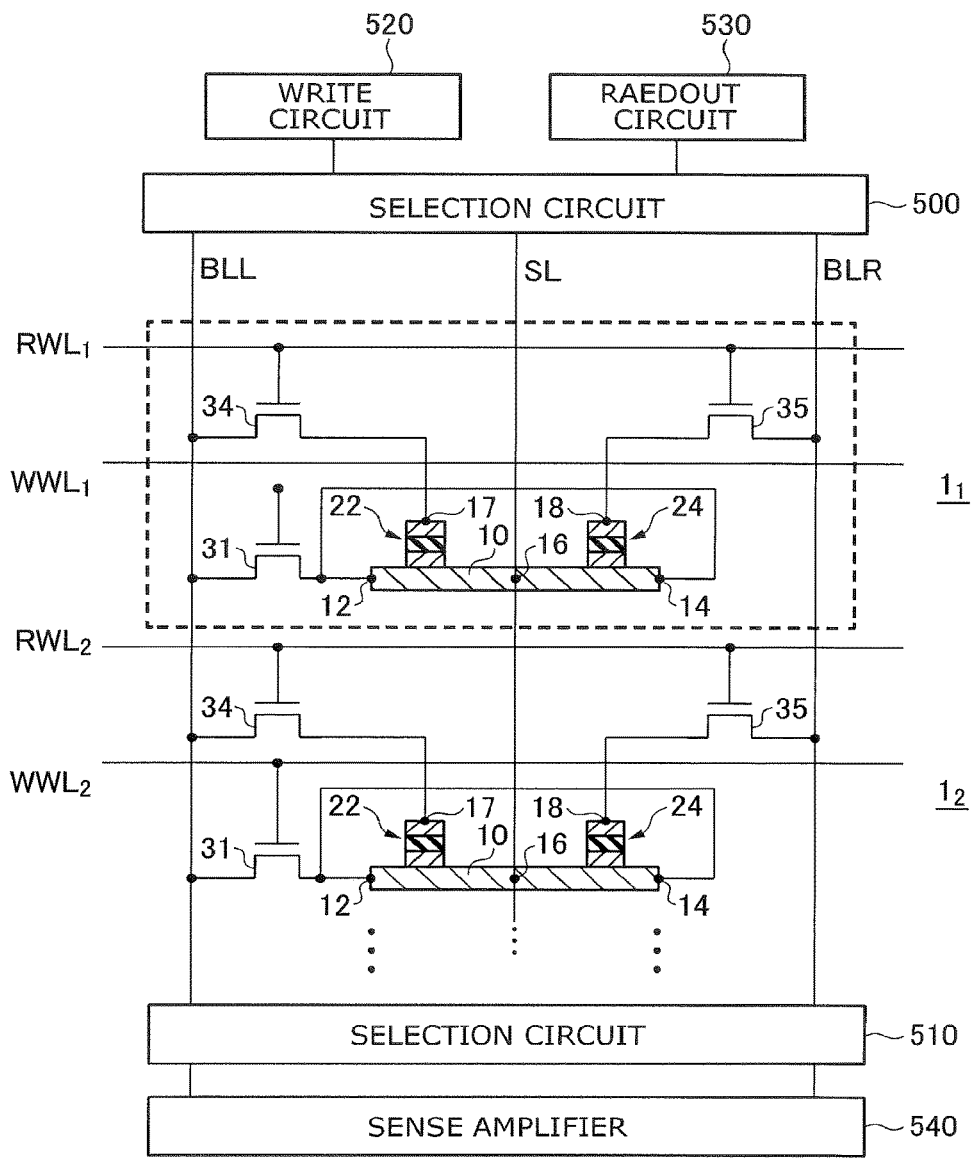
FIG. 51 is a circuit diagram of a magnetic memory according to a fifteenth embodiment.

FIG. 51 illustrates a magnetic memory according to a fifteenth embodiment. The magnetic memory according to the fifteenth embodiment has a configuration obtained by removing the transistor 32 and electrically connecting the terminal 14 to one of the source and the drain of the transistor 31 that is electrically connected to the terminal 12 in the magnetic memory according to the thirteenth embodiment shown in FIG. 46.

A write operation is performed by causing a write current to flow between the first bit line BLL and the source line SL via the transistor 31 and the terminals 12, 14, and 16. A read operation is performed in the same manner as the read operation for the magnetic memory according to the thirteenth embodiment.

In the magnetic memory according to the fifteenth embodiment, a memory cell includes two magnetoresistive elements 22 and 24 and three transistors 31, 34, and 35, and data of one bit is stored in one memory cell.

Similarly to the thirteenth embodiment, energy consumption may be reduced and write and read operations may be performed at a high speed in the magnetic memory according to the fifteenth embodiment.

Sixteenth Embodiment

Figure 52:
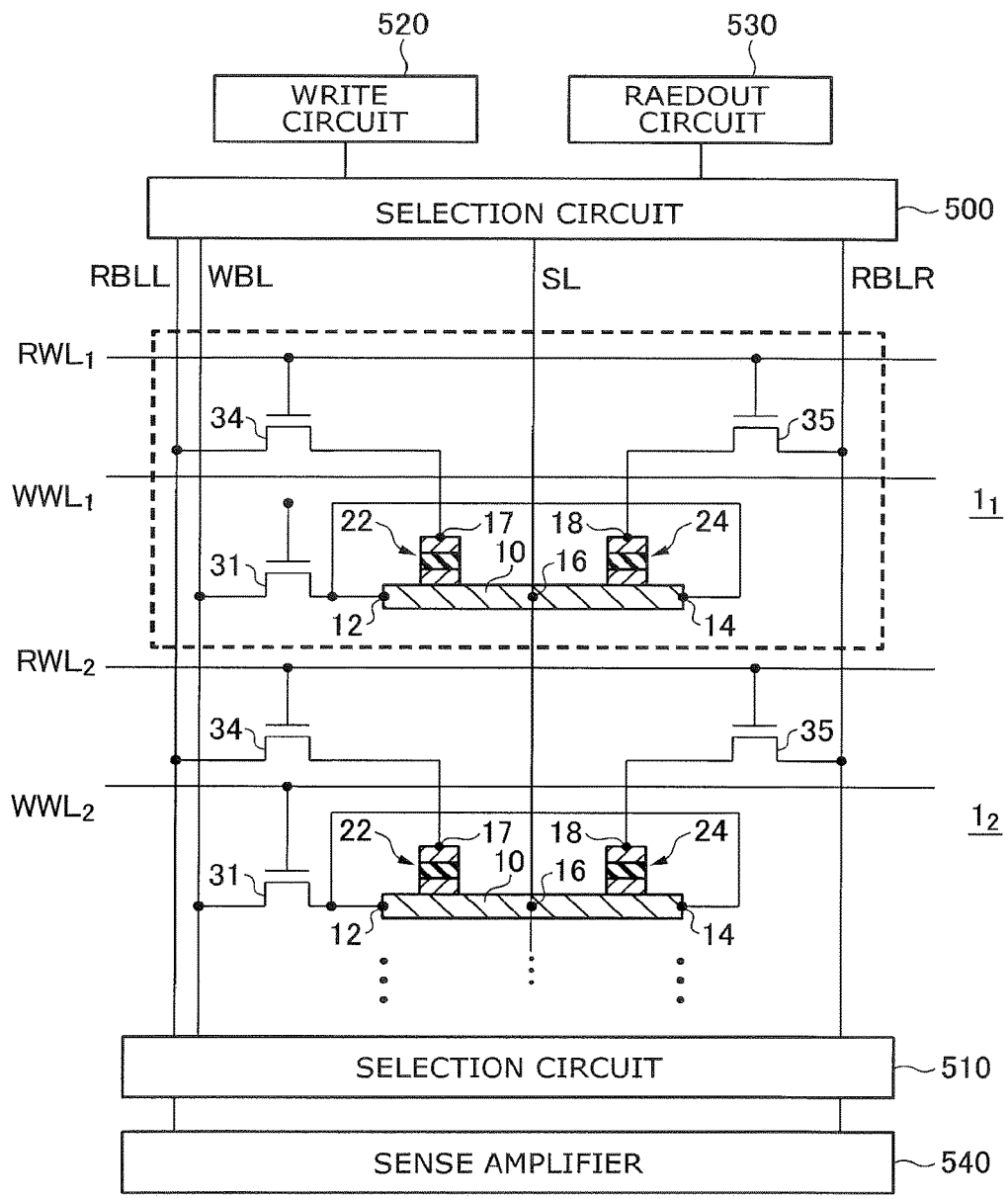
FIG. 52 is a circuit diagram of a magnetic memory according to a sixteenth embodiment.

FIG. 52 illustrates a magnetic memory according to a sixteenth embodiment. The magnetic memory according to the sixteenth embodiment has a configuration obtained by replacing the first bit line BLL with a write bit line WBL and a first read bit line RBLL and replacing the second bit line BLR with a second read bit line RBLR in the magnetic memory according to the fifteenth embodiment shown in FIG. 51.

In each memory cell $1_i$ (i=1, 2, . . . ), one of the source and the drain of the transistor 31 is connected to the terminal 12, the other is electrically connected to the write bit line WBL, and the gate is electrically connected to the write word line $WWL_i$. One of the source and the drain of the transistor 34 is electrically connected to the terminal 17, the other is electrically connected to the first read bit line RBLL, and the gate is electrically connected to the read word line $RWL_i$. One of the source and the drain of the transistor 35 is electrically connected to the terminal 18, the other is electrically connected to the second read bit line RBLR, and the gate is electrically connected to the read word line $RWL_i$.

A write operation is performed by causing a write current to flow between the write bit line WBL and the source line SL via the transistor 31 and the terminals 12, 14, 16, as in the magnetic memory according to the fourteenth embodiment shown in FIG. 51. A read operation is performed in the same manner as the read operation for the magnetic memory according to the thirteenth embodiment.

Similarly to the fifteenth embodiment, energy consumption may be reduced and write and read operations may be performed at a high speed in the magnetic memory according to the sixteenth embodiment.

Seventeenth Embodiment

Figure 53:
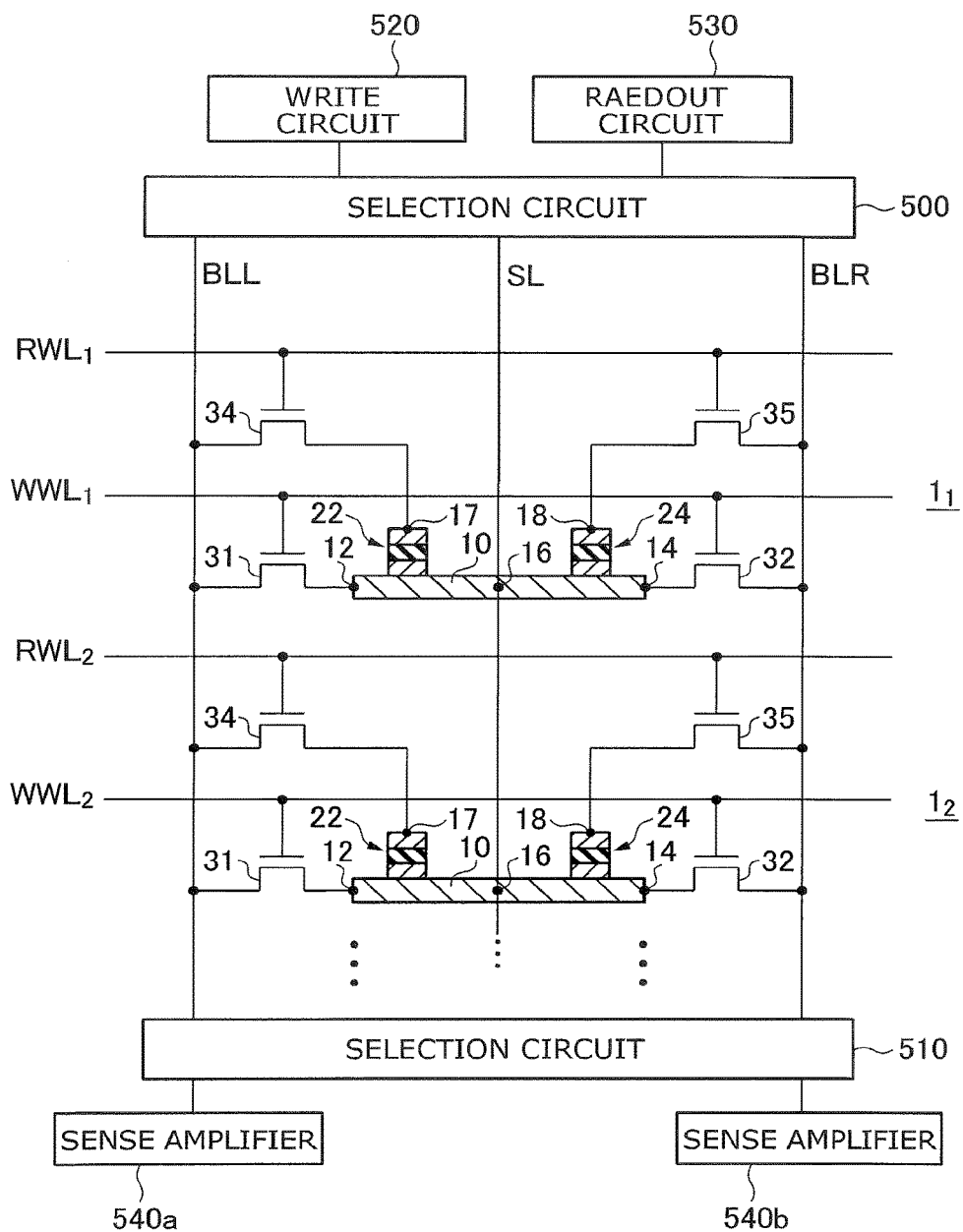
FIG. 53 is a circuit diagram of a magnetic memory according to a seventeenth embodiment.
Figure 54:
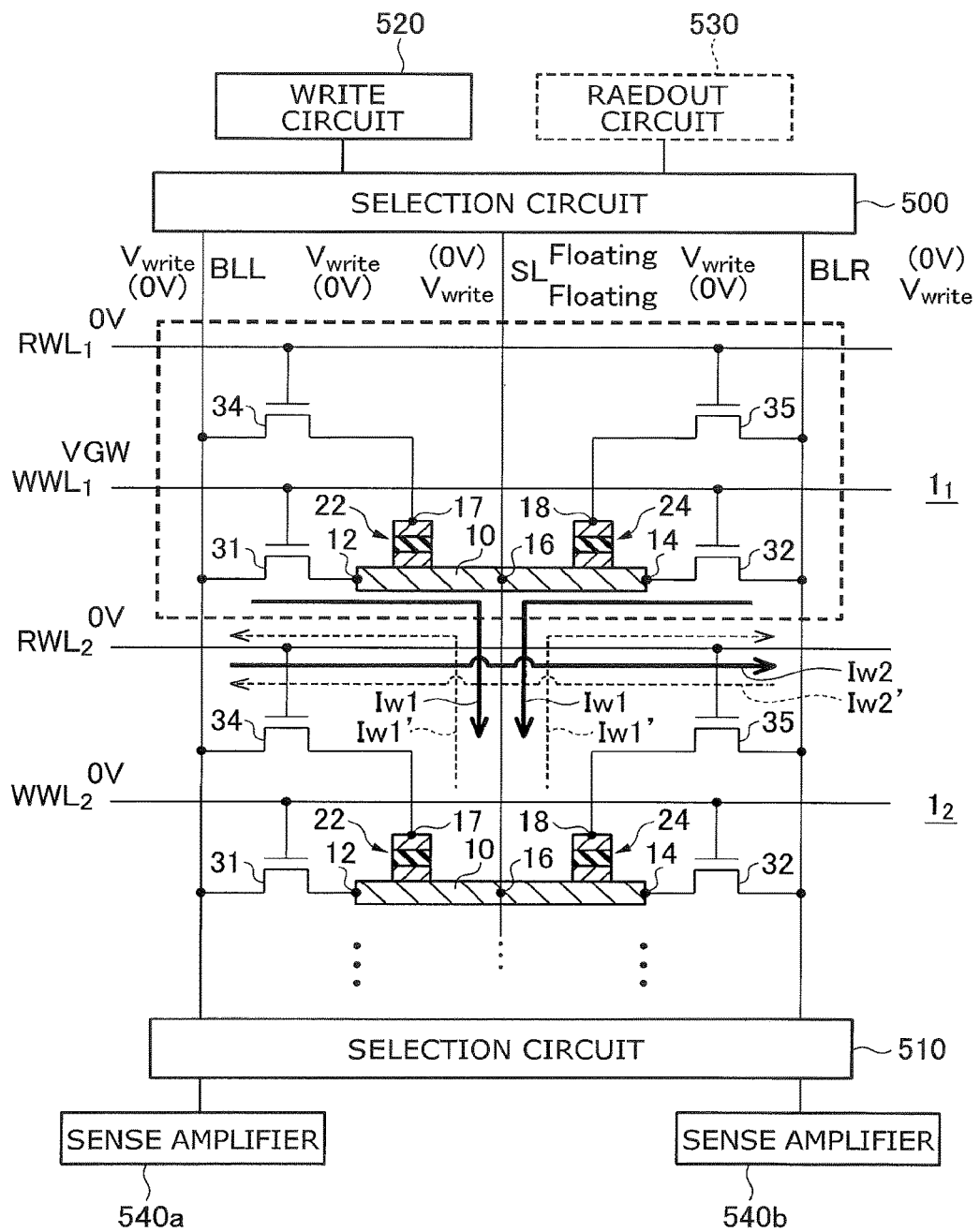
FIG. 54 is a circuit diagram for explaining a write operation in the magnetic memory according to the seventeenth embodiment.
Figure 55:
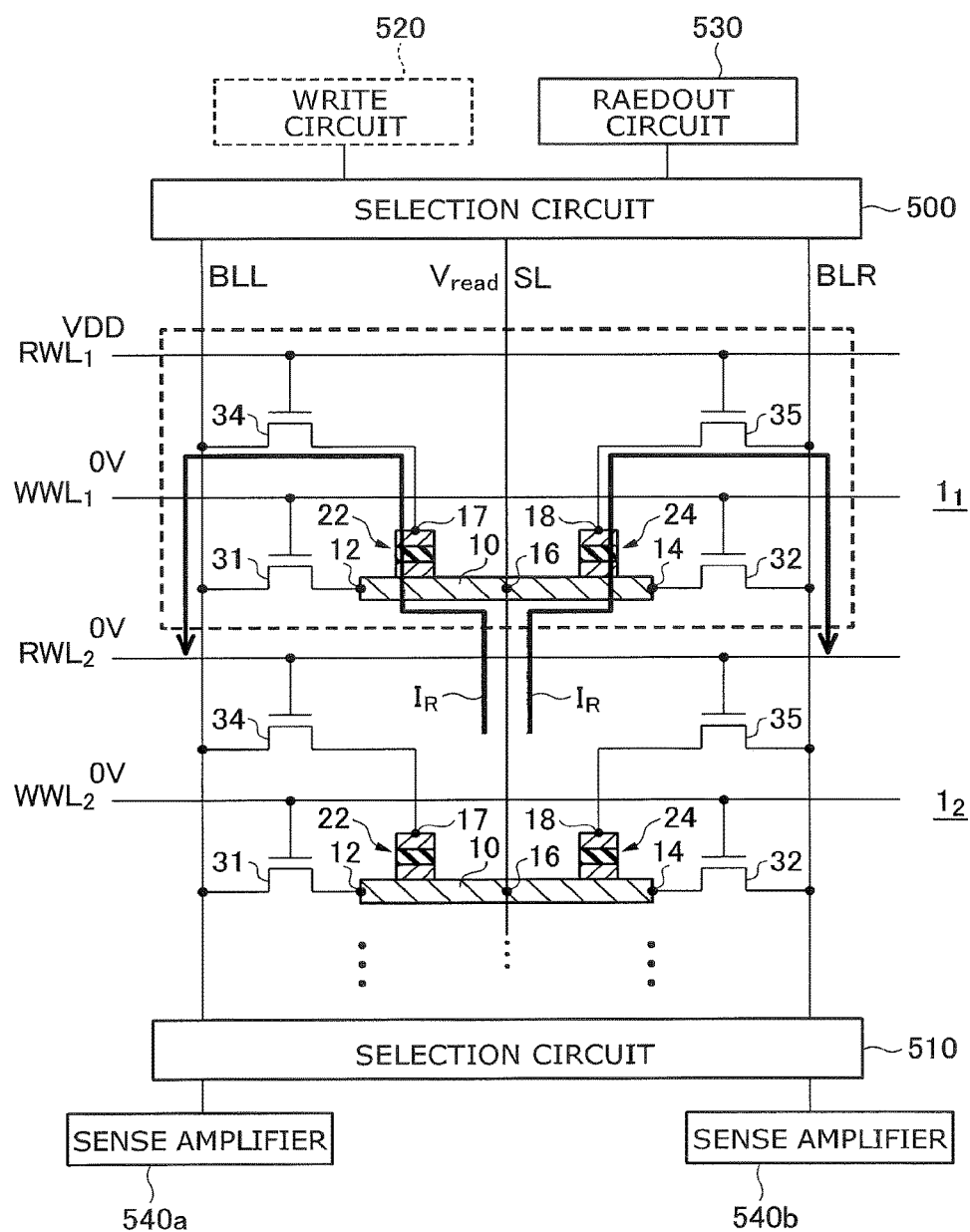
FIG. 55 is a circuit diagram for explaining a read operation in the magnetic memory according to the seventeenth embodiment.

A magnetic memory according to a seventeenth embodiment will be described with reference to FIGS. 53 to 55. FIG. 53 is a circuit diagram illustrating a magnetic memory according to the seventeenth embodiment, FIG. 54 is a circuit diagram for explaining a write operation of the magnetic memory according to the seventeenth embodiment, and FIG. 55 is a circuit diagram for explaining a read operation of the magnetic memory according to the seventeenth embodiment.

The magnetic memory according to the seventeenth embodiment has a configuration obtained by replacing the sense amplifier 540 with sense amplifiers 540a and 540b in the thirteenth embodiment shown in FIG. 46. Each memory cell $1_i$ (i=1, 2, . . . ) has the same configuration as the memory cell of the thirteenth embodiment shown ion FIG. 46, but the magnetoresistive elements 22 and 24 independently store data. Thus, each memory cell $1_i$ (i=1.2, . . . ) stores data of two bits. Therefore, the differential amplifying method used in the thirteenth embodiment cannot be used, and for this reason the two sense amplifiers 540a and 540b are used. The sense amplifier 540a is electrically connected to the first bit line BLL via the selection circuit 510, and the sense amplifier 540b is electrically connected to the second bit line BLR via the selection circuit 510. Each of the sense amplifiers 540a and 540b compares the potential of the corresponding bit line with a reference potential, and determines whether the data outputted to the corresponding bit line is "0" or "1."
(Write Operation)

A write operation will then be described with reference to FIG. 54. FIG. 54 is a circuit diagram illustrating a write operation to write data to the memory cell $1_1$.

Different data are written to the magnetoresistive elements 22 and 24 of the memory cell $1_1$ in the same manner as the write operation to write data in the thirteenth embodiment shown in FIG. 47.

In the write operation, the selection circuit 500 connects the first bit line BLL, the second bit line BLR, and the source line SL to the write circuit 520. Subsequently, a write selection potential VGW is applied to the write word line $WWL_1$, and a potential 0 V is applied to the write word line $WWL_2$ and the read word lines $RWL_1$ and $RWL_2$. As a result, the transistors 31 and 32 are turned on and the transistors 34 and 35 are turned off in the memory cell $1_1$. The transistors 31, 32, 34, and 35 are turned off in the other memory cell $1_2$.

In order to write data "0" to the magnetoresistive element 22 and data "1" to the magnetoresistive element 24 of the selected memory cell $1_1$, electric currents are caused to flow in opposite directions through the conductive layer 10 of the selected memory cell $1_1$. For example, a write voltage $V_{write}$ is applied to the first bit line BLL and the second bit line BLR, and a voltage 0 V is applied to the source line SL. As a result, the write current Iw1 for the magnetoresistive element 22 flows from the first bit line BLL to the source line SL via the transistor 31, the terminal 12, the conductive layer 10, and the terminal 16. On the other hand, the write current Iw1 for the magnetoresistive element 24 flows from the second bit line BLR to the source SL via the transistor 32, the terminal 14, the conductive layer 10, and the terminal 16. Thus, the write currents Iw1 flow along solid line arrows in FIG. 54.

If data is written in an opposite manner, and for example, if data "1" is written to the magnetoresistive element 22 and data "0" is written to the magnetoresistive element 24 in the selected memory cell $1_1$, 0 V is applied to the first bit line BLL and the second bit line BLR, and the write voltage $V_{write}$ is applied to the source line SL to have write currents with opposite polarities. As a result, a write current Iw1' for the magnetoresistive element 22 flows from the source line SL to the first bit line BLL via the terminal 16, the conductive layer 10, the terminal 12, and the transistor 31. On the other hand, a write current Iw1' for the magnetoresistive element 24 flows from the source line SL to the second bit line BLR via the terminal 16, the conductive layer 10, the terminal 14, and the transistor 32. Thus, the write currents Iw1' flow along broken line arrows in FIG. 54.

If the same data is written to the magnetoresistive elements 22 and 24 in the memory cell $1_1$, a write operation is performed in the following manner.

The selection circuit 500 connects the first bit line BLL and the second bit line BLR to the write circuit 520. The source line SL is brought into a floating state. Subsequently, a write selection potential VGW is applied to the write word line $WWL_i$, and a potential 0 V is applied to the write word line $WWL_2$ and the read word lines $RWL_1$ and $RWL_2$. As a result, the transistors 31 and 32 are turned on and the transistors 34 and 35 are turned off in the memory cell $1_1$. In the other memory cell $1_2$, the transistors 31, 32, 34, and 35 are turned off.

In this state, an electric current is caused to flow in one direction through the conductive layer 10 of the selected memory cell $1_1$ to write data "0," for example, to the magnetoresistive elements 22 and 24 of the selected memory cell $1_1$. For example, a write voltage $V_{write}$ is applied to the first bit line BLL, and a voltage 0 V is applied to the second bit line BLR. As a result, a write current Iw2 for writing data to the magnetoresistive elements 22 and 24 flows from the first bit line BLL to the second bit line BLR via the transistor 31, the terminal 12, the conductive layer 10, the terminal 14, and the transistor 32. Thus, the write current Iw2 flows along the solid line arrow shown in FIG. 54.

If the other data is written, for example if data "1" is written to the magnetoresistive elements 22 and 24 in the selected memory cell $1_1$, 0 V is applied to the first bit line BLL and the write voltage $V_{write}$ is applied to the second bit line BLR to have a write current with an opposite polarity. As a result, a write current Iw2' for writing data to the magnetoresistive elements 22 and 24 flows from the second bit line BLR to the first bit line BLL via the transistor 32, the terminal 14, the conductive layer 10, the terminal 12, and the transistor 31. Thus, the write current Iw2' flows along a broken line arrow shown in FIG. 54.

As described above, not only different data (0, 1), (1, 0) but also the same data (0, 0), (1, 1) may be written to the magnetoresistive elements 22 and 24 of each memory cell $1i$ (i=1, 2, . . . ). This makes it possible to write all of the required data patterns to the magnetoresistive elements 22 and 24.

(Read Operation)

A read operation will then be described with reference to FIG. 55. FIG. 55 is a circuit diagram illustrating an operation to read data from the memory cell $1_1$.

The selection circuit 500 connects the first bit line BLL, the second bit line BLR, and the source line SL to the readout circuit 530, and the selection circuit 510 connects the sense amplifier 540a to the first bit line BLL, and the sense amplifier 540b to the second bit line BLR.

Subsequently, the selection circuit 500 applies 0 V to the write word line $WWL_1$ connected to the selected memory cell $1_1$ to turn off the transistors 31 and 32, and a read selection potential VGR to the read word line $RWL_1$ connected to the selected memory cell $1_1$ to turn on the transistors 34 and 35.

If data is read from the magnetoresistive element 22 in this state, for example, a read voltage Vread is applied to the source line SL, and 0 V is applied to the first bit line BLL. When the signal on the first bit line BLL is saturated, the sense amplifier 540a compares the potential of the first bit line BLL and a reference potential, and determines whether the data stored in the magnetoresistive element 22 is "0" or "1" on the basis of the comparison result.

On the other hand, if data is read from the magnetoresistive element 24, for example, the second bit line BLR is discharged, and then a read voltage Vread is applied to the source line SL. When the signal on the second bit line BLR is saturated, the sense amplifier 540b compares the potential of the second bit line BLR and the reference potential, and determines whether the data stored in the magnetoresistive element 24 is "0" or "1" on the basis of the comparison result.

Each memory cell of the magnetic memory according to the seventeenth embodiment stores two-bit data. Therefore, the occupied area per one bit is a half of that in the magnetic memory according to the thirteenth embodiment. This improves the density.

Similarly to the thirteenth embodiment, energy consumption may be reduced and write and read operations may be performed at a high speed in the magnetic memory according to the seventeenth embodiment.

Eighteenth Embodiment

Figure 56:
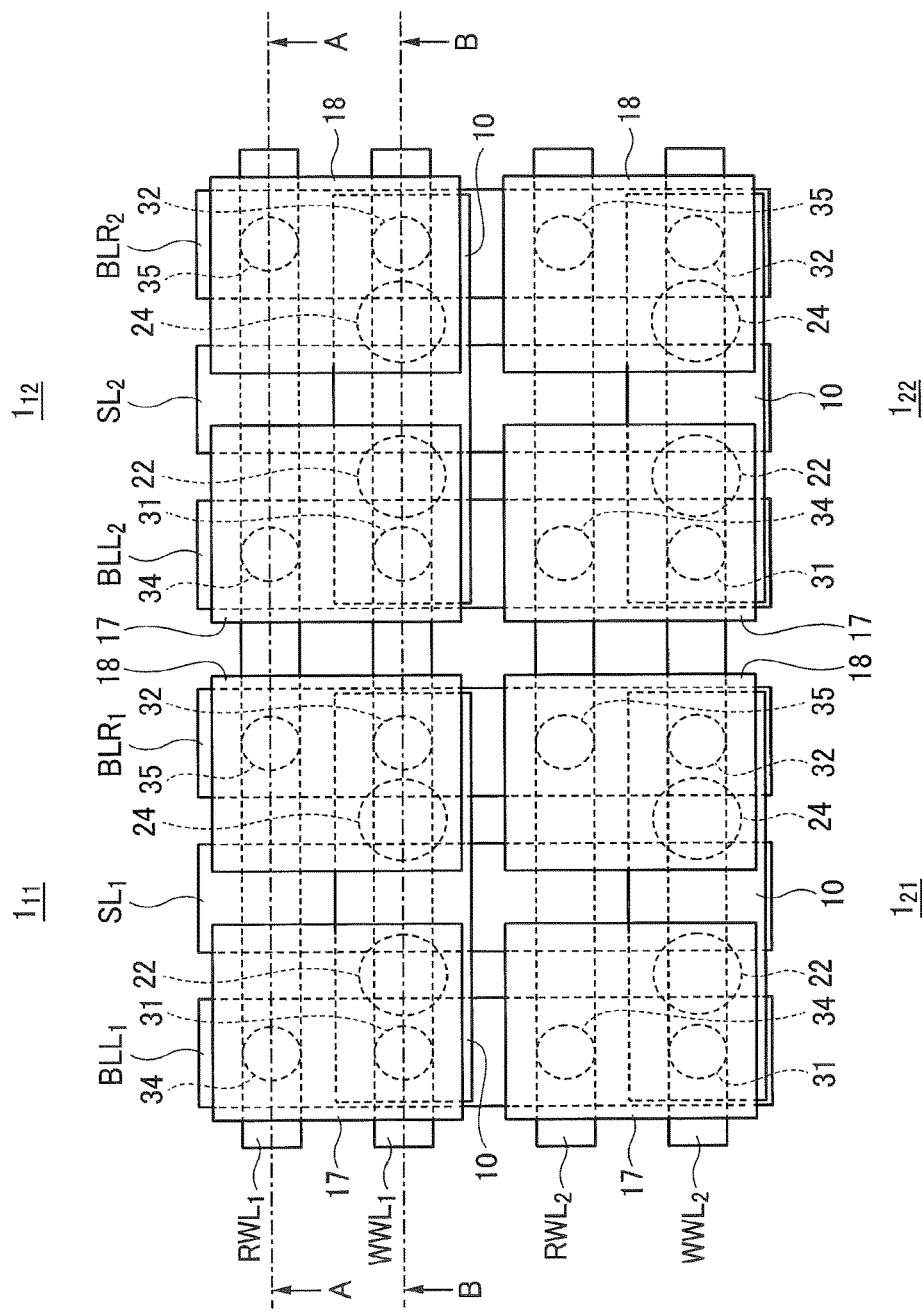
FIG. 56 is a plan view of a magnetic memory according to an eighteenth embodiment.

A magnetic memory according to an eighteenth embodiment will be described with reference to FIGS. 56 to 58. FIG. 56 is a top view of the magnetic memory according to the eighteenth embodiment, FIG. 57 is a cross-sectional view taken along line A-A of FIG. 56, and FIG. 58 is a cross-sectional view taken along line B-B of FIG. 56.

The magnetic memory according to the eighteenth embodiment includes at least four memory cells $1_{11}$ to $1_{22}$, which are arranged in a matrix form, each memory cell having the same configuration as the memory cell according to the thirteenth embodiment shown in FIG. 46. Thus, each memory cell includes a conductive layer 10, magnetoresistive elements 22 and 24 disposed on the conductive layer 10, and four transistors 31, 32, 34, and 35. FIG. 56 can be understood to be a top view of the magnetic memory according to the thirteenth embodiment shown in FIG. 49.

Figure 57:
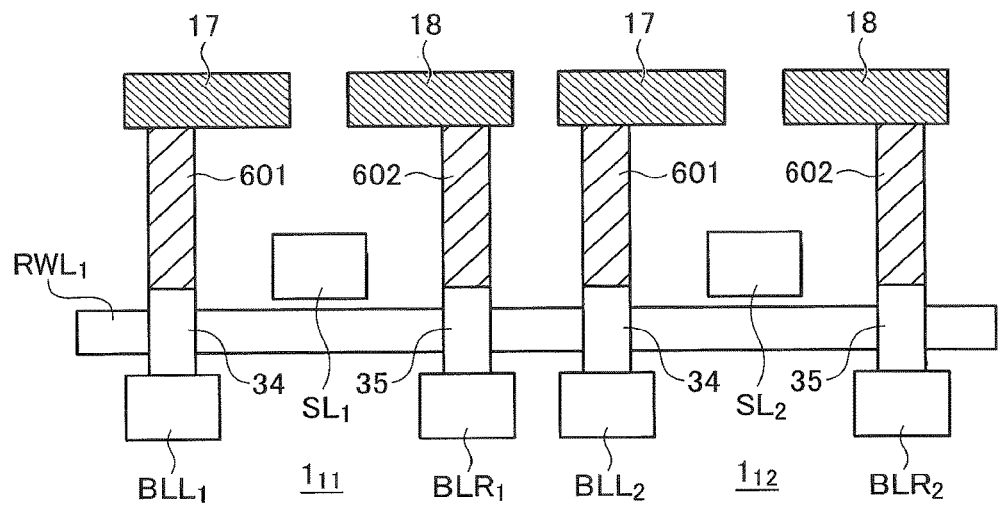
FIG. 57 is a cross-sectional view of the magnetic memory according to the eighteenth embodiment taken along line A-A in FIG. 56.
Figure 58:
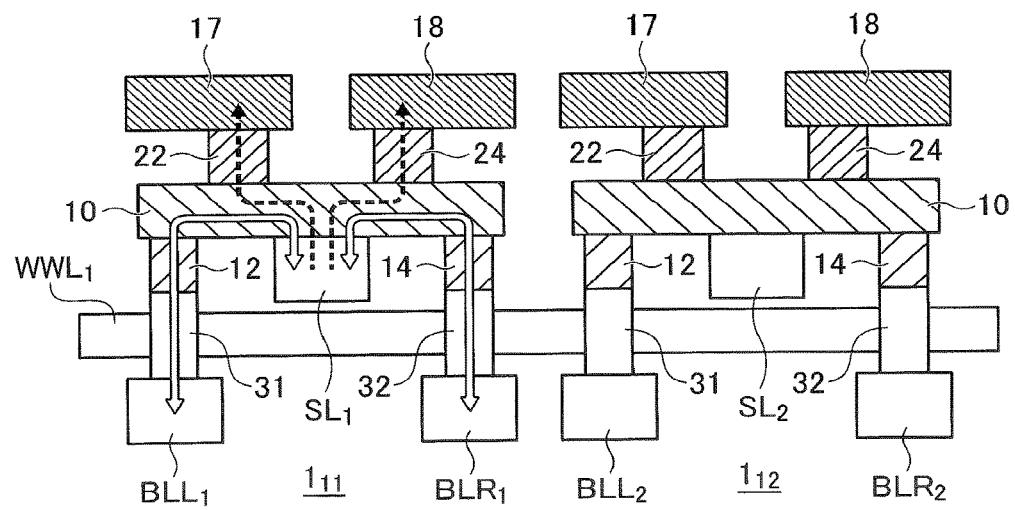
FIG. 58 is a cross-sectional view of the magnetic memory according to the eighteenth embodiment taken along line B-B in FIG. 56.

As can be understood from FIGS. 57 and 58, each of the transistors 31, 32, 34, and 35 are a vertical transistor. The gates of the transistors 31 and 32 in the memory cells $1_{i1}$ and $1_{i2}$ (i=1, 2) form a write word line $WWL_i$ (see FIG. 58), and the gates of the transistors 34 and 35 form a read word line $RWL_i$ (see FIG. 57).

A first bit line $BLL_1$ and a second bit line $BLR_1$ connected to the memory cell $1_{i1}$ (i=1, 2) are disposed below the memory cell $1_{i1}$ (i=1, 2), and a first bit line $BLL_2$ and a second bit line $BLR_2$ connected to the memory cell $1_{i2}$ (i=1, 2) are disposed on the same level as the first bit line $BLL_1$ and the second bit line $BLR_1$ (FIGS. 57 and 58). The terminals 17 and 18 are disposed on an upper layer. The conductive layer 10 is disposed above the first bit lines $BLL_1$ and $BLL_2$ and the second bit lines $BLR_1$ and $BLR_2$, and the terminals 17 and 18 are disposed above the conductive layer 10.

In the memory cell $1_{i1}$ (i=1, 2), one of the source and the drain of the transistor 31 is electrically connected to the first bit line $BLL_1$, and the other is electrically connected to the terminal 12. One of the source and the drain of the transistor 32 is electrically connected to the second bit line $BLR_1$, and the other is electrically connected to the terminal 14. One of the source and the drain of the transistor 34 is electrically connected to the first bit line $BLL_1$, and the other is electrically connected to the terminal 17 via a plug 601. One of the source and the drain of the transistor 35 is electrically connected to the second bit line $BLR_1$, and the other is electrically connected to the terminal 18 via a plug 602.

In the memory cell $1_{i2}$ (i=1, 2), one of the source and the drain of the transistor 32 is electrically connected to the first bit line $BLL_2$, and the other is electrically connected to the terminal 12. One of the source and the drain of the transistor 32 is electrically connected to the second bit line $BLR_2$, and the other is electrically connected to the terminal 14. One of the source and the drain of the transistor 34 is connected to the first bit line $BLL_2$, and the other is electrically connected to the terminal 17 via a plug 601. One of the source and the drain of the transistor 35 is electrically connected to the second bit line $BLR_2$, and the other is electrically connected to the terminal 18 via a plug 602.

(Write Operation)

Data are written to the magnetoresistive elements 22 and 24 of the memory cell $1_{11}$ by causing a write current to flow between the source line $SL_1$ and the first bit line $BLL_1$, and between the source line $SL_1$ and the second bit line $BLR_1$ via the conductive layer 10. The write currents for writing, for example, data "0" and data "1" to the magnetoresistive elements 22 and 24 are indicated by solid line arrows in FIG. 58. If data are to be written in an opposite manner, the directions of the write currents are opposite to the solid line arrows. As in the thirteenth embodiment, the write word line $WWL_1$ is made active, and the write word line $WWL_2$ is made inactive.

In this manner, different data are written to the magnetoresistive elements 22 and 24 of each memory cell.

(Read Operation)

Data are read from the magnetoresistive elements 22 and 24 of the memory cell $1_{11}$ by causing read currents to flow from the source line $SL_1$ to the magnetoresistive elements 22 and 24 via the conductive layer 10 as shown by broken line arrows in FIG. 58, and then causing the read currents to flow from the terminals 17 and 18 to the first bit line $BLL_1$ and the second bit line $BLR_1$ via the transistors 34 and 35. A differential amplifier determines a resistance value using a difference in resistance between the magnetoresistive elements 22 and 24 to read the data state.

Similarly to the thirteenth embodiment, energy consumption may be reduced and write and read operation may be performed at a high speed in the magnetic memory in the eighteenth embodiment.

Nineteenth Embodiment

Figure 59:
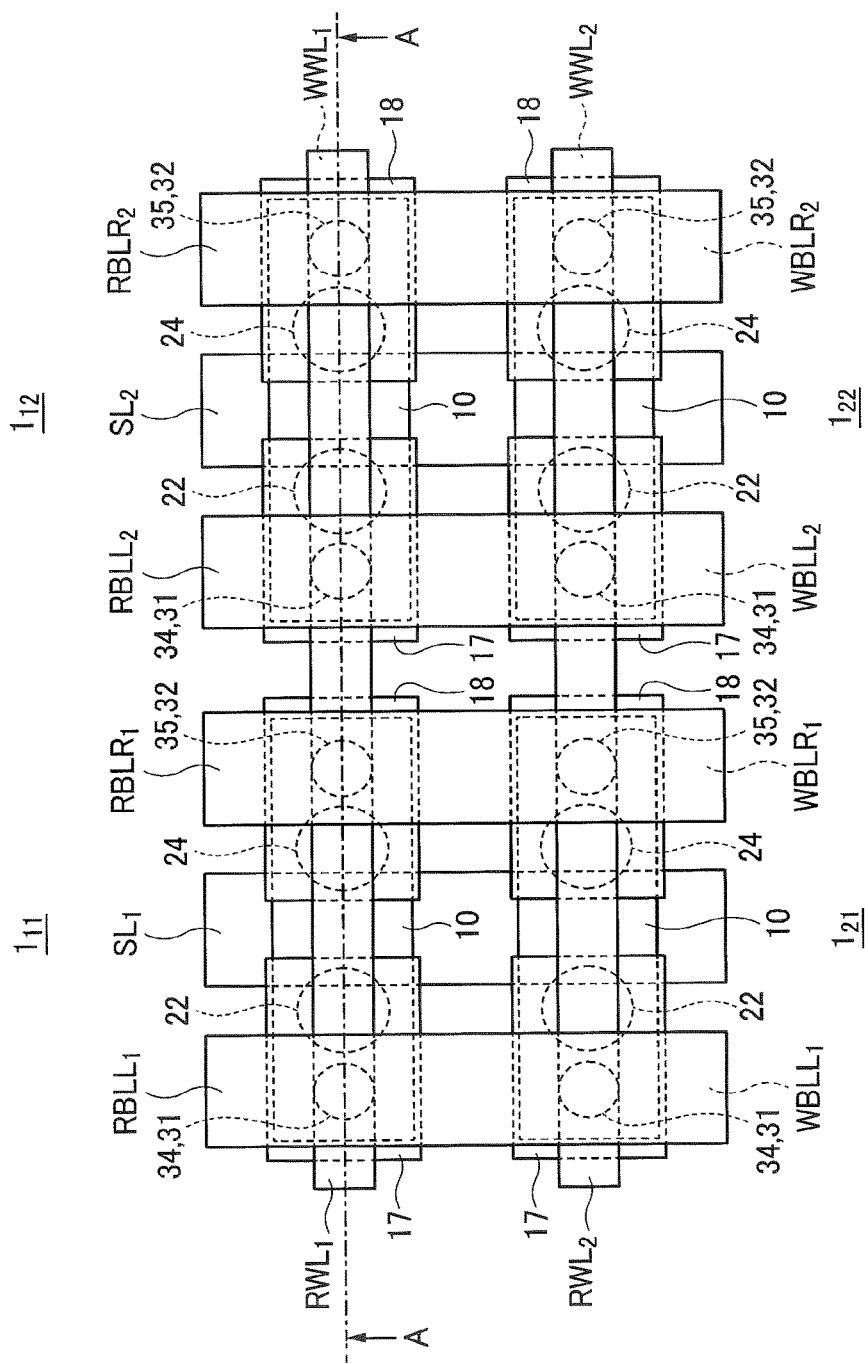
FIG. 59 is a plan view of a magnetic memory according to a nineteenth embodiment.
Figure 60:
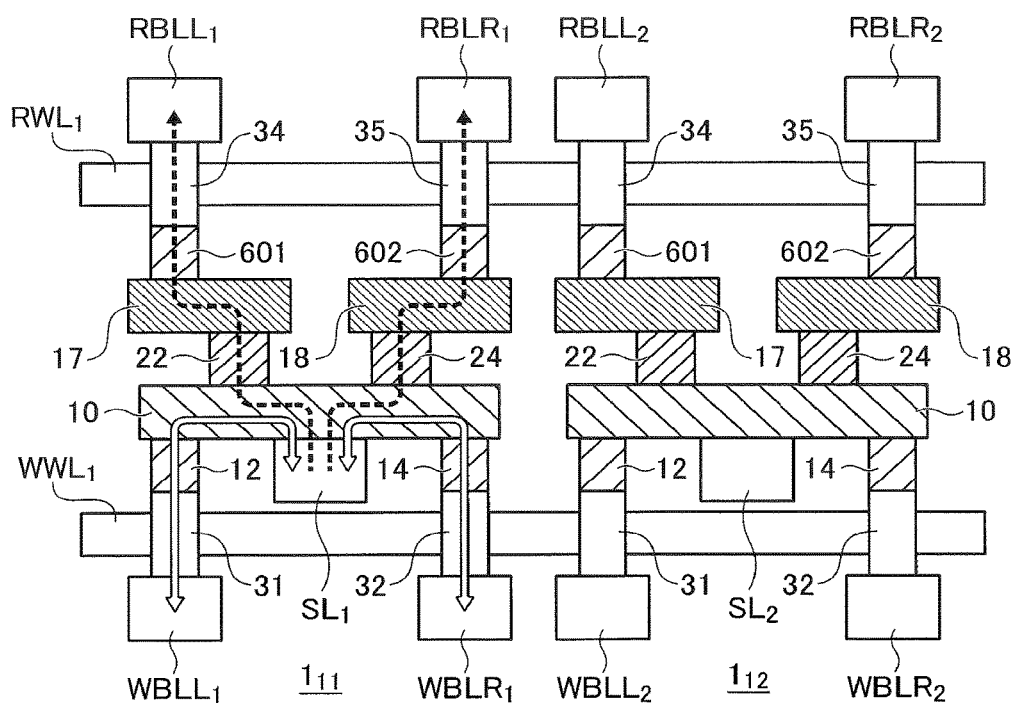
FIG. 60 is a cross-sectional view of the magnetic memory according to the nineteenth embodiment taken along line A-A in FIG. 59.

A magnetic memory according to a nineteenth embodiment will be described with reference to FIGS. 59 and 60. FIG. 59 is a plan view of the magnetic memory according to the nineteenth embodiment, and FIG. 60 is a cross-sectional view taken along line A-A of FIG. 59.

The magnetic memory according to the nineteenth embodiment includes at least four memory cells $1_{11}$ to $1_{22}$. Each memory cell $1_{ij}$ (i, j=1, 2) has the same configuration as the memory cells according to the eighteenth embodiment. The transistors 31, 32, 34, and 35 included in each memory cell $1_{ij}$ (i, j=1, 2) are vertical transistors. The transistors 31 and 32 are disposed on the same level, and the transistors 34 and 35 are disposed on a higher level.

Unlike the magnetic memory according to the eighteenth embodiment, first and second write bit lines $WBLL_1$ and $WBLR_1$ and first and second read bit lines $RBLL_1$ and $RBLR_1$ are provided for the memory cells $1_{i1}$ (i=1, 2). First and second write bit lines $WBLL_2$ and $WBLR_2$ and first and second read bit lines $RBLL_2$ and $RBLR_2$ are provided for the memory cells $1_{i2}$ (i=1, 2). The write bit lines $WBLL_1$, $WBLR_1$, $WBLL_2$, and $WBLR_2$ are disposed on a lower level.

In the memory cells $1_{i1}$ (i=1, 2), one of the source and the drain of the transistor 31 is connected to the first write bit line $WBLL_1$, the other is connected to the terminal 12, and the gate is connected to the write word line $WWL_1$. One of the source and the drain of the transistor 32 is connected to the second write bit line $WBLR_1$, the other is connected to the terminal 14, and the gate is connected to the write word line $WWL_1$. The terminal 12 and the terminal 14 are connected to the conductive layer 10. The source line $SL_1$ is connected to a region on the lower surface of the conductive layer 10 between the terminal 12 and the terminal 14. The magnetoresistive elements 22 and 24 are disposed on the top surface of the conductive layer 10, and the source line $SL_1$ is disposed in the region on the lower surface of the conductive layer 10 corresponding to a region between the magnetoresistive element 22 and the magnetoresistive element 24. The magnetoresistive element 22 is connected to the terminal 17 disposed on the upper level, and the magnetoresistive element 24 is connected to the terminal 18 disposed on the upper level. The transistor 34 is disposed above the terminal 17. One of the source and the drain of the transistor 34 is connected to the terminal 17 via a plug 601, the other is connected to the first read bit line $RBLL_1$, and the gate is connected to the read word line $RWL_1$. The first read bit line $RBLL_1$ is disposed above the transistor 34. The transistor 35 is disposed above the terminal 18. One of the source and the drain of the transistor 35 is connected to the terminal 18 via a plug 602, the other is connected to the second read bit line $RBLR_1$, and the gate is connected to the read word line $RWL_1$. The second read bit line $RBLR_1$ is disposed above the transistor 35.

Similarly, in the memory cells $1_{i2}$ (i=1, 2), one of the source and the drain of the transistor 31 is connected to the first write bit line $WBLL_2$, the other is connected to the terminal 12, and the gate is connected to the write word line $WWL_1$. One of the source and the drain of the transistor 32 is connected to the second write bit line $WBLR_2$, the other is connected to the terminal 14, and the gate is connected to the write word line $WWL_1$. The terminal 12 and the terminal 14 are connected to the conductive layer 10. The source line $SL_1$ is connected to a region on the lower surface of the conductive layer 10 between the terminal 12 and the terminal 14. The magnetoresistive elements 22 and 24 are disposed on the top surface of the conductive layer 10, and the source line $SL_1$ is disposed in the region on the lower surface of the conductive layer 10 corresponding to a region between the magnetoresistive element 22 and the magnetoresistive element 24. The magnetoresistive element 22 is connected to the terminal 17 disposed on an upper level, and the magnetoresistive element 24 is connected to the terminal 18 disposed on the upper level. The transistor 34 is disposed above the terminal 17. One of the source and the drain of the transistor 34 is connected to the terminal 17 via a plug 601, the other is connected to the first read bit line $RBLL_1$, and the gate is connected to the read word line $RWL_1$. The first read bit line $RBLL_1$ is disposed above the transistor 34. The transistor 35 is disposed above the terminal 18. One of the source and the drain of the transistor 35 is connected to the terminal 18 via a plug 602, the other is connected to the second read bit line $RBLR_1$, and the gate is connected to the read word line $RWL_1$. The second read bit line $RBLR_1$ is disposed above the transistor 35.

(Write Operation)

Data is written in the following manner to the memory cell $1_{11}$ of the magnetic memory according to the nineteenth embodiment having the above configuration.

Data is written to the memory cell $1_{11}$ by causing a write current to flow between the source line $SL_1$ and the first write bit line $WBLL_1$ and between the source line $SL_1$ and the second write bit line $WBLR_1$ via the conductive layer 10. Solid line arrows in FIG. 60 indicate write currents in a case where data "0" is written to the magnetoresistive element 22 and data "1" is written to the magnetoresistive element 24. If data are written to the respective magnetoresistive elements in an opposite manner, the directions of the write currents become opposite to the solid line arrows. As in the case of the thirteenth embodiment, the write word line $WWL_1$ is caused to be active, and the write word line $WWL_2$ is caused to be inactive.

(Read Operation)

Data is read from the memory cell $1_{11}$ in the following manner.

As indicated by broken line arrows in FIG. 60, read currents are caused to flow from the source line $SL_1$ to the magnetoresistive elements 22 and 24 via the conductive layer 10, and from the terminals 17 and 18 to the first read bit line $RBLL_1$ and the second read bit line $RBLR_1$ via the transistors 34 and 35. A differential amplifier determines a resistance value using a difference in resistance between the magnetoresistive elements 22 and 24 to read the state of data.

The area occupied by the memory cells of the magnetic memory in the nineteenth embodiment is a half of the area in the eighteenth embodiment.

Similarly to the thirteenth embodiment, energy consumption may be reduced and write and read operations may be performed at a high speed in the magnetic memory according to the nineteenth embodiment.

Twentieth Embodiment

Figure 61:
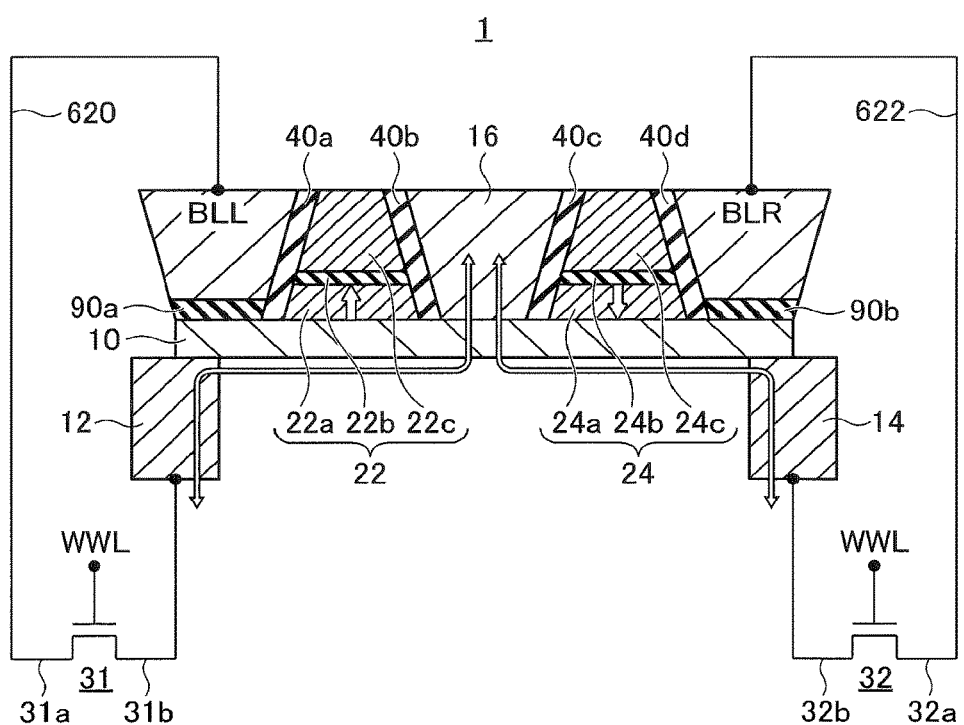
FIG. 61 is a cross-sectional view showing a memory cell of a magnetic memory according to a twentieth embodiment.
Figure 62:
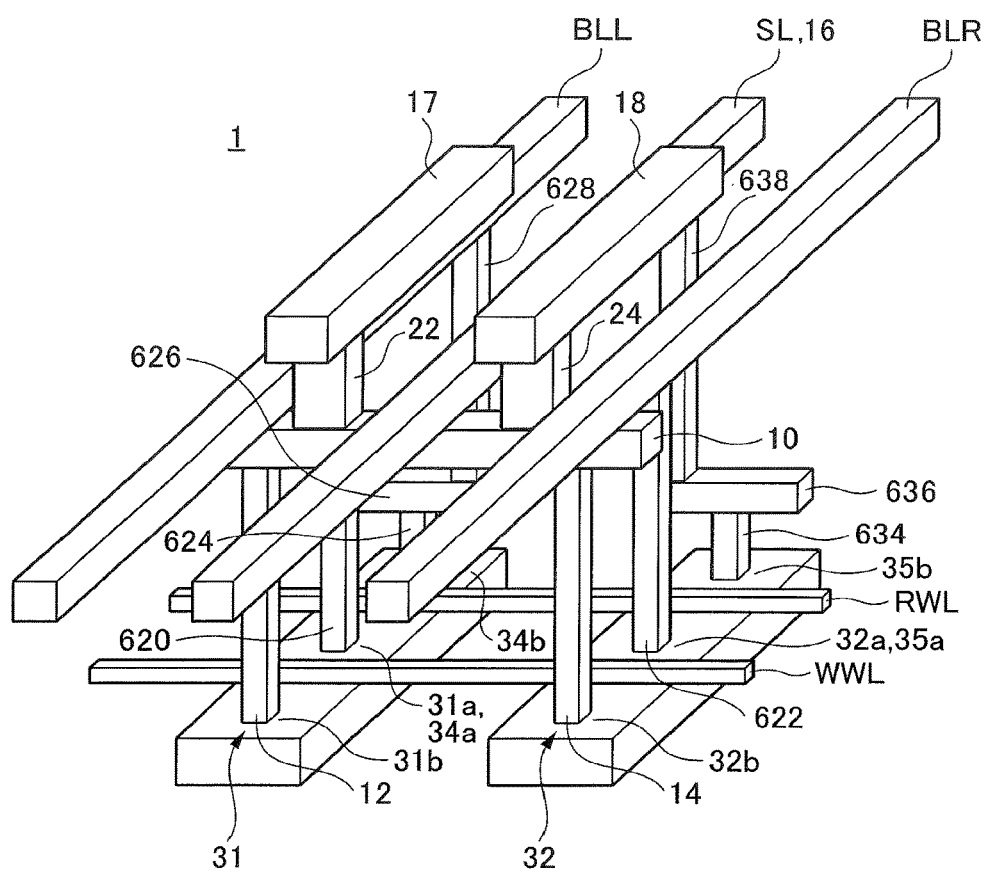
FIG. 62 is a perspective view of the memory cell according to the twentieth embodiment.

A magnetic memory according to a twentieth embodiment will be described with reference to FIGS. 61 and 62. The magnetic memory according to the twentieth embodiment includes at least one memory cell. FIG. 61 is a cross-sectional view of the memory cell, and FIG. 62 is a perspective view of the memory cell.

The memory cell 1 according to the twentieth embodiment has the same configuration as the memory cells $1_1$ and $1_2$ according to the thirteenth embodiment shown in FIG. 46. Thus, the memory cell 1 according to the twentieth embodiment includes a conductive layer 10, terminals (electrodes) 12 and 14 separately disposed on and connected to the conductive layer 10, terminals (electrodes) 16, 17, and 18, magnetoresistive elements 22 and 24 separately disposed in a region of the conductive layer 10 between the terminal 12 and the terminal 14, and transistors 31, 32, 34, and 35.

The magnetoresistive element 22 includes a storage layer 22a disposed on the conductive layer 10, a nonmagnetic layer 22b disposed on the storage layer 22a, and a reference layer 22c disposed on the nonmagnetic layer 22b. The magnetoresistive element 24 includes a storage layer 24a disposed on the conductive layer 10, a nonmagnetic layer 24b disposed on the storage layer 24a, and a reference layer 24c disposed on the nonmagnetic layer 24b.

The terminal 16 is electrically connected to a region of the conductive layer 10 between the magnetoresistive element 22 and the magnetoresistive element 24. The terminal 16 and the magnetoresistive elements 22 and 24 are electrically insulated from one another by sidewall insulating layers 40. A first bit line BLL is disposed on a region of the conductive layer 10 via an insulating layer 90a, the region being opposite to the terminal 16 relative to the magnetoresistive element 22. The first bit line BLL and the magnetoresistive element 22 are electrically insulated from each other by the sidewall insulating layer 40. A second bit line BLR is disposed on a region of the conductive layer 10 via an insulating layer 90b, the region being opposite to the terminal 16 relative to the magnetoresistive element 24. The second bit line BLR and the magnetoresistive element 24 are electrically insulated from each other by the sidewall insulating layer 40.

As shown in FIG. 62, the transistors 31 and 34 are disposed on a first semiconductor layer, and the transistors 32 and 35 are disposed on a second semiconductor layer that is isolated from the first semiconductor layer. One of the source and the drain (terminal) 31a of the transistor 31 is the same as one of the source and the drain (terminal) 34a of the transistor 34. One of the source and the drain (terminal) 32a of the transistor 32 is the same as one of the source and the drain (terminal) 35a of the transistor 35.

As shown in FIGS. 61 and 62, the other of the source and the drain (terminal) 31b of the transistor 31 is connected to the terminal 12, the terminal 31a is connected to the first bit line BLL via a plug 620, and the gate is connected to the write word line WWL. The other of the source and the drain (terminal) 32b of the transistor 32 is connected to the terminal 14, the terminal 32a is connected to the second bit line BLR via a plug 622, and the gate is connected to the write word line WWL.

The other of the source and the drain (terminal) 34b of the transistor 34 is connected to the terminal 17 via plugs 624, 626, and 628, the terminal 34a is connected to the first bit line BLL via the plug 620, and the gate is connected to the read word line RWL. The other of the source and the drain (terminal) 35b of the transistor 35 is connected to the terminal 18 via plugs 634, 636, and 638, the terminal 35a is connected to the second bit line BLR via the plug 622, and the gate is connected to the read word line RWL. In this embodiment, the terminal 16 corresponds to the source line SL.

In the twentieth embodiment, the first bit line BLL, the source line SL, and the second bit line BLR connecting to the magnetoresistive elements 22 and 24 are disposed on the same level as the magnetoresistive elements 22 and 24, and are adjacent to the magnetoresistive elements 22 and 24. As a result, the occupied area of the magnetoresistive elements 22 and 24 can be reduced to $(6F)^2$, where F is a minimum feature size. Thus, the memory cells may be densely disposed.

Similarly to the thirteenth embodiment, energy consumption may be reduced and write and read operations may be performed at a high speed in the magnetic memory according to the twentieth embodiment.

Twenty-First Embodiment

Figure 63:
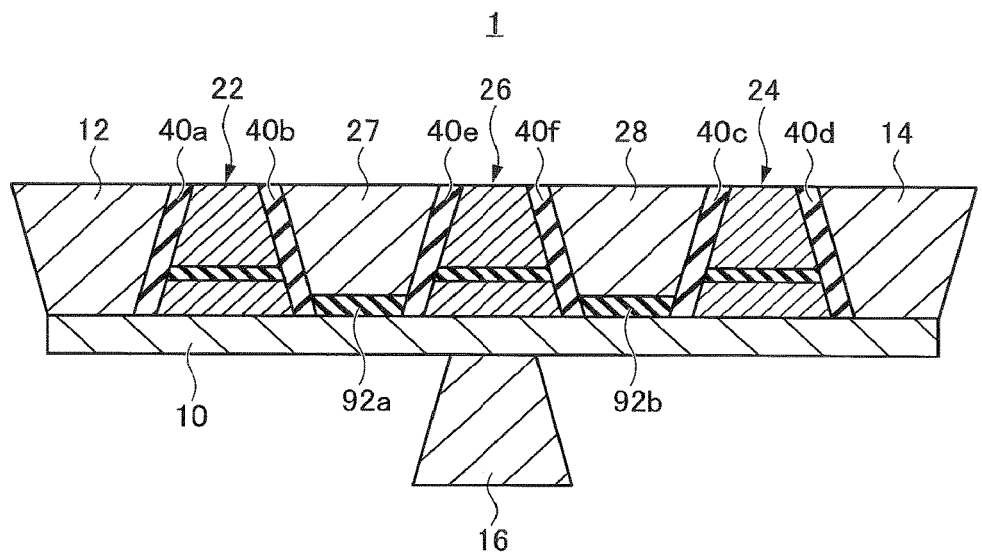
FIG. 63 is a cross-sectional view showing a memory cell of a magnetic memory according to a twenty-first embodiment.

FIG. 63 illustrates a memory cell of a magnetic memory according to a twenty-first embodiment. The magnetic memory according to the twenty-first embodiment includes at least one memory cell 1, which has a configuration obtained by disposing the terminal 16 of the memory cell 1 according to the eighth embodiment shown in FIG. 18 to the lower surface of the conductive layer 10, and newly adding a dummy magnetoresistive element 26 and electrodes 27 and 28 to a region of the conductive layer 10 between the magnetoresistive element 22 and the magnetoresistive element 24. The dummy magnetoresistive element 26 has the same configuration as the magnetoresistive elements 22 and 24.

The dummy magnetoresistive element 26 is disposed in a region of the conductive layer 10 between the magnetoresistive element 22 and the magnetoresistive element 24. The electrode 27 is disposed in a region of the conductive layer 10 between the magnetoresistive element 22 and the dummy magnetoresistive element 26, and the electrode 28 is disposed in a region of the conductive layer 10 between the dummy magnetoresistive element 26 and the magnetoresistive element 24. A sidewall insulating layer 40b is disposed between a side portion of the magnetoresistive element 22 and a side portion of the electrode 27, a sidewall insulating layer 40e is disposed between a side portion of the electrode 27 and a side portion of the dummy magnetoresistive element 26, a sidewall insulating layer 40f is disposed between a side portion of the dummy magnetoresistive element 26 and a side portion of the electrode 28, and a sidewall insulating layer 40d is disposed between a side portion of the electrode 28 and a side portion of the magnetoresistive element 24.

An insulating layer 92a is disposed between the electrode 27 and the conductive layer 10, and an insulating layer 92b is disposed between the electrode 28 and the conductive layer 10 in this embodiment.

The dummy magnetoresistive element 26 is disposed between the magnetoresistive element 22 and the magnetoresistive element 24 so that the magnetoresistive elements 22, 26, and 24 are arranged with the same pitch in the twenty-first embodiment. As a result, the magnetic memory may be manufactured easily.

(First Modification)

Figure 64:
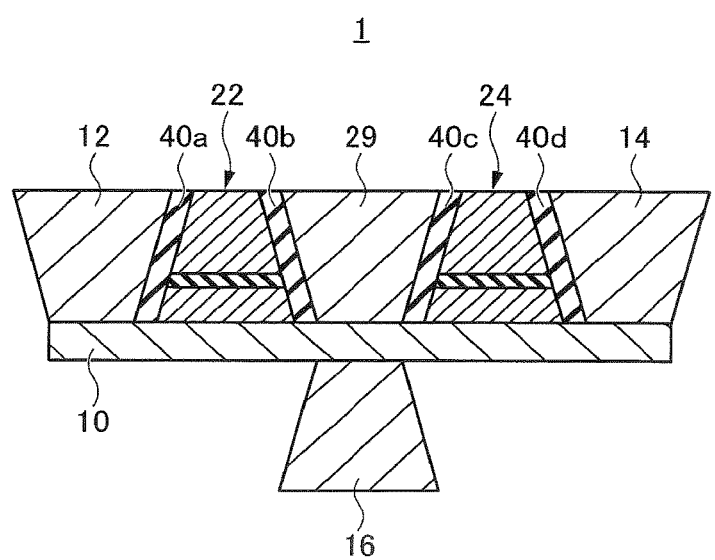
FIG. 64 is a cross-sectional view showing a memory cell of a magnetic memory according to a first modification of the twenty-first embodiment.

FIG. 64 illustrates a memory cell of a magnetic memory according to a first modification of the twenty-first embodiment. The magnetic memory 1 according to the first modification includes at least one memory cell 1 having a configuration obtained by replacing the dummy magnetoresistive element 26 and the electrodes 27 and 28 with a dummy electrode 29 in the memory cell according to the twenty-first embodiment shown in FIG. 62. The dummy electrode 29 is formed of the same material as the electrodes 12 and 14, and is not electrically connected to any of the wiring lines.

The dummy electrode 29 in the first modification is disposed in a region of the conductive layer 10 between the magnetoresistive element 22 and the magnetoresistive element 24 so that the electrodes 12, 29, and 14 are arranged with the same pitch. As a result, the magnetic memory may be manufactured easily.

(Second Modification)

Figure 65:
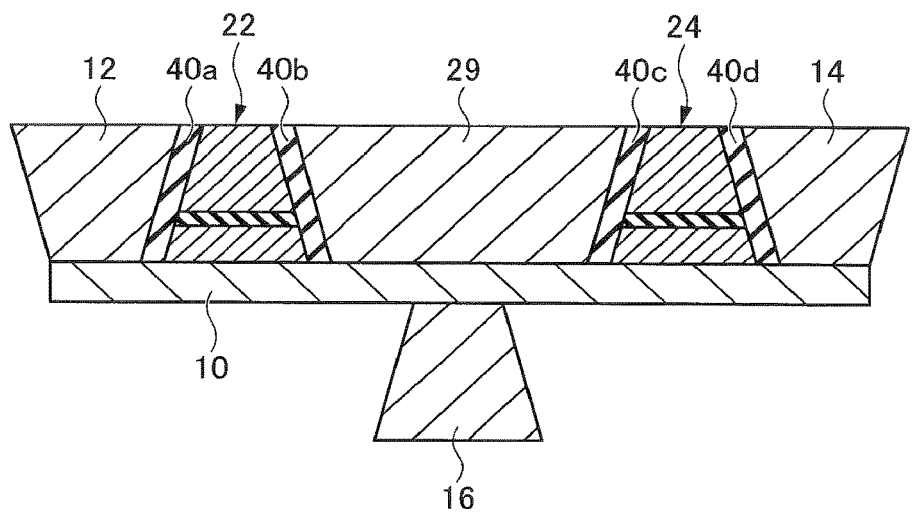
FIG. 65 is a cross-sectional view showing a memory cell of a magnetic memory according to a second modification of the twenty-first embodiment.

FIG. 65 illustrates a memory cell of a magnetic memory according to a second modification of the twenty-first embodiment. The magnetic memory according to the second modification includes at least one memory cell 1, which has a configuration obtained by increasing the width of a region of the dummy electrode 29 in contact with the conductive layer 10, so as to increase the contact area between the dummy electrode 29 and the conductive layer 10 in the memory cell according to the first modification shown in FIG. 64. This means that the width of the region of the dummy electrode 29 in the direction along which the conductive layer 10 extends is made longer than the width of a region of the electrode 16, which is in contact with the conductive layer 10.

The electric resistance of the dummy electrode 29 is generally lower than that of the conductive layer 10. Therefore, the write current flowing from the electrode 16 toward the conductive layer 10 tends to flow to the dummy electrode 29 rather than to the conductive layer 10. Therefore, most of the write current flows to the conductive layer 10 from the corner portions of the magnetoresistive elements 22 and 24 on the dummy electrode 29 side. Accordingly, if the position of the electrode 16 relative to the magnetoresistive elements 22 and 24 is moved, the influence of the movement can be effectively prevented. As a result, the magnetic memory may be manufactured easily.

(Third Modification)

Figure 66:
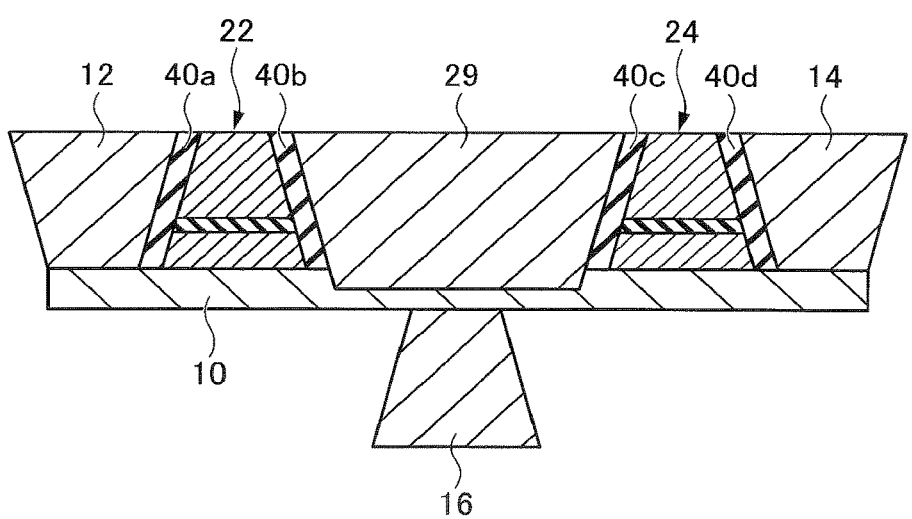
FIG. 66 is a cross-sectional view showing a memory cell of a magnetic memory according to a third modification of the twenty-first embodiment.

FIG. 66 illustrates a memory cell of a magnetic memory according to a third modification of the twenty-first embodiment. The memory cell 1 according to the third modification is obtained by decreasing the thickness of the region of the conductive layer 10 that is in contact with the dummy electrode 29 to be thinner than the thickness of the regions of the conductive layer 10 immediately below the magnetoresistive elements 22 and 24 in the memory cell 1 according to the second modifications shown in FIG. 65.

Similarly to the second modification, the magnetizations of the magnetoresistive elements 22 and 24 may be switched easily in the third modification.

(Fourth Modification)

Figure 67:
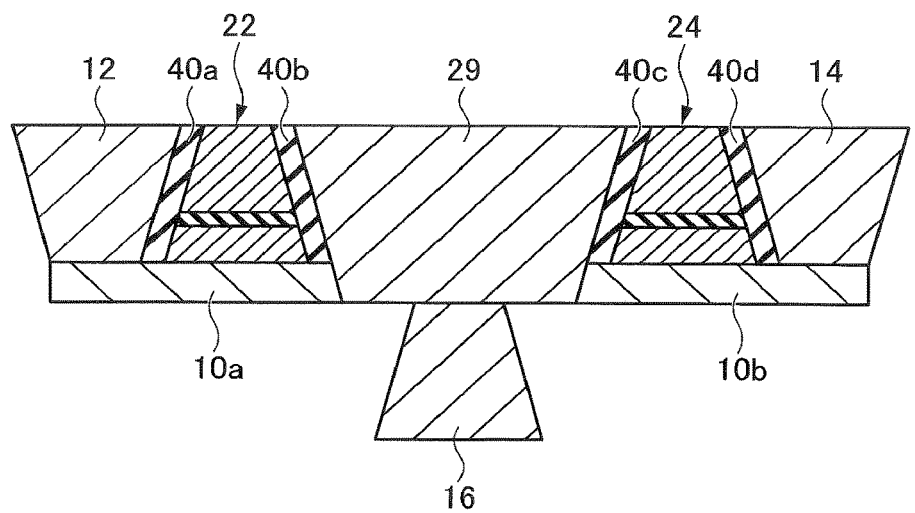
FIG. 67 is a cross-sectional view showing a memory cell of a magnetic memory according to a fourth modification of the twenty-first embodiment.

FIG. 67 illustrates a memory cell of a magnetic memory according to a fourth modification of the twenty-first embodiment. The memory cell 1 according to the fourth modification has a configuration obtained by removing the region of the conductive layer 10 that is in contact with the dummy electrode 29 in the memory cell 1 according to the second modification shown in FIG. 65 so that the dummy electrode 29 is in directly contact with the electrode 16.

Similarly to the second modification, the magnetizations of the magnetoresistive elements 22 and 24 may be switched easily in the fourth modification.

(Fifth Modification)

Figure 68:
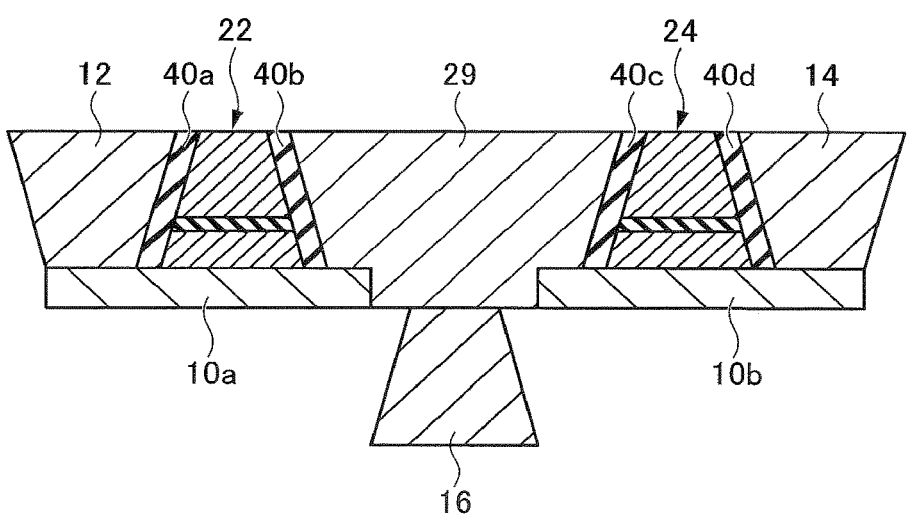
FIG. 68 is a cross-sectional view showing a memory cell of a magnetic memory according to a fifth modification of the twenty-first embodiment.

FIG. 68 illustrates a memory cell of the magnetic memory according to a fifth modification of the twenty-first embodiment. The memory cell 1 according to the fifth modification has a configuration obtained by dividing the conductive layer 10 of the memory cell 1 according to the second modification shown in FIG. 65 into two conductive layers 10$a$ and 10$b$, disposing the electrode 12 and the magnetoresistive element 22 on the conductive layer 10$a$, disposing the electrode 14 and the magnetoresistive element 24 on the conductive layer 10$b$, causing a part of the dummy electrode 29 to be in direct contact with the electrode 16, and causing the other part of the dummy electrode 29 to be in contact with the conductive layers 10$a$ and 10$b$. With this configuration, aligning the electrodes 12, 14, and 16 does not require a high accuracy, and the magnetic memory may be manufactured easily.

Similarly to the second modification, the magnetizations of the magnetoresistive elements 22 and 24 may be switched easily in the fifth modification.

(Sixth Modification)

Figure 69:
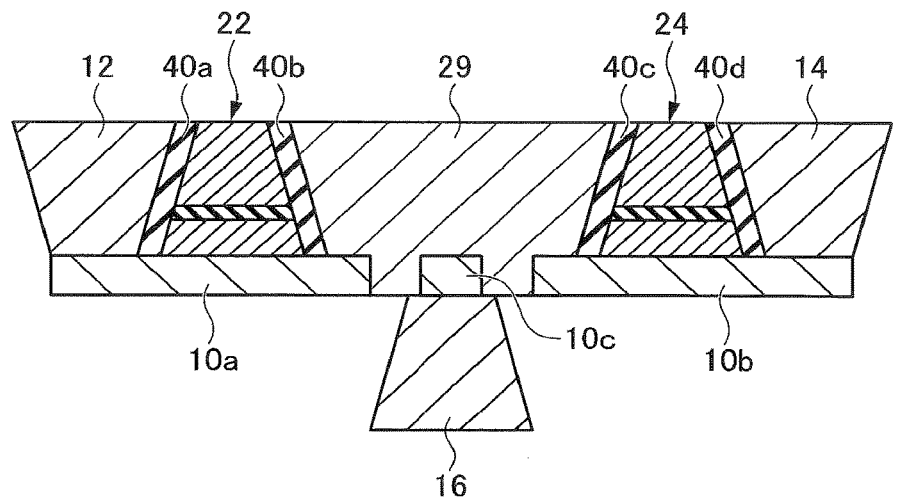
FIG. 69 is a cross-sectional view showing a memory cell of a magnetic memory according to a sixth modification of the twenty-first embodiment.

FIG. 69 illustrates a memory cell of a magnetic memory according to a sixth modification of the twenty-first embodiment. The memory cell 1 according to the sixth modification has a configuration obtained by dividing the conductive layer 10 of the memory cell 1 according to the second modification shown in FIG. 65 into three conductive layers 10$a$, 10$b$, and 10$c$, disposing the electrode 12 and the magnetoresistive element 22 on the conductive layer 10$a$, disposing the electrode 14 and the magnetoresistive element 24 on the conductive layer 10$b$, causing a part of the electrode 16 to be in direct contact with a part of the dummy electrode 29, and causing the other part of the electrode 16 to be in direct contact with the conductive layer 10$c$. With this configuration, aligning the electrodes 12, 14, and 16 does not require a high accuracy, and the magnetic memory may be manufactured easily.

Similarly to the second modification, the magnetizations of the magnetoresistive elements 22 and 24 may be switched easily in the sixth modification.

(Seventh Modification)

Figure 70:
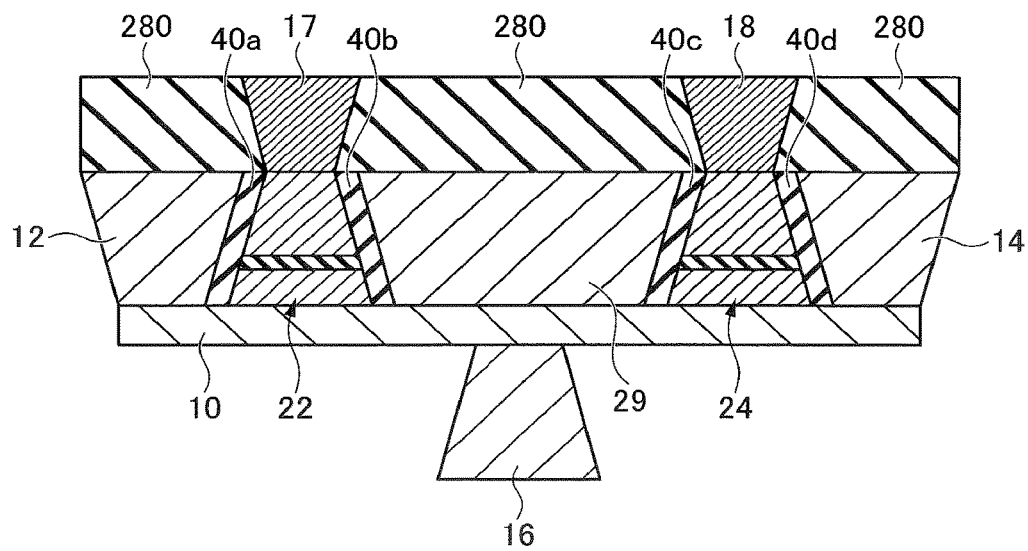
FIG. 70 is a cross-sectional view showing a memory cell of a magnetic memory according to a seventh modification of the twenty-first embodiment.

FIG. 70 illustrates a memory cell of a magnetic memory according to a seventh modification of the twenty-first embodiment. The memory cell 1 according to the seventh modification has a configuration obtained by disposing a terminal (electrode) 17 that is electrically connected to the reference layer of the magnetoresistive element 22 and a terminal (electrode) 18 that is electrically connected to the reference layer of the magnetoresistive element 24 in the memory cell 1 according to the second modification shown in FIG. 65. The terminals 17 and 18 are formed in an insulating film 280 disposed to cover the electrodes 12 and 14 and the magnetoresistive elements 22 and 24.

Similarly to the second modification, the magnetizations of the magnetoresistive elements 22 and 24 may be switched easily in the sixth modification.

Similarly to the eighth embodiment, energy consumption may be reduced and write and read operations may be performed at a high speed in the magnetic memory according to the twenty-first embodiment and the first to seventh modifications of the twenty-first embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetic memory comprising:
a first terminal, a second terminal, and a third terminal;
a first conductive layer including first to fifth regions, the second region being between the first region and the fifth region, the third region being between the second region and the fifth region, the fourth region being between the third region and the fifth region, the first region being electrically connected to the first terminal, the fifth region being electrically connected to the second terminal, and the third region being electrically connected to the third terminal;
a first magnetoresistive element disposed corresponding to the second region, the first magnetoresistive element including a first magnetic layer, a second magnetic layer disposed between the second region and the first magnetic layer, a first nonmagnetic layer disposed between the first magnetic layer and the second magnetic layer, and a fourth terminal electrically connected to the first magnetic layer;
a second magnetoresistive element disposed corresponding to the fourth region, the second magnetoresistive element including a third magnetic layer, a fourth magnetic layer disposed between the fourth region and the third magnetic layer, a second nonmagnetic layer disposed between the third magnetic layer and the fourth magnetic layer, and a fifth terminal electrically connected to the third magnetic layer; and
a circuit configured to flow a write current between the first terminal and the third terminal and between the second terminal and the third terminal in a write operation.

2. The magnetic memory according to claim 1, wherein the circuit applies a same potential to the fourth terminal and the fifth terminal in the write operation.

3. The magnetic memory according to claim 1, wherein the circuit applies a voltage between the fourth terminal and the fifth terminal, and performs a read operation based on a potential of the third terminal.

4. The magnetic memory according to claim 1, wherein the third terminal is disposed on the first conductive layer on an opposite side to a side on which the first magnetoresistive element and the second magnetoresistive element are disposed.

5. The magnetic memory according to claim 4, further comprising a third magnetoresistive element disposed corresponding to the third region on an opposite side to a side on which the third terminal is disposed, the third magnetoresistive element including a fifth magnetic layer, a sixth magnetic layer disposed between the third region and the fifth magnetic layer, and a third nonmagnetic layer disposed between the fifth magnetic layer and the sixth magnetic layer.

6. The magnetic memory according to claim 4, further comprising a second conductive layer having a higher conductivity than the first conductive layer, the second conductive layer being disposed on the third region on an opposite side to the third terminal.

7. The magnetic memory according to claim 1, wherein the third terminal is disposed on the third region of the first conductive layer on the same side as a side on which the first magnetoresistive element and the second magnetoresistive element are disposed.

8. The magnetic memory according to claim 7, wherein at least one of the first terminal, the second terminal, and the third terminal includes a metal magnetic layer.

9. The magnetic memory according to claim 1, wherein the circuit flows a read current between the third terminal and the fourth terminal and between the third terminal and the fifth terminal, and performs a read operation on the basis of a potential difference or a current difference between the fourth terminal and the fifth terminal.

10. The magnetic memory according to claim 1, wherein the first terminal and the second terminal are electrically connected with each other.

11. The magnetic memory according to claim 1, further comprising a magnetic field application device, wherein the second magnetic layer and the fourth magnetic layer have a perpendicular magnetic anisotropy, and the magnetic field application device applies a first magnetic field to the second magnetic layer and a second magnetic field to the fourth magnetic layer, the first magnetic field including a first component and the second magnetic field including a second component, the first component and the second component being perpendicular to a layer stacking direction of the first magnetoresistive element and the second magnetoresistive element.

12. The magnetic memory according to claim 1, further comprising a magnetic field application device, wherein the second magnetic layer and the fourth magnetic layer have an in-plane magnetic anisotropy, and the magnetic field application device applies a first magnetic field to the second magnetic layer and a second magnetic field to the fourth magnetic layer, the first magnetic field including a first component and the second magnetic field including a second component, the first component and the second component being parallel to a layer stacking direction of the first magnetoresistive element and the second magnetoresistive element.

13. The magnetic memory according to claim 1, wherein the second magnetic layer and the fourth magnetic layer have an in-plane magnetic anisotropy, and an angle made by an easy magnetization axis of each of the second magnetic layer and the fourth magnetic layer and a direction in which the write current flows is more than 0 degree and less than 45 degrees.

14. A magnetic memory comprising:
a first terminal, a second terminal, and a third terminal;
a conductive layer including first to fifth regions, the second region being between the first region and the fifth region, the third region being between the second region and the fifth region, the fourth region being between the third region and the fifth region, the first region being electrically connected to the first terminal, the fifth region being electrically connected to the second terminal, and the third region being electrically connected to the third terminal;
a first magnetoresistive element disposed corresponding to the second region, the first magnetoresistive element including a first magnetic layer, a second magnetic layer disposed between the second region and the first magnetic layer, a first nonmagnetic layer disposed between the first magnetic layer and the second magnetic layer, and a fourth terminal electrically connected to the first magnetic layer;
a second magnetoresistive element disposed corresponding to the fourth region, the second magnetoresistive element including a third magnetic layer, a fourth magnetic layer disposed between the fourth region and the third magnetic layer, a second nonmagnetic layer disposed between the third magnetic layer and the fourth magnetic layer, and a fifth terminal electrically connected to the third magnetic layer;

a circuit configured to flow a write current between the first terminal and the second terminal in a write operation; and a magnetic field application device configured to apply a first magnetic field to the second magnetic layer and a second magnetic field to the fourth magnetic layer, the first magnetic field including a first component and the second magnetic field including a second component, the first component and the second component being perpendicular to a layer stacking direction of the first magnetoresistive element and the second magnetoresistive element, the first component and the second component being in opposite directions each other.

15. The magnetic memory according to claim 14, wherein the circuit applies a voltage to the fourth terminal and the fifth terminal in the write operation.

16. The magnetic memory according to claim 14, wherein the circuit applies a voltage between the fourth terminal and the fifth terminal, and performs a read operation based on a potential of the third terminal.

17. A magnetic memory comprising:
a first terminal and a second terminal;
a first conductive layer including a first region, a second region, and a third region, the second region being between the first region and the third region, and the first region being electrically connected to the first terminal;
a second conductive layer including a fourth region, a fifth region, a sixth region, the fifth region being between the fourth region and the sixth region, and the sixth region being electrically connected to the second terminal;
a third terminal electrically connected to the third region and the fourth region;
a first magnetoresistive element disposed corresponding to the second region and including a first magnetic layer, a second magnetic layer disposed between the second region and the first magnetic layer, a first nonmagnetic layer disposed between the first magnetic layer and the second magnetic layer, and a fourth terminal electrically connected to the first magnetic layer;
a second magnetoresistive element disposed corresponding to the fifth region and including a third magnetic layer, a fourth magnetic layer disposed between the fifth region and the third magnetic layer, a second nonmagnetic layer disposed between the third magnetic layer and the fourth magnetic layer, and a fifth terminal electrically connected to the third magnetic layer; and
a circuit configured to flow a write current between the first terminal and the second terminal via the first conductive layer and the second conductive layer in a write operation.

18. The magnetic memory according to claim 17, wherein a sign of a spin Hall angle of the first conductive layer is different from a sign of a spin Hall angle of the second conductive layer.

19. The magnetic memory according to claim 17, wherein the second conductive layer is disposed above the first conductive layer, the first magnetoresistive element is disposed between the second conductive layer and the first conductive layer, and the second magnetoresistive element is disposed above the first magnetoresistive element.

20. A magnetic memory comprising:
a first terminal, a second terminal, and a third terminal;
a conductive layer including first to fifth regions, the second region being between the first region and the fifth region, the third region being between the second region and the fifth region, the fourth region being between the third region and the fifth region, the first region being electrically connected to the first terminal, the fifth region being electrically connected to the second terminal, and the third region being electrically connected to the third terminal;
a first magnetoresistive element disposed corresponding to the second region, the first magnetoresistive element including a first magnetic layer, a second magnetic layer disposed between the second region and the first magnetic layer, a first nonmagnetic layer disposed between the first magnetic layer and the second magnetic layer, and a fourth terminal electrically connected to the first magnetic layer;
a second magnetoresistive element disposed corresponding to the fourth region, the second magnetoresistive element including a third magnetic layer, a fourth magnetic layer disposed between the fourth region and the third magnetic layer, a second nonmagnetic layer disposed between the third magnetic layer and the fourth magnetic layer, and a fifth terminal electrically connected to the third magnetic layer; and
a circuit configured to flow a write current between the first terminal and the third terminal and between the second terminal and the third terminal in a first write operation for writing to the first magnetoresistive element and the second magnetoresistive element, and to flow a write current between the first terminal and the second terminal in a second write operation for writing to the first magnetoresistive element and the second magnetoresistive element.

21. The magnetic memory according to 20, wherein in the first write operation, different data are written to the first magnetoresistive element and the second magnetoresistive element, and in the second write operation, identical data are written to the first magnetoresistive element and the second magnetoresistive element.

22. A magnetic memory comprising:
a first terminal and a second terminal;
a first conductive layer including first to third regions disposed in a first direction, the second region being between the first region and the third region, and the first region being electrically connected to the first terminal;
a second conductive layer including a fourth to sixth regions disposed in the first direction, the fifth region being between the fourth region and the sixth region, and the sixth region being electrically connected to the second terminal;
a third conductive layer electrically connected to the third region and the fourth region;
a first magnetoresistive element disposed corresponding to the second region and including a first magnetic layer, a second magnetic layer disposed between the second region and the first magnetic layer, a first nonmagnetic layer disposed between the first magnetic layer and the second magnetic layer, and a third terminal electrically connected to the first magnetic layer;
a second magnetoresistive element disposed corresponding to the fifth region and including a third magnetic layer, a fourth magnetic layer disposed between the fifth region and the third magnetic layer, a second nonmagnetic layer disposed between the third magnetic layer and the fourth magnetic layer, and a fourth terminal electrically connected to the third magnetic layer; and a first circuit configured to flow a write current between the first terminal and the second terminal via the first conductive layer, the third conductive layer, and the second conductive layer in a write operation, wherein a direction from the first region to the third region is different from a direction from the fourth region to the sixth region each other.

* * * * *